US012014120B2

(12) United States Patent
Li et al.

(10) Patent No.: US 12,014,120 B2
(45) Date of Patent: Jun. 18, 2024

(54) AUTOMATED TOOLS FOR GENERATING MAPPING INFORMATION FOR BUILDINGS

(71) Applicant: MFTB Holdco, Inc., Seattle, WA (US)

(72) Inventors: Yuguang Li, Seattle, WA (US); Ivaylo Boyadzhiev, Seattle, WA (US); Lambert E. Wixson, Bellevue, WA (US)

(73) Assignee: MFTB Holdco, Inc., Seattle, WA (US)

( * ) Notice: Subject to any disclaimer, the term of this patent is extended or adjusted under 35 U.S.C. 154(b) by 325 days.

(21) Appl. No.: 17/666,499

(22) Filed: Feb. 7, 2022

(65) Prior Publication Data
US 2022/0164493 A1  May 26, 2022

Related U.S. Application Data

(63) Continuation-in-part of application No. 16/807,135, filed on Mar. 2, 2020, now Pat. No. 11,243,656.
(Continued)

(51) Int. Cl.
*G06F 17/00* (2019.01)
*G06F 30/13* (2020.01)
(Continued)

(52) U.S. Cl.
CPC ............. *G06F 30/13* (2020.01); *G06V 10/23* (2022.01); *G06V 10/255* (2022.01); *G06V 10/7715* (2022.01); *G06V 20/36* (2022.01)

(58) Field of Classification Search
CPC .... G06F 30/13; G06V 10/23; G06V 10/7715; G06V 20/36; G06V 10/255
See application file for complete search history.

(56) References Cited

U.S. PATENT DOCUMENTS 5,140,352 A   8/1992   Moore et al.
6,031,540 A   2/2000   Golin et al.
(Continued)

FOREIGN PATENT DOCUMENTS

EP   2413097 A2   2/2012
EP   2505961 A2   10/2012
(Continued)

OTHER PUBLICATIONS

CubiCasa | From video to floor plan in under 5 minutes, retrieved on Mar. 26, 2019, from https://www.cubi.casa/, 6 pages.
(Continued)

*Primary Examiner* — Mohammed H Zuberi
(74) *Attorney, Agent, or Firm* — VLP Law Group LLP; James A. D. White

(57) ABSTRACT

Techniques are described for using computing devices to perform automated operations involved in analysis of images acquired in a defined area, as part of generating mapping information of the defined area for subsequent use (e.g., for controlling navigation of devices, for display on client devices in corresponding GUIs, etc.). The defined area may include an interior of a multi-room building, and the generated information including a floor map of the building, such as from an analysis of multiple 360° spherical panorama images acquired at various viewing locations within the building (e.g., using an image acquisition device with a spherical camera having one or more fisheye lenses to capture a panorama image that extends 360 degrees around a vertical axis)—the generating may be further performed without detailed information about distances from the images' viewing locations to objects in the surrounding building.

40 Claims, 40 Drawing Sheets
(27 of 40 Drawing Sheet(s) Filed in Color)

Related U.S. Application Data

(60) Provisional application No. 62/893,108, filed on Aug. 28, 2019.

(51) Int. Cl.
*G06V 10/20* (2022.01)
*G06V 10/22* (2022.01)
*G06V 10/77* (2022.01)
*G06V 20/00* (2022.01)

(56) References Cited

U.S. PATENT DOCUMENTS

| | | | |
|---|---|---|---|
| 6,141,034 A | 10/2000 | McCutchen | |
| 6,317,166 B1 | 11/2001 | McCutchen | |
| 6,320,584 B1 | 11/2001 | Golin et al. | |
| 6,323,858 B1 | 11/2001 | Gilbert et al. | |
| 6,337,683 B1 | 1/2002 | Gilbert et al. | |
| 6,580,441 B2 | 6/2003 | Schileru-Key | |
| 6,654,019 B2 | 11/2003 | Gilbert et al. | |
| 6,683,608 B2 | 1/2004 | Golin et al. | |
| 6,690,374 B2 | 2/2004 | Park et al. | |
| 6,731,305 B1 | 5/2004 | Park et al. | |
| 6,738,073 B2 | 5/2004 | Park et al. | |
| 7,050,085 B1 | 5/2006 | Park et al. | |
| 7,129,971 B2 | 10/2006 | McCutchen | |
| 7,196,722 B2 | 3/2007 | White et al. | |
| 7,246,044 B2 | 7/2007 | Imamura et al. | |
| 7,525,567 B2 | 4/2009 | McCutchen | |
| 7,620,909 B2 | 11/2009 | Park et al. | |
| 7,627,235 B2 | 12/2009 | McCutchen et al. | |
| 7,782,319 B2 | 8/2010 | Ghosh et al. | |
| 7,791,638 B2 | 9/2010 | McCutchen | |
| 7,909,241 B2 | 3/2011 | Stone et al. | |
| 7,973,838 B2 | 7/2011 | McCutchen | |
| 8,072,455 B2 | 12/2011 | Temesvari et al. | |
| 8,094,182 B2 | 1/2012 | Park et al. | |
| RE43,786 E | 11/2012 | Cooper | |
| 8,463,020 B1 | 6/2013 | Schuckmann et al. | |
| 8,517,256 B2 | 8/2013 | Stone et al. | |
| 8,520,060 B2 | 8/2013 | Zomet et al. | |
| 8,523,066 B2 | 9/2013 | Stone et al. | |
| 8,523,067 B2 | 9/2013 | Stone et al. | |
| 8,528,816 B2 | 9/2013 | Stone et al. | |
| 8,540,153 B2 | 9/2013 | Stone et al. | |
| 8,594,428 B2 | 11/2013 | Aharoni et al. | |
| 8,654,180 B2 | 2/2014 | Zomet et al. | |
| 8,666,815 B1 | 3/2014 | Chau | |
| 8,699,005 B2 | 4/2014 | Likholyot | |
| 8,705,892 B2 | 4/2014 | Aguilera et al. | |
| RE44,924 E | 6/2014 | Cooper et al. | |
| 8,854,684 B2 | 10/2014 | Zomet | |
| 8,861,840 B2 | 10/2014 | Bell et al. | |
| 8,861,841 B2 | 10/2014 | Bell et al. | |
| 8,879,828 B2 | 11/2014 | Bell et al. | |
| 8,953,871 B2 | 2/2015 | Zomet | |
| 8,989,440 B2 | 3/2015 | Klusza et al. | |
| 8,996,336 B2 | 3/2015 | Malka et al. | |
| 9,021,947 B2 | 5/2015 | Landa | |
| 9,026,947 B2 | 5/2015 | Lee et al. | |
| 9,035,968 B2 | 5/2015 | Zomet | |
| 9,041,796 B2 | 5/2015 | Malka et al. | |
| 9,071,714 B2 | 6/2015 | Zomet | |
| 9,129,438 B2 | 9/2015 | Aarts et al. | |
| 9,151,608 B2 | 10/2015 | Malka et al. | |
| 9,165,410 B1 | 10/2015 | Bell et al. | |
| 9,171,405 B1 | 10/2015 | Bell et al. | |
| 9,324,190 B2 | 4/2016 | Bell et al. | |
| 9,361,717 B2 | 6/2016 | Zomet | |
| 9,396,586 B2 | 7/2016 | Bell et al. | |
| 9,438,759 B2 | 9/2016 | Zomet | |
| 9,438,775 B2 | 9/2016 | Powers et al. | |
| 9,489,775 B1 | 11/2016 | Bell et al. | |
| 9,495,783 B1 | 11/2016 | Samarasekera et al. | |
| 9,576,401 B2 | 2/2017 | Zomet | |
| 9,619,933 B2 | 4/2017 | Spinella-Marno et al. | |
| 9,635,252 B2 | 4/2017 | Accardo et al. | |
| 9,641,702 B2 | 5/2017 | Bin-Nun et al. | |
| 9,760,994 B1 | 9/2017 | Bell et al. | |
| 9,786,097 B2 | 10/2017 | Bell et al. | |
| 9,787,904 B2 | 10/2017 | Birkler et al. | |
| 9,836,885 B1 | 12/2017 | Eraker et al. | |
| 9,852,351 B2 | 12/2017 | Aguilera Perez et al. | |
| 9,953,111 B2 | 4/2018 | Bell et al. | |
| 9,953,112 B2 | 4/2018 | Schultz | |
| 9,953,430 B1 | 4/2018 | Zakhor | |
| 9,990,760 B2 | 6/2018 | Aguilera Perez et al. | |
| 9,990,767 B1 | 6/2018 | Sheffield et al. | |
| 10,026,224 B2 | 7/2018 | Bell et al. | |
| 10,030,979 B2 | 7/2018 | Bjorke et al. | |
| 10,055,876 B2 | 8/2018 | Ford et al. | |
| 10,068,344 B2 | 9/2018 | Jovanovic et al. | |
| 10,083,522 B2* | 9/2018 | Jovanovic | G06T 7/74 |
| 10,102,639 B2 | 10/2018 | Bell et al. | |
| 10,102,673 B2 | 10/2018 | Eraker et al. | |
| 10,120,397 B1 | 11/2018 | Zakhor et al. | |
| 10,122,997 B1 | 11/2018 | Sheffield et al. | |
| 10,127,718 B2 | 11/2018 | Zakhor et al. | |
| 10,127,722 B2 | 11/2018 | Shakib et al. | |
| 10,139,985 B2 | 11/2018 | Mildrew et al. | |
| 10,163,261 B2 | 12/2018 | Bell et al. | |
| 10,163,271 B1 | 12/2018 | Powers et al. | |
| 10,181,215 B2* | 1/2019 | Sedeffow | G06T 15/10 |
| 10,192,115 B1 | 1/2019 | Sheffield et al. | |
| 10,204,185 B2 | 2/2019 | Mrowca et al. | |
| 10,210,285 B2 | 2/2019 | Wong et al. | |
| 10,235,797 B1 | 3/2019 | Sheffield et al. | |
| 10,242,400 B1 | 3/2019 | Eraker et al. | |
| 10,339,716 B1 | 7/2019 | Powers et al. | |
| 10,366,531 B2 | 7/2019 | Sheffield | |
| 10,395,435 B2 | 8/2019 | Powers et al. | |
| 10,991,161 B2 | 4/2021 | Sinclair et al. | |
| 11,024,079 B1* | 6/2021 | Chuah | G06T 7/246 |
| 11,531,789 B1* | 12/2022 | Eberhardt | G06F 30/18 |
| 11,783,385 B1* | 10/2023 | Khosravan | G06Q 50/16 382/103 |
| 2005/0081161 A1* | 4/2005 | MacInnes | G06Q 30/01 715/848 |
| 2005/0086612 A1 | 4/2005 | Gettman et al. | |
| 2006/0256109 A1 | 11/2006 | Acker et al. | |
| 2008/0028328 A1 | 1/2008 | Hoizal et al. | |
| 2008/0263465 A1 | 10/2008 | Fox et al. | |
| 2009/0160856 A1 | 6/2009 | Hoguet | |
| 2010/0005427 A1 | 1/2010 | Zhang et al. | |
| 2010/0131857 A1 | 5/2010 | Prigge | |
| 2010/0232709 A1 | 9/2010 | Zhang et al. | |
| 2010/0245351 A1 | 9/2010 | Sellem | |
| 2012/0075414 A1 | 3/2012 | Park et al. | |
| 2012/0293613 A1 | 11/2012 | Powers et al. | |
| 2013/0050407 A1 | 2/2013 | Brinda et al. | |
| 2013/0147961 A1* | 6/2013 | Gao | H04N 7/181 348/159 |
| 2013/0211882 A1* | 8/2013 | Brashear | G06Q 10/0637 705/7.36 |
| 2013/0259308 A1 | 10/2013 | Klusza et al. | |
| 2013/0278755 A1* | 10/2013 | Starns | G06T 7/68 382/106 |
| 2013/0342533 A1 | 12/2013 | Bell et al. | |
| 2014/0043436 A1 | 2/2014 | Bell et al. | |
| 2014/0044343 A1 | 2/2014 | Bell et al. | |
| 2014/0044344 A1 | 2/2014 | Bell et al. | |
| 2014/0068445 A1 | 3/2014 | Kempf et al. | |
| 2014/0125658 A1 | 5/2014 | Bell et al. | |
| 2014/0125767 A1 | 5/2014 | Bell et al. | |
| 2014/0125768 A1 | 5/2014 | Bell et al. | |
| 2014/0125769 A1 | 5/2014 | Bell et al. | |
| 2014/0125770 A1 | 5/2014 | Bell et al. | |
| 2014/0236482 A1 | 8/2014 | Dorum et al. | |
| 2014/0267631 A1 | 9/2014 | Powers et al. | |
| 2014/0267717 A1* | 9/2014 | Pitzer | G01C 15/002 703/1 |
| 2014/0307100 A1 | 10/2014 | Myllykoski et al. | |
| 2014/0320674 A1 | 10/2014 | Kuang | |

(56) References Cited

U.S. PATENT DOCUMENTS

| | | | |
|---|---|---|---|
| 2015/0109338 A1* | 4/2015 | McKinnon | G06F 16/9535 |
| | | | 345/633 |
| 2015/0116691 A1 | 4/2015 | Likholyot | |
| 2015/0153182 A1 | 6/2015 | Tu et al. | |
| 2015/0189165 A1 | 7/2015 | Milosevski et al. | |
| 2015/0262421 A1 | 9/2015 | Bell et al. | |
| 2015/0269785 A1 | 9/2015 | Bell et al. | |
| 2015/0279000 A1 | 10/2015 | Nakatsukasa et al. | |
| 2015/0302636 A1 | 10/2015 | Arnoldus et al. | |
| 2015/0310596 A1 | 10/2015 | Sheridan et al. | |
| 2015/0332464 A1 | 11/2015 | O'Keefe et al. | |
| 2016/0055268 A1 | 2/2016 | Bell et al. | |
| 2016/0134860 A1 | 5/2016 | Jovanovic et al. | |
| 2016/0140676 A1 | 5/2016 | Fritze et al. | |
| 2016/0147919 A1* | 5/2016 | Yabe | H04L 12/2803 |
| | | | 700/275 |
| 2016/0148413 A1* | 5/2016 | Oh | G06T 3/20 |
| | | | 345/634 |
| 2016/0217225 A1 | 7/2016 | Bell et al. | |
| 2016/0260250 A1 | 9/2016 | Jovanovic et al. | |
| 2016/0286119 A1 | 9/2016 | Rondinelli | |
| 2016/0300385 A1 | 10/2016 | Bell et al. | |
| 2017/0034430 A1 | 2/2017 | Fu et al. | |
| 2017/0067739 A1 | 3/2017 | Siercks et al. | |
| 2017/0194768 A1 | 7/2017 | Powers et al. | |
| 2017/0195654 A1 | 7/2017 | Powers et al. | |
| 2017/0263050 A1 | 9/2017 | Ha et al. | |
| 2017/0324941 A1 | 11/2017 | Birkler | |
| 2017/0330273 A1 | 11/2017 | Holt et al. | |
| 2017/0337737 A1 | 11/2017 | Edwards et al. | |
| 2018/0007340 A1 | 1/2018 | Stachowski | |
| 2018/0025536 A1 | 1/2018 | Bell et al. | |
| 2018/0075168 A1 | 3/2018 | Tiwari et al. | |
| 2018/0075652 A1 | 3/2018 | Kim | |
| 2018/0101803 A1* | 4/2018 | Tiwari | G06Q 10/06313 |
| 2018/0139431 A1 | 5/2018 | Simek et al. | |
| 2018/0143023 A1 | 5/2018 | Bjorke et al. | |
| 2018/0143756 A1 | 5/2018 | Mildrew et al. | |
| 2018/0144487 A1 | 5/2018 | Bell et al. | |
| 2018/0144535 A1 | 5/2018 | Ford et al. | |
| 2018/0144547 A1 | 5/2018 | Shakib et al. | |
| 2018/0144555 A1 | 5/2018 | Ford et al. | |
| 2018/0146121 A1 | 5/2018 | Hensler et al. | |
| 2018/0146193 A1 | 5/2018 | Safreed et al. | |
| 2018/0146212 A1 | 5/2018 | Hensler et al. | |
| 2018/0165871 A1 | 6/2018 | Mrowca | |
| 2018/0203955 A1 | 7/2018 | Bell et al. | |
| 2018/0241985 A1 | 8/2018 | O'Keefe et al. | |
| 2018/0268220 A1 | 9/2018 | Lee et al. | |
| 2018/0286121 A1 | 10/2018 | Sedeffow | |
| 2018/0293793 A1 | 10/2018 | Bell et al. | |
| 2018/0300936 A1 | 10/2018 | Ford et al. | |
| 2018/0306588 A1 | 10/2018 | Bjorke et al. | |
| 2018/0348854 A1 | 12/2018 | Powers et al. | |
| 2018/0365496 A1 | 12/2018 | Hovden et al. | |
| 2019/0012833 A1 | 1/2019 | Eraker et al. | |
| 2019/0026956 A1 | 1/2019 | Gausebeck et al. | |
| 2019/0026957 A1 | 1/2019 | Gausebeck | |
| 2019/0026958 A1 | 1/2019 | Gausebeck et al. | |
| 2019/0035165 A1 | 1/2019 | Gausebeck | |
| 2019/0041972 A1 | 2/2019 | Bae | |
| 2019/0050137 A1 | 2/2019 | Mildrew et al. | |
| 2019/0051050 A1 | 2/2019 | Bell et al. | |
| 2019/0051054 A1 | 2/2019 | Jovanovic et al. | |
| 2019/0087067 A1 | 3/2019 | Hovden et al. | |
| 2019/0122422 A1 | 4/2019 | Sheffield et al. | |
| 2019/0162534 A1 | 5/2019 | Metzler et al. | |
| 2019/0164335 A1 | 5/2019 | Sheffield et al. | |
| 2019/0180104 A1 | 6/2019 | Sheffield et al. | |
| 2019/0228115 A1* | 7/2019 | Bergin | G06F 3/04883 |
| 2019/0251645 A1 | 8/2019 | Winans | |
| 2019/0287164 A1 | 9/2019 | Eraker et al. | |
| 2019/0332114 A1* | 10/2019 | Moroniti | G05D 1/0274 |
| 2020/0007841 A1 | 1/2020 | Sedeffow | |
| 2020/0257832 A1* | 8/2020 | Artiano, Jr. | G06F 30/12 |
| 2021/0049812 A1 | 2/2021 | Ganihar | |
| 2021/0073449 A1* | 3/2021 | Segev | G06F 30/27 |
| 2021/0125397 A1* | 4/2021 | Moulon | G06T 17/00 |
| 2021/0225081 A1* | 7/2021 | Tang | G06T 7/50 |

FOREIGN PATENT DOCUMENTS

| | | |
|---|---|---|
| EP | 2506170 A2 | 10/2012 |
| KR | 101770648 B1 | 8/2017 |
| KR | 101930796 B1 | 12/2018 |
| WO | 2005091894 A2 | 10/2005 |
| WO | 2016154306 A1 | 9/2016 |
| WO | 2018204279 A1 | 11/2018 |
| WO | 2019083832 A1 | 5/2019 |
| WO | 2019104049 A1 | 5/2019 |
| WO | 2019118599 A2 | 6/2019 |

OTHER PUBLICATIONS

CubiCasa FAQ & Manual, retrieved on Mar. 26, 2019, from https://www.cubi.casa/faq/, 5 pages.

Cupix Home, retrieved on Mar. 26, 2019, from https://www.cupix.com/, 1 page.

Cupix—FAQ, retrieved on Mar. 26, 2019, from https://www.cupix.com/faq.html, 3 pages.

IGuide: 3D Virtual Tours, retrieved on Mar. 26, 2019, from https://goiguide.com/, 6 pages.

Immoviewer.com | Automated Video Creation & Simple Affordable 3D 360 Tours, retrieved on Mar. 26, 2019, from https://www.immoviewer.com/, 5 pages.

MagicPlan | #1 Floor Plan App, Construction & Surveying Samples, retrieved on Mar. 26, 2019, from https://www.magicplan.app/, 9 pages.

EyeSpy360 Virtual Tours | Virtual Tour with any 360 camera, retrieved on Mar. 27, 2019, from https://www.eyespy360.com/en-us/, 15 pages.

Indoor Reality, retrieved on Mar. 27, 2019, from https://www.indoorreality.com/, 9 pages.

InsideMaps, retrieved on Mar. 27, 2019, from https://www.insidemaps.com/, 7 pages.

IStaging | Augmented & Virtual Reality Platform for Business, retrieved on Mar. 27, 2019, from https://www.istaging.com/en/, 7 pages.

Metareal, retrieved on Mar. 27, 2019, from https://www.metareal.com/, 4 pages.

PLNAR—The AR 3D Measuring / Modeling Platform, retrieved on Mar. 27, 2019, from https://www.plnar.co, 6 pages.

YouVR Global, retrieved on Mar. 27, 2019, from https://global.youvr.io/, 9 pages.

GeoCV, retrieved on Mar. 28, 2019, from https://geocv.com/, 4 pages.

Biersdorfer, J.D., "How to Make a 3-D Model of Your Home Renovation Vision," in the New York Times, Feb. 13, 2019, retrieved Mar. 28, 2019, 6 pages.

Chen et al. "Rise of the indoor crowd: Reconstruction of building interior view via mobile crowdsourcing." In: Proceedings of the 13th ACM Conference on Embedded Networked Sensor Systems. Nov. 4, 2015, 13 pages.

Immersive 3D for the Real World, retrieved from https://matterport.com/, on Mar. 27, 2017, 5 pages.

Learn About Our Complete 3D System, retrieved from https://matterport.com/how-it-works/, on Mar. 27, 2017, 6 pages.

Surefield FAQ, retrieved from https://surefield.com/faq, on Mar. 27, 2017, 1 page.

Why Surefield, retrieved from https://surefield.com/why-surefield, on Mar. 27, 2017, 7 pages.

Schneider, V., "Create immersive photo experiences with Google Photo Sphere," retrieved from http://geojournalism.org/2015/02/create-immersive-photo-experiences-with-google-photo-sphere/, on Mar. 27, 2017, 7 pages.

Tango (platform), Wikipedia, retrieved from https://en.wikipedia.org/wiki/Tango_(platform), on Jun. 12, 2018, 5 pages.

(56) References Cited

OTHER PUBLICATIONS

Zou et al. "LayoutNet: Reconstructing the 3D Room Layout from a Single RGB Image" in arXiv:1803.08999, submitted Mar. 23, 2018, 9 pages.
Lee et al. "RoomNet: End-to-End Room Layout Estimation" in arXiv:1703.00241v2, submitted Aug. 7, 2017, 10 pages.
Time-of-flight camera, Wikipedia, retrieved from https://en.wikipedia.org/wiki/Time-of-flight_camera, on Aug. 30, 2018, 8 pages.
Magicplan—Android Apps on Go . . . , retrieved from https://play.google.com/store/apps/details?id=com.sensopia.magicplan, on Feb. 21, 2018, 5 pages.
Pintore et al., "AtlantaNet: Inferring the 3D Indoor Layout from a Single 360 Image beyond the Manhattan World Assumption", ECCV 2020, 16 pages.
Cowles, Jeremy, "Differentiable Rendering", Aug. 19, 2018, accessed Dec. 7, 2020 at https://towardsdatascience.com/differentiable-rendering-d00a4b0f14be, 3 pages.
Yang et al., "DuLa-Net: A Dual-Projection Network for Estimating Room Layouts from a Single RGB Panorama", in arXiv:1811.11977[cs.v2], submitted Apr. 2, 2019, 14 pages.
Sun et al., "HoHoNet: 360 Indoor Holistic Understanding with Latent Horizontal Features", in arXiv:2011.11498[cs.v2], submitted Nov. 24, 2020, 15 pages.
Nguyen-Phuoc et al., "RenderNet: A deep convolutional network for differentiable rendering from 3D shapes", in arXiv:1806.06575[cs.v3], submitted Apr. 1, 2019, 17 pages.
Convolutional neural network, Wikipedia, retrieved from https://en.wikipedia.org/wiki/Convolutional_neural_network, on Dec. 7, 2020, 25 pages.
Hamilton et al., "Inductive Representation Learning on Large Graphs", in 31st Conference on Neural Information Processing Systems (NIPS 2017), 2017, 19 pages.
Kipf et al., "Variational Graph Auto-Encoders", in arXiv:1611.07308v1 [stat.ML], submitted Nov. 21, 2016, 3 pages.
Cao et al., "MoIGaN: An Implicit Generative Model for Small Molecular Graphs", in arXiv:1805.11973v1 [stat.ML], submitted May 30, 2018, 11 pages.
Chen et al., "Intelligent Home 3D: Automatic 3D-House Design from Linguistic Descriptions Only", in arXiv:2003.00397v1 [cs.CV], submitted Mar. 1, 2020, 14 pages.
Cucurull et al., "Context-Aware Visual Compatibility Prediction", in arXiv:1902.03646v2 [cs.CV], submitted Feb. 12, 2019, 10 pages.
Fan et al., "Labeled Graph Generative Adversarial Networks", in arXiv:1906.03220v1 [cs.LG], submitted Jun. 7, 2019, 14 pages.
Gong et al., "Exploiting Edge Features in Graph Neural Networks", in arXiv:1809.02709v2 [cs.LG], submitted Jan. 28, 2019, 10 pages.
Genghis Goodman, "A Machine Learning Approach to Artificial Floorplan Generation", University of Kentucky Theses and Dissertations—Computer Science, 2019, accessible at https://uknowledge.uky.edu/cs_etds/89, 40 pages.
Grover et al., "node2vec: Scalable Feature Learning for Networks", in arXiv:1607.00653v1 [cs.SI], submitted Jul. 3, 2016, 10 pages.
Nauata et al., "House-GAN: Relational Generative Adversarial Networks for Graph-constrained House Layout Generation", in arXiv:2003.06988v1 [cs.CV], submitted Mar. 16, 2020, 17 pages.
Kang et al., "A Review of Techniques for 3D Reconstruction of Indoor Environments", in ISPRS International Journal of Geo-Information 2020, May 19, 2020, 31 pages.
Kipf et al., "Semi-Supervised Classification With Graph Convolutional Networks", in arXiv:1609.02907v4 [cs.LG], submitted Feb. 22, 2017, 14 pages.
Li et al., "Graph Matching Networks for Learning the Similarity of Graph Structured Objects", in Proceedings of the 36th International Conference on Machine Learning (PMLR 97), 2019, 18 pages.
Liu et al., "Hyperbolic Graph Neural Networks", in 33rd Conference on Neural Information Processing Systems (NeurIPS 2019), 2019, 12 pages.
Merrell et al., "Computer-Generated Residential Building Layouts", in ACM Transactions on Graphics, Dec. 2010, 13 pages.

* cited by examiner

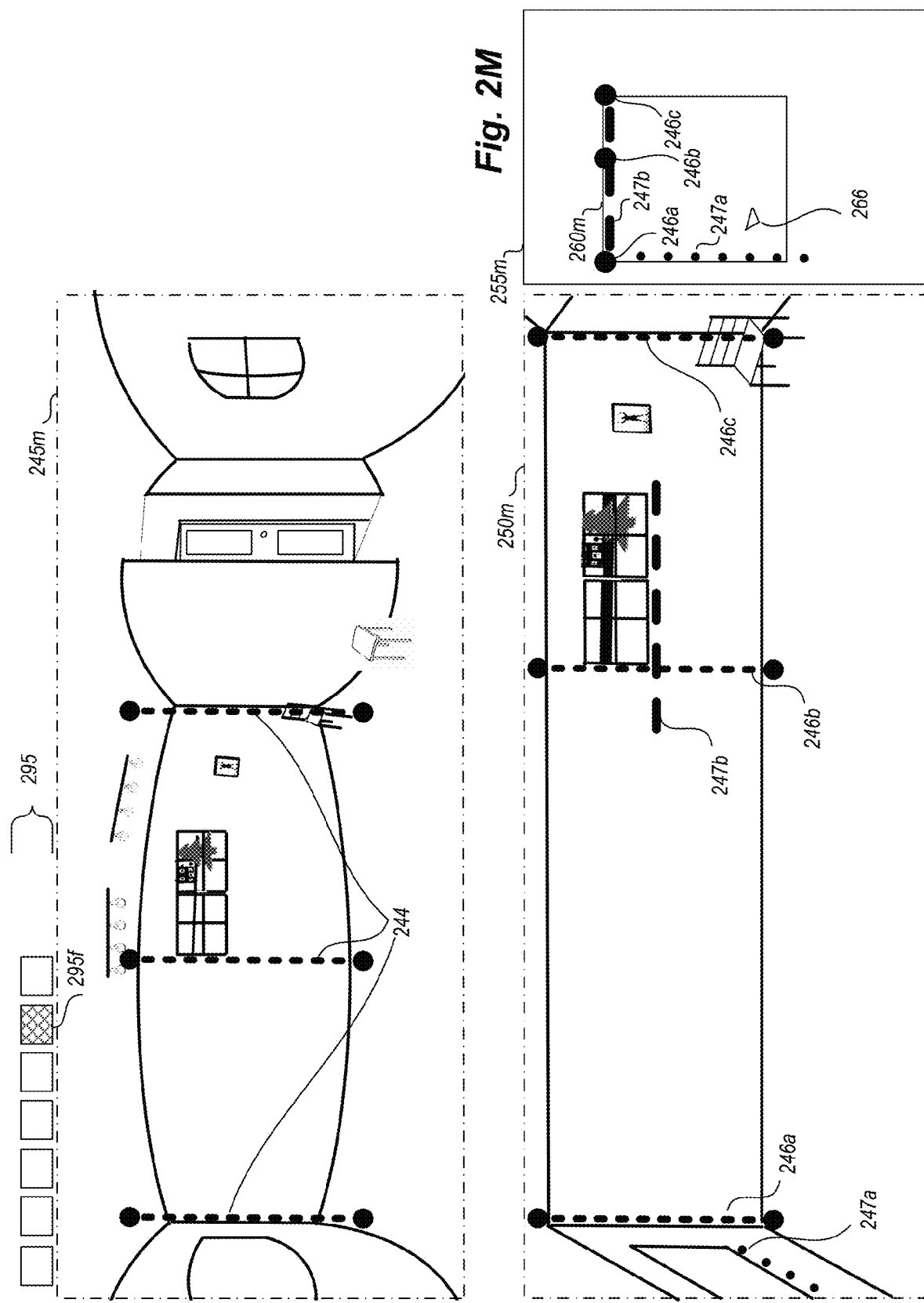

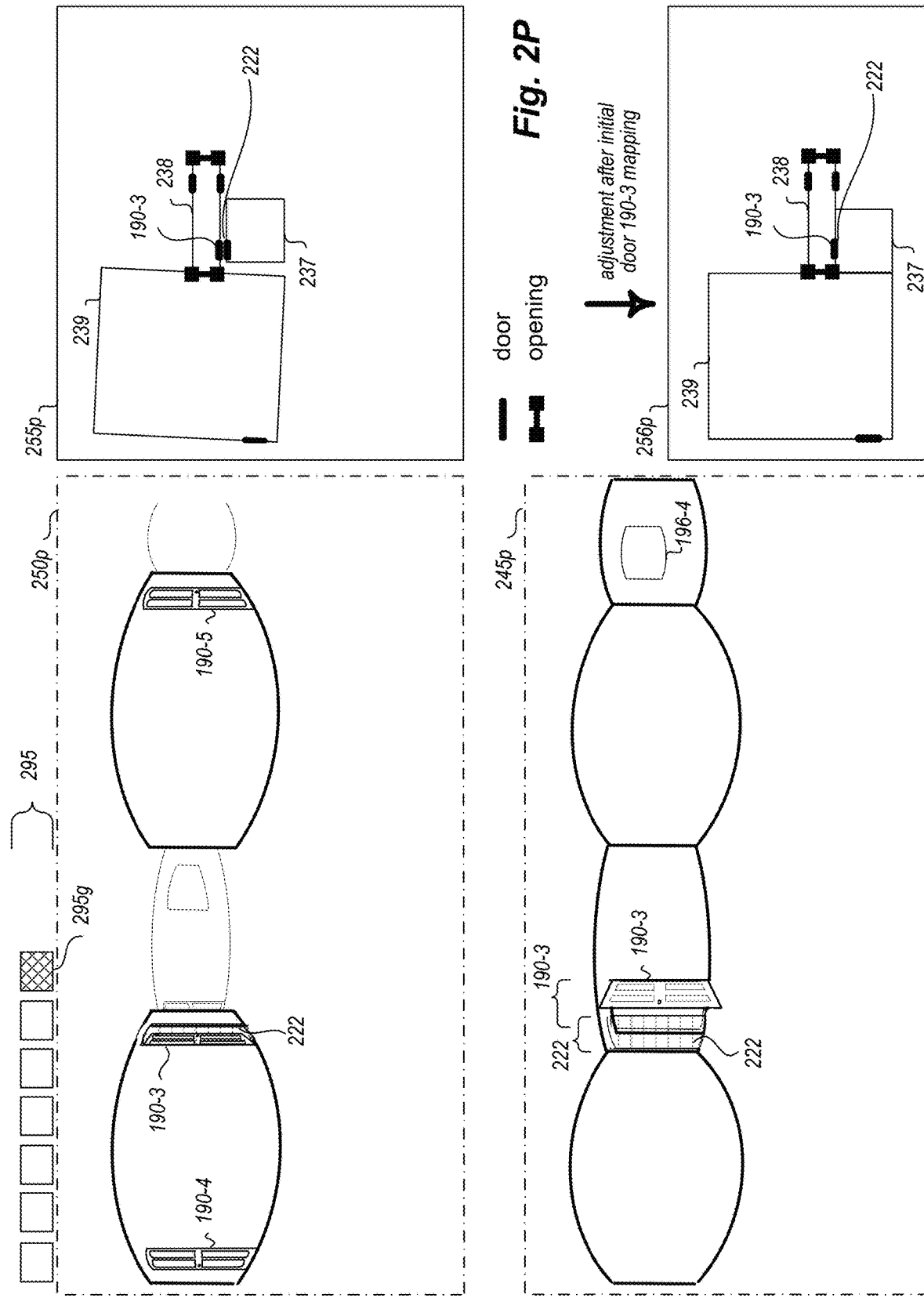

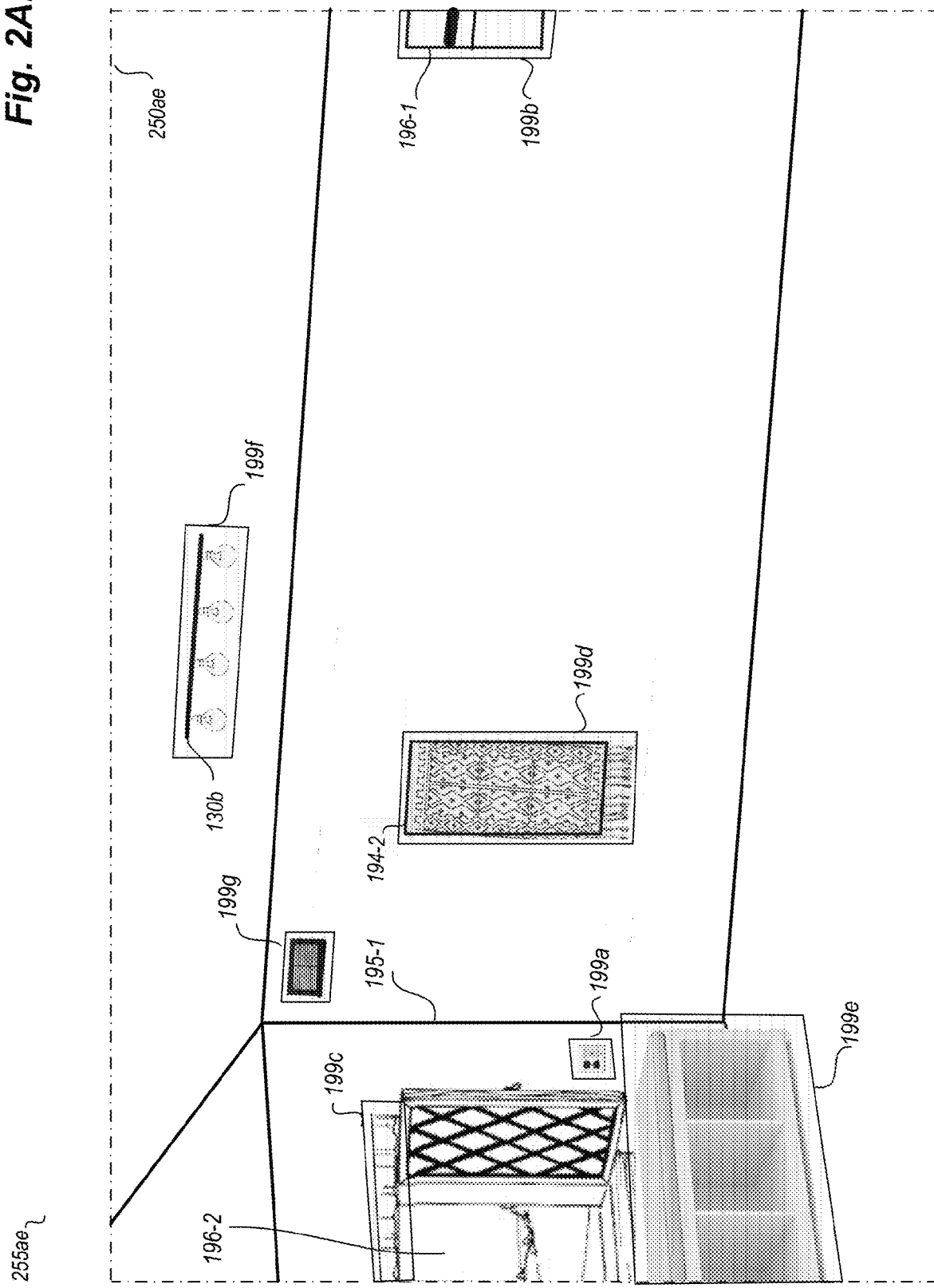

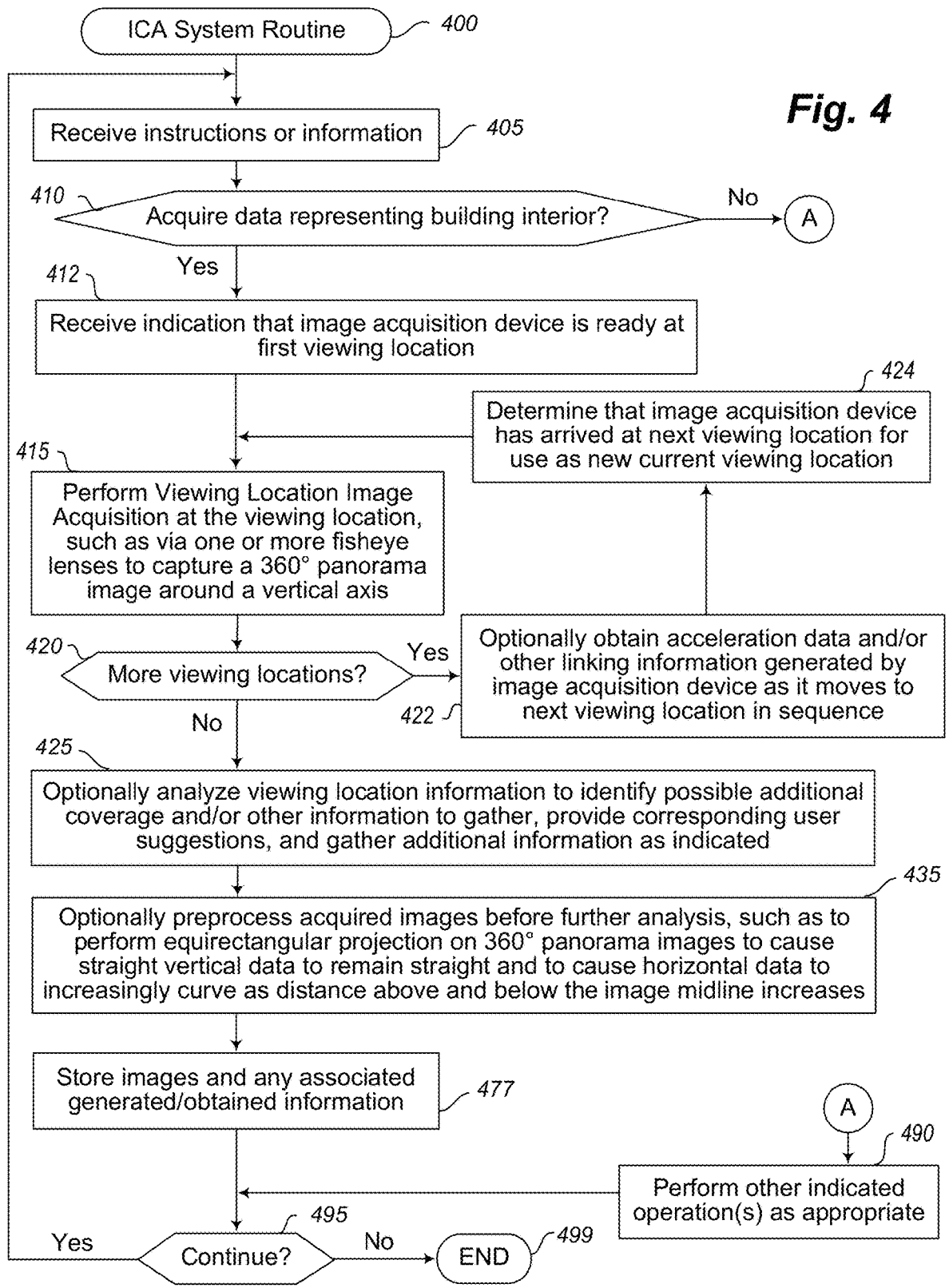

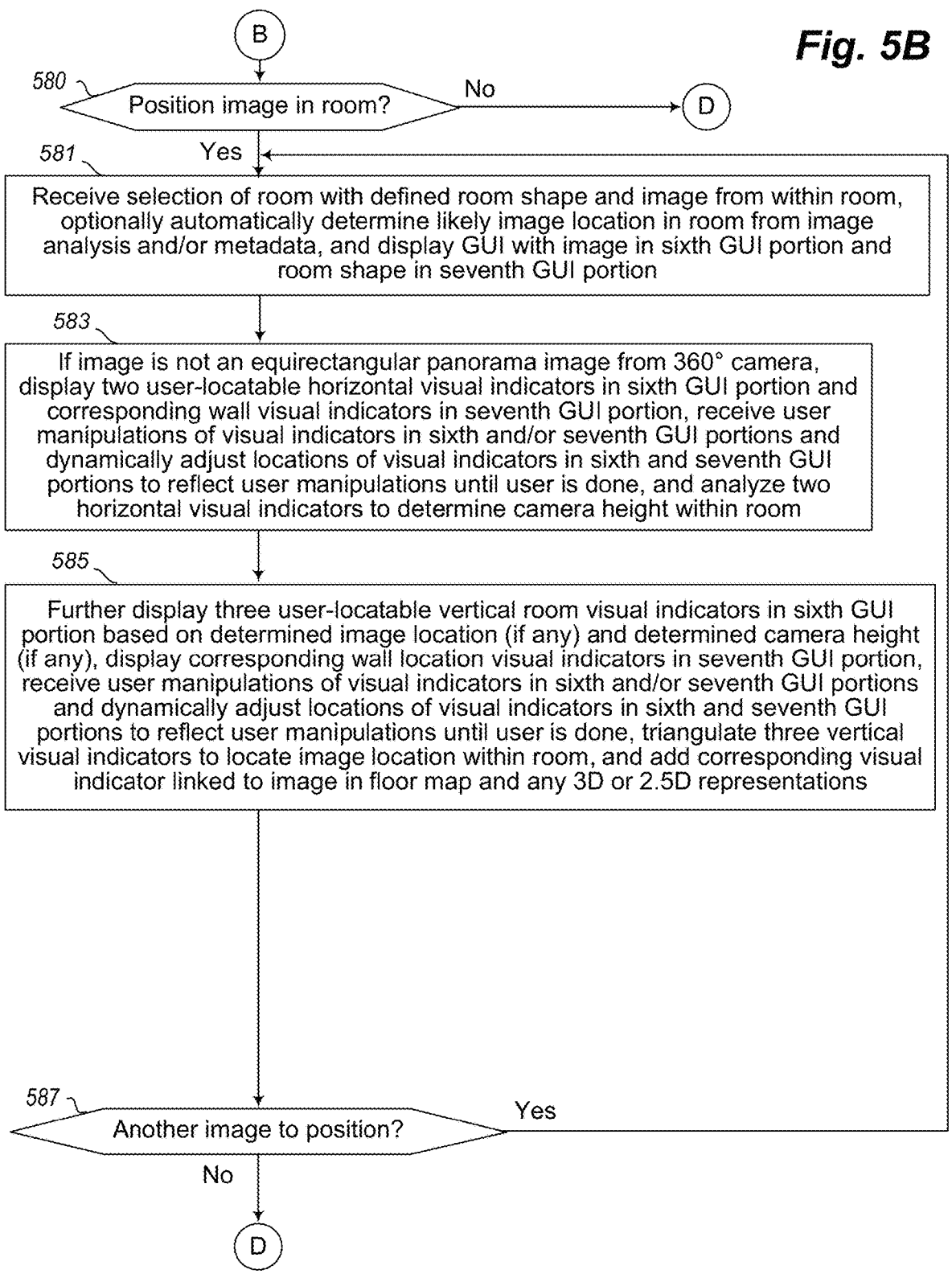

AUTOMATED TOOLS FOR GENERATING MAPPING INFORMATION FOR BUILDINGS

CROSS REFERENCE TO RELATED APPLICATIONS

This application is a continuation-in-part of co-pending U.S. Non-Provisional patent application Ser. No. 16/807,135, filed Mar. 2, 2020 and entitled "Automated Tools For Generating Mapping Information For Buildings", which claims the benefit of U.S. Provisional Patent Application No. 62/893,108, filed Aug. 28, 2019 and entitled "Automated Tools For Generating Mapping Information For Buildings," each of which is hereby incorporated by reference in its entirety.

TECHNICAL FIELD

The following disclosure relates generally to using automated tools and associated techniques to analyze images acquired in a defined area as part of generating mapping information for the area, such as a floor map for a building interior, as well as subsequently using the generated mapping information in one or more manners.

BACKGROUND

In various fields and circumstances, such as architectural analysis, property inspection, real estate acquisition and development, remodeling and improvement services, general contracting and other circumstances, it may be desirable to view information about the interior of a house, office, or other building without having to physically travel to and enter it, including to determine actual as-built information about the building rather than design information from before the building is constructed. However, it can be difficult or impossible to effectively display visual information about building interiors to users at remote locations, such as to enable a user to fully understand the layout and other details of the interior.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 4 illustrates an example embodiment of a flow diagram for an Image Capture and Analysis (ICA) system routine in accordance with an embodiment of the present disclosure.

FIGS. 5A-5C illustrate an example embodiment of a flow diagram for a Mapping Information Generation Manager (MIGM) system routine in accordance with an embodiment of the present disclosure.

DETAILED DESCRIPTION

Figure 1A:
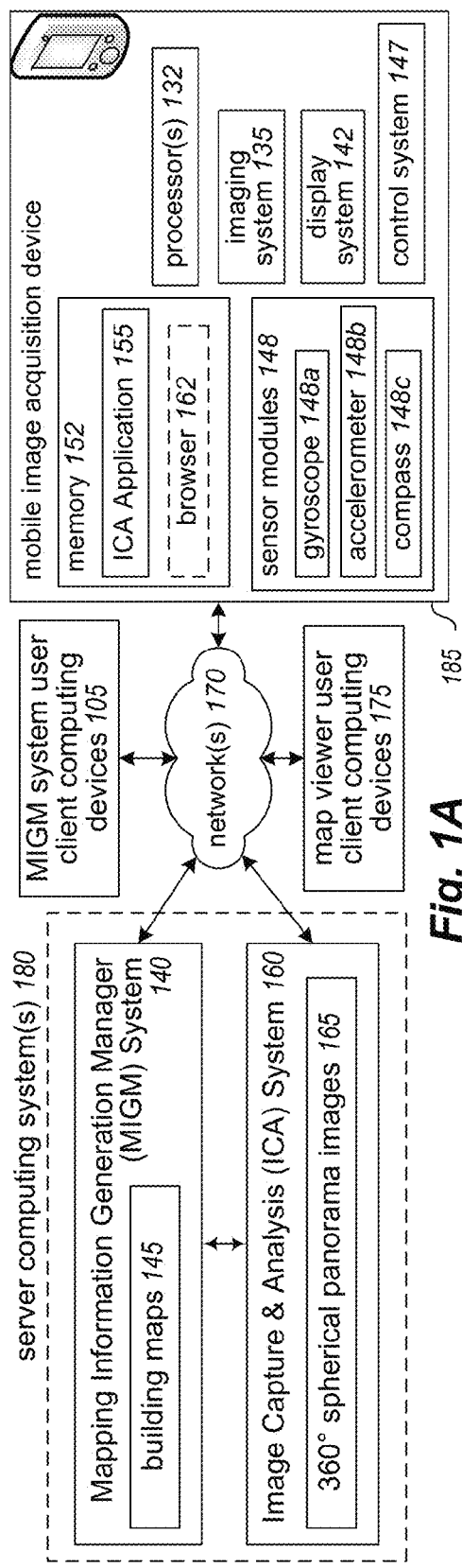
FIGS. 1A-1B are diagrams depicting an exemplary building interior environment and computing system(s) for use in embodiments of the present disclosure, including to generate and present information representing the building interior.

The present disclosure describes techniques for using one or more computing devices to perform automated operations related to analysis of images acquired in a defined area, as part of generating mapping information of the defined area for subsequent use in one or more further automated manners. In at least some embodiments, the defined area includes an interior of a multi-room building (e.g., a house, office, etc.), and the generated information includes a floor map of the building, such as a 2D (two-dimensional) overhead view (e.g., an orthographic top view) of a schematic floor map that is generated from an analysis of multiple 360° spherical panorama images acquired at various viewing locations within the building (e.g., using an image acquisition device with a spherical camera having one or more fisheye lenses to capture a panorama image that extends 360 degrees horizontally around a vertical axis)—in at least some such embodiments, the generating of the mapping information is further performed without having or using information acquired from depth-sensing equipment about distances from the images' viewing locations to walls or other objects in the surrounding building interior. The generated floor map and/or other generated mapping-related information may be further used in one or more manners in various embodiments, such as for controlling navigation of mobile devices (e.g., autonomous vehicles), for display on one or more client devices in corresponding building information display GUIs (graphical user interfaces), etc. Additional details are included below regarding the automated operations of the computing device(s) involved in the generating of the mapping information, and some or all of the techniques described herein may, in at least some embodiments, be performed at least in part via automated operations of a Mapping Information Generation Manager ("MIGM") system, as discussed further below.

In addition, the automated operations of the computing device(s) may in some embodiments and situations include interacting with one or more MIGM system operator users who assist with the analysis of the images and the generating of the mapping information, such as by displaying one or more building information determination GUIs of the MIGM system that show information related to the images and/or that show associated mapping information being generated, and receiving and further using input submitted by the user(s) via the GUI(s) as part of the mapping information generation. As one non-exclusive example, one or more MIGM system operator users may, in at least some embodiments, manipulate information overlaid on a displayed acquired image of a room and/or a generated shape of the room (e.g., a 2D overhead floor map) in order to identify structural and other visual features of the room in which the image was acquired, such as to identify one or more of the following: borders between adjacent walls; borders between walls and a floor; borders between walls and a ceiling; windows and/or sky-lights; passages into and/or out of the room, such as doors and other openings in walls, stairs, etc.; other structures (e.g., represented as cuboid shapes), such as countertops, bath tubs, sinks, fireplaces, and furniture; etc. As another non-exclusive example, one or more MIGM system operator users may, in at least some embodiments, manipulate information overlaid on a displayed acquired image of a room and/or a generated shape of the room in order to determine a position within the room at which the image was acquired, such as by specifying one or more of the following: vertical lines on walls in the room image and corresponding locations on the associated room shape; horizontal lines on walls in the room image (or curved lines on an equirectangular projection that represent horizontal lines in the room) and corresponding lines on the associated room shape; etc. As another non-exclusive example, one or more MIGM system operator users may, in at least some embodiments, manipulate information overlaid on two or more displayed acquired images of two or more rooms and/or on generated shapes of the rooms in order to connect the rooms via one or more shared inter-room passages (e.g., doors and/or other openings between the rooms) and define a layout of the room shapes relative to each other in which the shared inter-room passages are connected, such as by specifying one or more of the following: for each of at least two rooms having an inter-room passage between them, the portion of an image of the room that defines that inter-room passage within that room; for an inter-room passage between at least two rooms, the corresponding locations in the associated room shapes at which the inter-room passage is located; for multiple 360° panorama images acquired within a single room, the room shape for the room based on a combination information from all of those images in order to increase precision of the resulting generated room shape (and thus improve resulting precision of layout information for that room and an adjacent room); etc. After multiple 360° spherical panorama images (and optionally other images) are acquired for a building interior (and optionally an exterior of the building), and room shapes and inter-room passages are determined for some or all of those panorama images, the generation of a floor map for the building and optionally other mapping information for the building may include using the inter-room passage information and other information to determine relative global positions of the associated room shapes to each other in a common coordinate system or other common frame of reference (e.g., without knowing the actual measurements of the rooms). In addition, if distance scaling information is available for one or more of the images, corresponding distance measurements may be determined, such as to allow room sizes and other distances to be determined and further used for the generated floor map. Additional details are included below regarding automated operations of computing device(s) implementing an MIGM system as part of interacting with MIGM system operator user(s), as well as in performing additional automated analyses that are based at least in part on information received from the user(s).

In at least some embodiments and situations, some or all of the images acquired for a building are 360° spherical panorama images that are each acquired at one of multiple viewing locations in or around the building, such as with each panorama image covering 360 degrees horizontally around a vertical axis, and being provided in a format using an equirectangular projection in which straight vertical data (e.g., the sides of a typical rectangular door frame) in the room remains straight in the image and in which straight horizontal data (e.g., the top of a typical rectangular door frame) in the room remains straight in the image if it is shown at a horizontal midline of the image but is increasingly curved in the image in a convex manner relative to the horizontal midline as the distance increases in the image from the horizontal midline. It will be appreciated that such a 360° spherical panorama image may in some situations be represented in a spherical coordinate system and cover up to 360° around a vertical axis, such that a user viewing such a panorama image may move the viewing direction within the panorama image to different orientations to cause different subset images (or "views") to be rendered within the panorama image (including, if the panorama image is represented in a spherical coordinate system, to convert the image being rendered into a planar coordinate system, such as for a perspective image view before it is displayed). Furthermore, acquisition metadata regarding the capture of such panorama images may be obtained and used in various manners, such as data acquired from IMU (inertial measurement unit) sensors or other sensors of a mobile image acquisition device as it is carried by a user or otherwise moved between viewing locations. In addition, images acquired for a building may further include one or more non-spherical images acquired in one or more rooms in at least some embodiments, such as perspective images in a rectilinear format in which horizontal and vertical straight lines in the room remain straight in the perspective images. Additional details are included below regarding automated operations of device(s) implementing an Image Capture and Analysis (ICA) system involved in acquiring images and optionally acquisition metadata, as well as in optionally performing preprocessing of the images before later use (e.g., to render 360° spherical panorama images in an equirectangular format).

In some embodiments, one or more types of additional processing may be further performed, such as to determine additional mapping-related information for a generated floor map or to otherwise associate additional information with a generated floor map. As one example, one or more types of additional information about a building may be received and associated with the floor map (e.g., with particular locations in the floor map), such as additional images, textual and/or audio annotations or other descriptions of particular rooms or other locations, other audio information, such as recordings of ambient noise; overall dimension information; etc. As another example, in at least some embodiments, additional processing of images is performed to determine estimated distance information of one or more types, such as to measure sizes in images of objects of known size, and use such information to estimate room width, length and/or height dimensions. Such estimated size information for one or more rooms may be associated with the floor map, stored and optionally displayed—if the size information is generated for all rooms within a sufficient degree of accuracy, a more detailed floor plan of the building may further be generated, such as with sufficient detail to allow blueprints or other architectural plans to be generated. In addition, if estimated size information includes height information from floors to ceilings, a 3D (three-dimensional) model (e.g., with full height information represented) and/or 2.5D (two-and-a-half dimensional) model (e.g., with partial representations of height shown) of some or all of the 2D (two-dimensional) floor map may be created (optionally with information from in-room images projected on the walls of the models), associated with the floor map, stored and optionally displayed. Other types of additional information may be generated or retrieved and used in some embodiments, such as to determine a geographical alignment (e.g., with respect to true north or magnetic north) for a building and/or geographical location (e.g., with respect to latitude and longitude, or GPS coordinates) for a building, and to optionally include corresponding information on its generated floor map and/or other generated mapping-related information, and/or to optionally further align the floor map or other generated mapping-related information with other associated external information (e.g., satellite or other external images of the building, including street-level images to provide a 'street view' of the building; information for an area in which the building is located, such as nearby street maps and/or points of interest, or POIs; etc.). Other information about the building may also be retrieved from, for example, one or more external sources (e.g., online databases, 'crowd-sourced' information provided by one or more end users, etc.), and associated with and linked to the floor map and/or to particular locations within the floor map—such additional information may further include, for example, exterior dimensions and/or shape of the building, additional images and/or annotation information acquired corresponding to particular locations within the building (optionally for locations different from viewing locations of the acquired panorama or other images), etc. Such generated floor maps and optionally additional associated information may further be used in various manners, as discussed elsewhere herein.

The described techniques provide various benefits in various embodiments, including to allow floor maps of multi-room buildings and other structures to be generated from images acquired in the buildings or other structures via automated operations of one or more computing systems (including in some embodiments to perform automated operations to interact with one or more users to obtain one or more types of user-supplied input that is used for further automated analysis), including without having or using detailed information about distances from images' viewing locations to walls or other objects in a surrounding building or other structure. Furthermore, such automated techniques allow such a floor map to be generated much more quickly than previously existing techniques, and in at least some embodiments with greater accuracy, based at least in part on using information acquired from the actual building environment (rather than from plans on how the building should theoretically be constructed), including based on using 360° spherical panorama images in an equirectangular format that display an entire room and allow efficient user identification of elements of interest in the room, as well as enabling the capture of changes to structural elements that occur after a building is initially constructed. Such described techniques further provide benefits in allowing improved automated navigation of a building by mobile devices (e.g., semi-autonomous or fully-autonomous vehicles), including to significantly reduce their computing power used and time used to attempt to otherwise learn a building's layout. In addition, in some embodiments the described techniques may be used to provide an improved building information display GUI in which an end user may more accurately and quickly obtain information about a building's interior (e.g., for use in navigating that interior, such as via a virtual tour), including in response to search requests, as part of providing personalized information to the end user, as part of providing value estimates and/or other information about a building to an end user, etc. Various other benefits are also provided by the described techniques, some of which are further described elsewhere herein.

For illustrative purposes, some embodiments are described below in which specific types of information are acquired, used and/or presented in specific ways for specific types of structures and by using specific types of devices—however, it will be understood that the described techniques may be used in other manners in other embodiments, and that the invention is thus not limited to the exemplary details provided. As one non-exclusive example, while floor maps may be generated for houses that do not include detailed measurements for particular rooms or for the overall houses, it will be appreciated that other types of floor maps or other mapping information may be similarly generated in other embodiments, including for buildings (or other structures or layouts) separate from houses. As another example, while floor maps for houses or other buildings may be used for display to assist viewers in navigating the buildings, generated mapping information may be used in other manners in other embodiments. In addition, the term "building" refers herein to any partially or fully enclosed structure, typically but not necessarily encompassing one or more rooms that visually or otherwise divide the interior space of the structure—non-limiting examples of such buildings include houses, apartment buildings or individual apartments therein, condominiums, office buildings, commercial buildings or other wholesale and retail structures (e.g., shopping malls, department stores, warehouses, etc.), etc. The term "acquire" or "capture" as used herein with reference to a building interior, viewing location, or other location (unless context clearly indicates otherwise) may refer to any recording, storage, or logging of media, sensor data, and/or other information related to spatial and/or visual characteristics of the building interior or subsets thereof, such as by a recording device or by another device that receives information from the recording device. In addition, various details are provided in the drawings and text for exemplary purposes, but are not intended to limit the scope of the invention. For example, sizes and relative positions of elements in the drawings are not necessarily drawn to scale, with some details omitted and/or provided with greater prominence (e.g., via size and positioning) to enhance legibility and/or clarity. Furthermore, identical reference numbers may be used in the drawings to identify similar elements or acts.

Figure 1B:
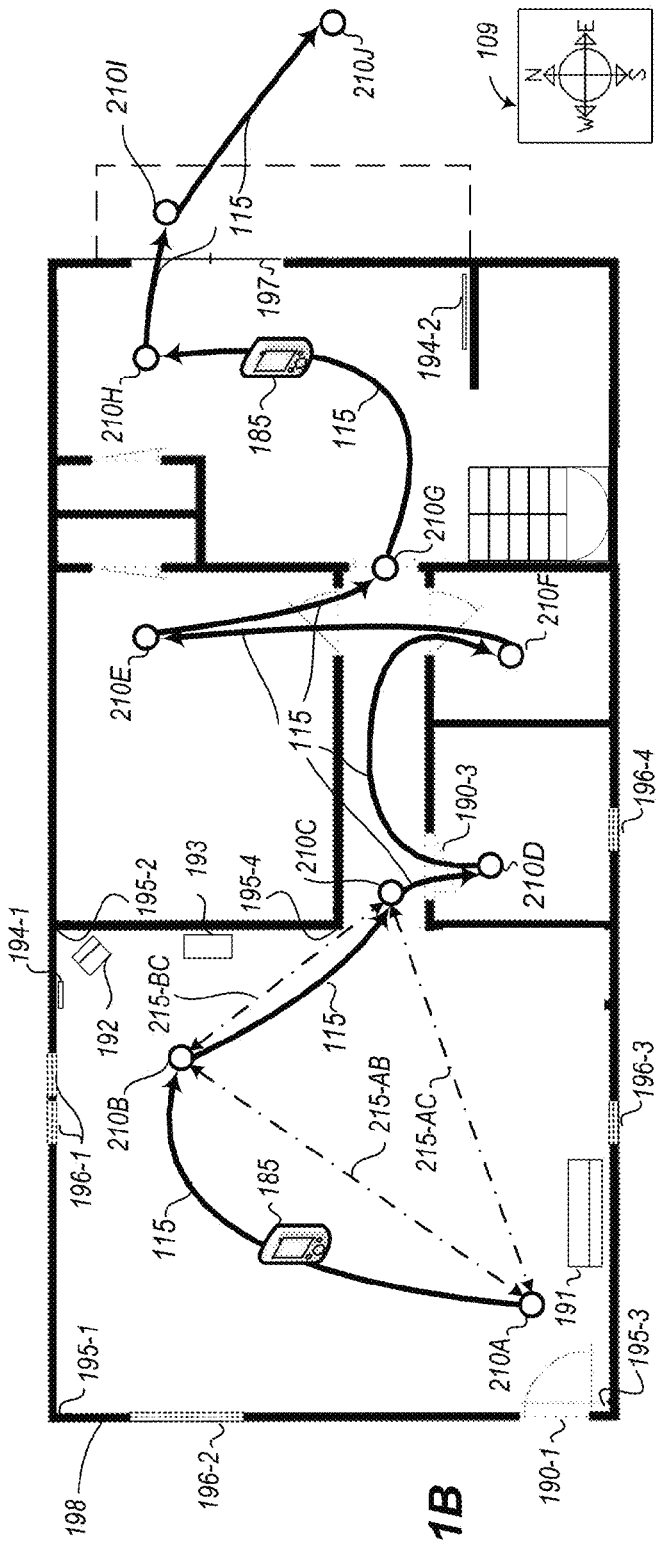

FIG. 1A is an example block diagram of various computing devices and systems that may participate in the described techniques in some embodiments. In particular, one or more 360° spherical panorama images 165 in equirectangular format have been generated by an Interior Capture and Analysis ("ICA") system (e.g., a system 160 that is executing on one or more server computing systems 180, and/or a system provided by application 155 executing on one or more mobile image acquisition devices 185), such as with respect to one or more buildings or other structures—FIG. 1B shows one example of acquisition of such panorama images for a particular house at multiple viewing locations 210 (locations 210A-210J) within the house interior and exterior (e.g., with location 210I on an external area 118, such as a deck or patio, and location 210J in another external area, such as a patio or backyard or garden), and FIGS. 2A-2AG illustrate additional details about using such panorama images to generated an associated floor map, as discussed further below. An MIGM (Mapping Information Generation Manager) system 140 is further executing on one or more server computing systems to generate and provide building floor maps 145 and/or other mapping-related information (not shown) based on use of the panorama images 165 and optionally additional associated information, as well as by using supporting information supplied by MIGM system operator users via computing devices 105 and intervening computer network(s) 170—additional details related to the automated operation of the MIGM system are included elsewhere herein, including with respect to FIGS. 2A-2AG and 5A-5C. In some embodiments, the ICA system (s) and MIGM system 140 may execute on the same server computing system(s), such as if both systems are operated by a single entity or are otherwise executed in coordination with each other (e.g., with some or all functionality of both systems integrated together into a larger system), while in other embodiments the MIGM system may instead operate without an ICA system and instead obtain panorama images (or other images) from one or more external sources and optionally store them locally (not shown) with the MIGM system for further analysis and use.

Various components of the mobile image acquisition device 185 are illustrated in FIG. 1A, including a browser 162 and/or an ICA system application 155 that are executed in memory 152 of the device 185 by one or more hardware processors 132, and including one or more imaging systems 135 to acquire visual data. The illustrated embodiment of mobile device 185 further includes one or more sensor modules 148 that include a gyroscope 148*a*, accelerometer 148*b* and compass 148*c* in this example (e.g., as part of one or more IMU units, not shown separately, on the mobile device), optionally a GPS (or Global Positioning System) sensor or other position determination sensor (not shown in this example), a display system 142, etc. Other computing devices/systems 105, 175 and 180 may include various hardware components and stored information in a manner analogous to mobile device 185, which are not shown in this example for the sake of brevity, and as discussed in greater detail below with respect to FIG. 3.

In the example of FIG. 1A, the ICA system may perform automated operations involved in generating multiple 360° spherical panorama images at multiple associated viewing locations (e.g., in multiple rooms or other locations within a building or other structure and optionally around some or all of the exterior of the building or other structure), such as using visual data acquired via the mobile device(s) 185, and for use in generating and providing a representation of an interior of the building or other structure. For example, in at least some such embodiments, such techniques may include using one or more mobile devices (e.g., a camera having one or more fisheye lenses and mounted on a rotatable tripod or otherwise having an automated rotation mechanism, a camera having sufficient fisheye lenses to capture 360 degrees horizontally without rotation, a smart phone held and moved by a user, a camera held by or mounted on a user or the user's clothing, etc.) to capture data from a sequence of multiple viewing locations within multiple rooms of a house (or other building), and to optionally further capture data involved in movement or travel between some or all of the viewing locations for use in linking the multiple viewing locations together, but without having distances between the viewing locations being measured or having other measured depth information to objects in an environment around the viewing locations (e.g., without using any depth-sensing sensors). After a viewing location's information is captured, the techniques may include producing a 360° spherical panorama image from that viewing location that shows the surrounding room in an equirectangular format, and then providing the panorama images for subsequent use by the MIGM system. Additional details related to embodiments of a system providing at least some such functionality of an ICA system are included in U.S. Non-Provisional patent application Ser. No. 16/236,187, filed Dec. 28, 2018 and entitled "Automated Control Of Image Acquisition Via Use Of Acquisition Device Sensors"; in U.S. Non-Provisional patent application Ser. No. 16/190,162, filed Nov. 14, 2018 and entitled "Automated Mapping Information Generation From Inter-Connected Images"; and in U.S. Non-Provisional patent application Ser. No. 15/649,434, filed Jul. 13, 2017 and entitled "Connecting And Using Building Interior Data Acquired From Mobile Devices" (which includes disclosure of a BICA system that an example embodiment of an ICA system generally directed to obtaining and using panorama images from within one or more buildings or other structures); each of which is incorporated herein by reference in its entirety.

One or more end users (not shown) of one or more map viewer client computing devices 175 may further interact over computer networks 170 with the MIGM system 140 (and optionally the ICA system 160), such as to obtain, display and interact with a generated floor map. In addition, while not illustrated in FIG. 1A, a floor map (or portion of it) may be linked to or otherwise associated with one or more additional types of information, such as one or more associated and linked images or other associated and linked information, including for a two-dimensional ("2D") floor map of a building to be linked to or otherwise associated with a separate 2.5D model rendering of the building and/or a 3D model rendering of the building (referred to at times as a "dollhouse view"), etc., and including for a floor map of a multi-story or otherwise multi-level building to have multiple associated sub-floor maps for different stories or levels that are interlinked (e.g., via connecting stairway passages). Accordingly, non-exclusive examples of an end user's interactions with a displayed or otherwise generated 2D floor map of a building may include one or more of the following: to change between a floor map view and a view of a particular image at a viewing location within or near the floor map; to change between a 2D floor map view and a 2.5D or 3D model view that optionally includes images texture-mapped to walls of the displayed model; to change the horizontal and/or vertical viewing direction from which a corresponding subset view of (or portal into) a panorama image is displayed, such as to determine a portion of a panorama image in a 3D spherical coordinate system to which a current user viewing direction is directed, and to render a corresponding planar image that illustrates that portion of the panorama image without the curvature or other distortions present in the original panorama image; etc. Additional details regarding an ILTM system, which is one example embodiment of a system to provide or otherwise support at least some functionality of a building map viewer system and routine as discussed herein, are included in U.S. Non-Provisional patent application Ser. No. 15/950,881, filed Apr. 11, 2018 and entitled "Presenting Image Transition Sequences Between Viewing Locations", which is incorporated herein by reference in its entirety. In addition, while not illustrated in FIG. 1A, in some embodiments the client computing devices 175 (or other devices, not shown) may receive and use generated floor maps and/or other generated mapping-related information in additional manners, such as to control or assist automated navigation activities by those devices (e.g., by autonomous vehicles or other devices), whether instead of or in addition to display of the generate information.

In the depicted computing environment of FIG. 1A, the network 170 may be one or more publicly accessible linked networks, possibly operated by various distinct parties, such as the Internet. In other implementations, the network 170 may have other forms, such as to instead be a private network (such as a corporate or university network) that is wholly or partially inaccessible to non-privileged users. In still other implementations, the network 170 may include both private and public networks, with one or more of the private networks having access to and/or from one or more of the public networks. Furthermore, the network 170 may include various types of wired and/or wireless networks and connections in various situations.

Figure 2A:
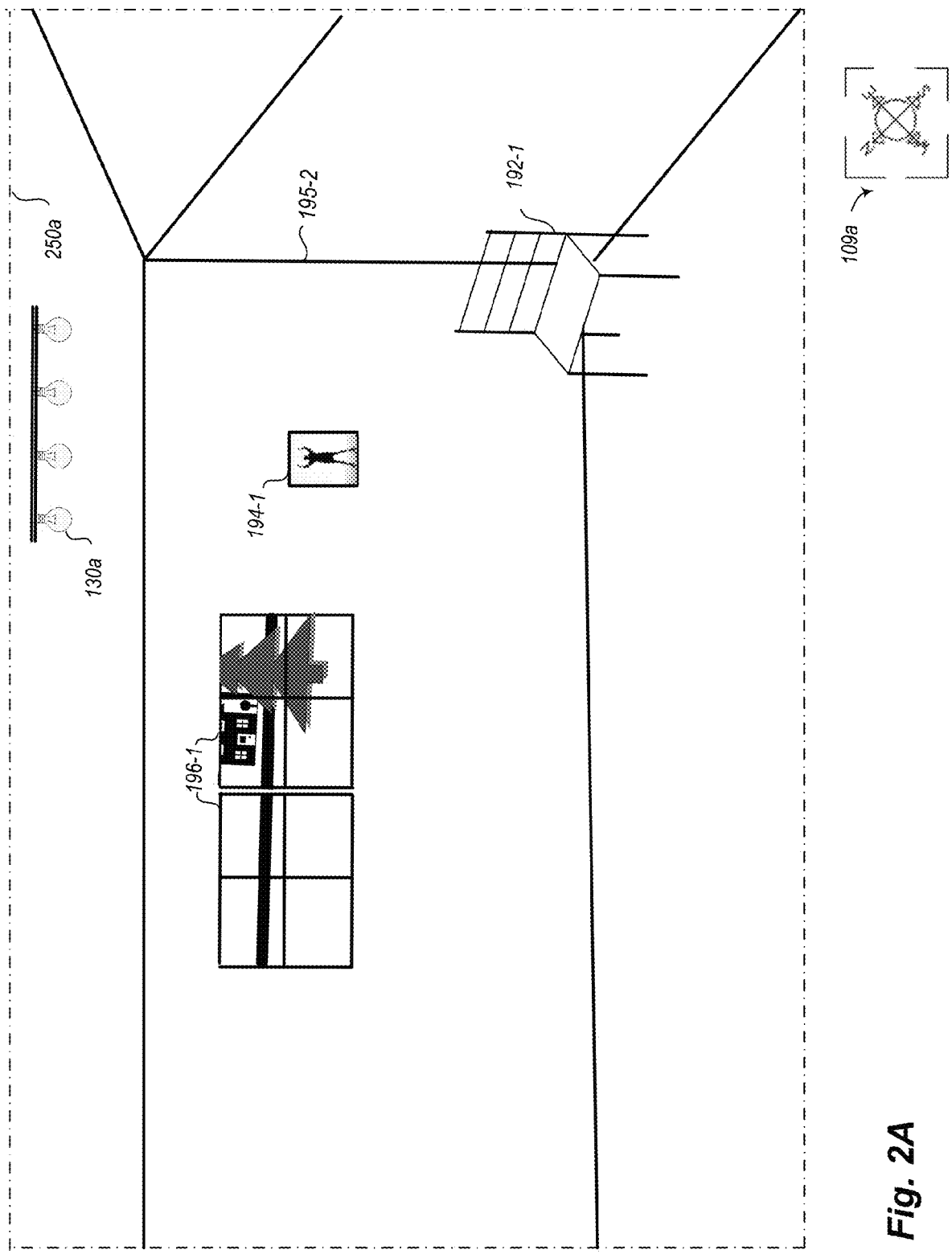
FIGS. 2A-2Z and 2AA-2AG illustrate examples of automated operations for participating in analysis of images and generation of a floor map for a building.

FIG. 1B depicts a block diagram of an exemplary building interior environment in which 360° spherical panorama images are generated, for use by the MIGM system to generate and provide a corresponding building floor map, as discussed in greater detail with respect to FIGS. 2A-2AG, as well as for use in presenting the panorama images to users. In particular, FIG. 1B illustrates one story of a multi-story building 198 with an interior that was captured at least in part via multiple panorama images, such as by a mobile image acquisition device 185 with image acquisition capabilities as it is moved through the building interior to a sequence of multiple viewing locations 210 (e.g., starting at viewing location 210A, moving to viewing location 210B along travel path 115, etc.). An embodiment of the ICA system (e.g., ICA system 160 on server computing system(s) 180, a copy 155 of some or all of the ICA system executing on the mobile image acquisition device 185, etc.) may automatically perform or assist in the capturing of the data representing the building interior, as well as to further analyze the captured data to generate 360° spherical panorama images with equirectangular projections to provide a visual representation of the building interior. While such a mobile image acquisition device may include various hardware components, such as a camera, one or more sensors (e.g., a gyroscope, an accelerometer, a compass, etc., such as part of one or more IMUs, or inertial measurement units, of the mobile device; an altimeter; light detector; etc.), a GPS receiver, one or more hardware processors, memory, a display, a microphone, etc., the mobile device may not in at least some embodiments have access to or use equipment to measure the depth of objects in the building relative to a location of the mobile device, such that relationships between different panorama images and their viewing locations may be determined in part or in whole based on features in different images, but without using any data from any such depth sensors. In addition, while directional indicator 109 is provided in FIG. 1B for reference of the viewer, the mobile device and/or ICA system may not use such absolute directional information in at least some embodiments, such as to instead determine relative directions and distances between viewing locations 210 without regard to actual geographical positions or directions in such embodiments.

In operation, the mobile image acquisition device 185 arrives at a first viewing location 210A within a first room of the building interior (in this example, in a living room accessible via an external door 190-1), and captures a view of a portion of the building interior that is visible from that viewing location 210A (e.g., some or all of the first room, and optionally small portions of one or more other adjacent or nearby rooms, such as through doors, halls, stairs or other connecting passages from the first room). The view capture may be performed in various manners as discussed herein, and may include a number of objects or other features (e.g., structural details) that may be visible in images captured from the viewing location—in the example of FIG. 1B, such objects or other features include the doorways 190 (including 190-1 and 190-3) and 197 (e.g., with swinging and/or sliding doors), windows 196 (including 196-1, 196-2, 196-3 and 196-4), corners or edges 195 (including corner 195-1 in the northwest corner of the building 198, corner 195-2 in the northeast corner of the first room, corner 195-3 in the southwest corner of the first room, corner 195-4 at the northern edge of the inter-room passage between the first room and a hallway, etc.), furniture 191-193 (e.g., a couch 191; chair 192; table 193; etc.), pictures or paintings or televisions or other hanging objects 194 (such as 194-1 and 194-2) hung on walls, light fixtures, various built-in appliances or fixtures (not shown), etc. The user may also optionally provide a textual or auditory identifier to be associated with a viewing location, such as "living room" for the room including viewing locations 210A and/or 210B, while in other embodiments the ICA system may automatically generate such identifiers (e.g., by automatically analyzing video and/or other recorded information for a building to perform a corresponding automated determination, such as by using machine learning) or the MIGM system may determine such identifiers (e.g., based at least in part on input from MIGM system operator users) or the identifiers may not be used.

After the first viewing location 210A has been adequately captured, the mobile device 185 may move or be moved to a next viewing location (such as viewing location 210B), optionally recording video and/or other data from the hardware components (e.g., from one or more IMUs, from the camera, etc.) during movement between the viewing locations. At the next viewing location, the mobile device may similarly capture a 360° spherical panorama image from that viewing location. This process may repeat for some or all rooms of the building and optionally external to the building, as illustrated for viewing locations 210C-210J in this example. The acquired panorama images for each viewing location may be further analyzed, including in some embodiments to render or otherwise place each panorama image in an equirectangular format, whether at the time of image capture or later.

Various details are provided with respect to FIGS. 1A-1B, but it will be appreciated that the provided details are non-exclusive examples included for illustrative purposes, and other embodiments may be performed in other manners without some or all such details.

FIGS. 2A-2AG illustrate examples of generating and presenting a floor map for a building using 360° spherical panorama images of the building interior that are in equirectangular format, such as for the building 198 and panorama images' viewing locations 210 discussed in FIG. 1B.

In particular, FIG. 2A illustrates an example image 250a, such as a perspective image taken in a northeasterly direction from viewing location 210B in the living room of house 198 of FIG. 1B (or a northeasterly facing subset view of a 360-degree panorama image taken from that viewing location and formatted in a rectilinear manner)—the directional indicator 109a is further displayed in this example to illustrate the northeasterly direction in which the image is taken. In the illustrated example, the displayed image includes built-in elements (e.g., light fixture 130a), furniture (e.g., chair 192-1), two windows 196-1, and a picture 194-1 hanging on the north wall of the living room. No inter-room passages into or out of the living room (e.g., doors or other wall openings) are visible in this image. However, multiple room borders are visible in the image 250a, including horizontal borders between a visible portion of the north wall of the living room and the living room's ceiling and floor, horizontal borders between a visible portion of the east wall of the living room and the living room's ceiling and floor, and the vertical border 195-2 between the north and east walls.

Figure 2B:
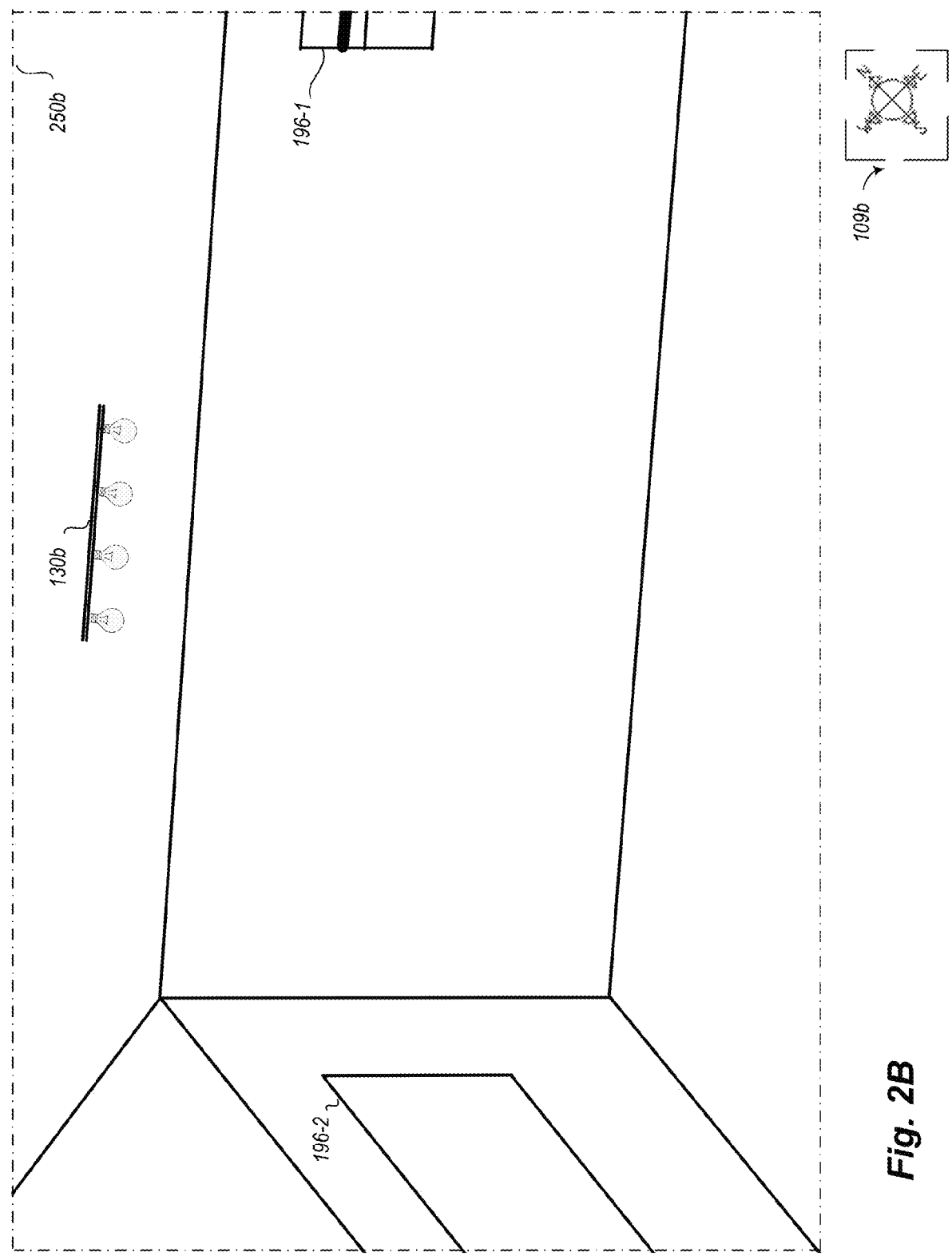

FIG. 2B continues the example of FIG. 2A, and illustrates an additional perspective image 250b taken in a northwesterly direction from viewing location 210B in the living room of house 198 of FIG. 1B—the directional indicator 109b is further displayed to illustrate the northwesterly direction in which the image is taken. In this example image, a small portion of one of the windows 196-1 continues to be visible, along with a portion of window 196-2 and a new lighting fixture 130*b*. In addition, horizontal and vertical room borders are visible in image 250*b* in a manner similar to that of FIG. 2A.

Figure 2C:
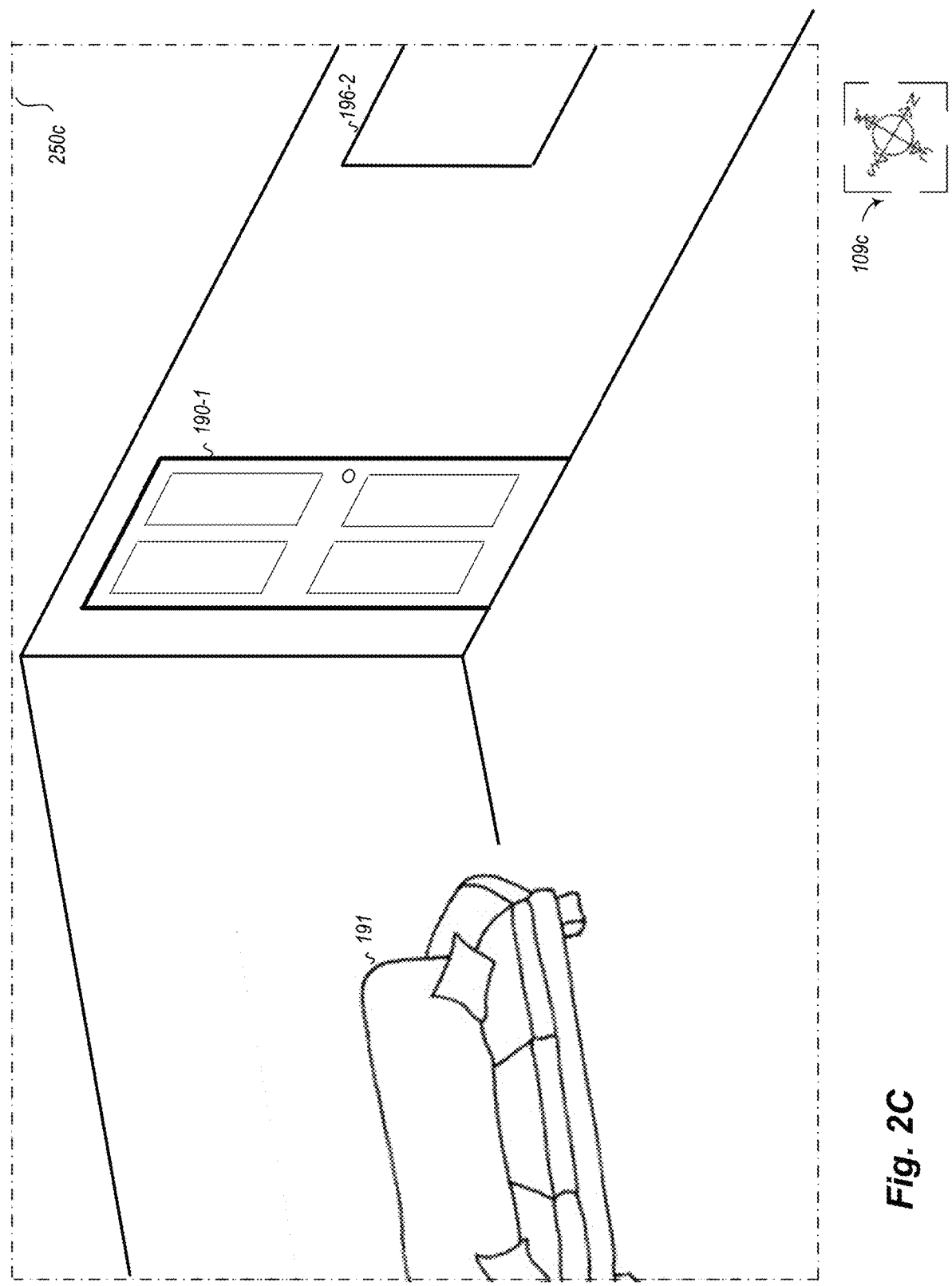

FIG. 2C continues the examples of FIGS. 2A-2B, and illustrates a third perspective image 250*c* taken in a southwesterly direction in the living room of house 198 of FIG. 1B, such as from viewing location 210B or 210A—the directional indicator 109*c* is further displayed to illustrate the southwesterly direction in which the image is taken. In this example image, a portion of window 196-2 continues to be visible, as is a couch 191 and visual horizontal and vertical room borders in a manner similar to that of FIGS. 2A and 2B. This example image further illustrates an inter-room passage for the living room, which in this example is a door 190-1 (which FIG. 1B identifies as a door to the exterior of the house). It will be appreciated that a variety of other perspective images may be taken from viewing location 210B and/or other viewing locations and displayed in a similar manner.

Figure 2D:
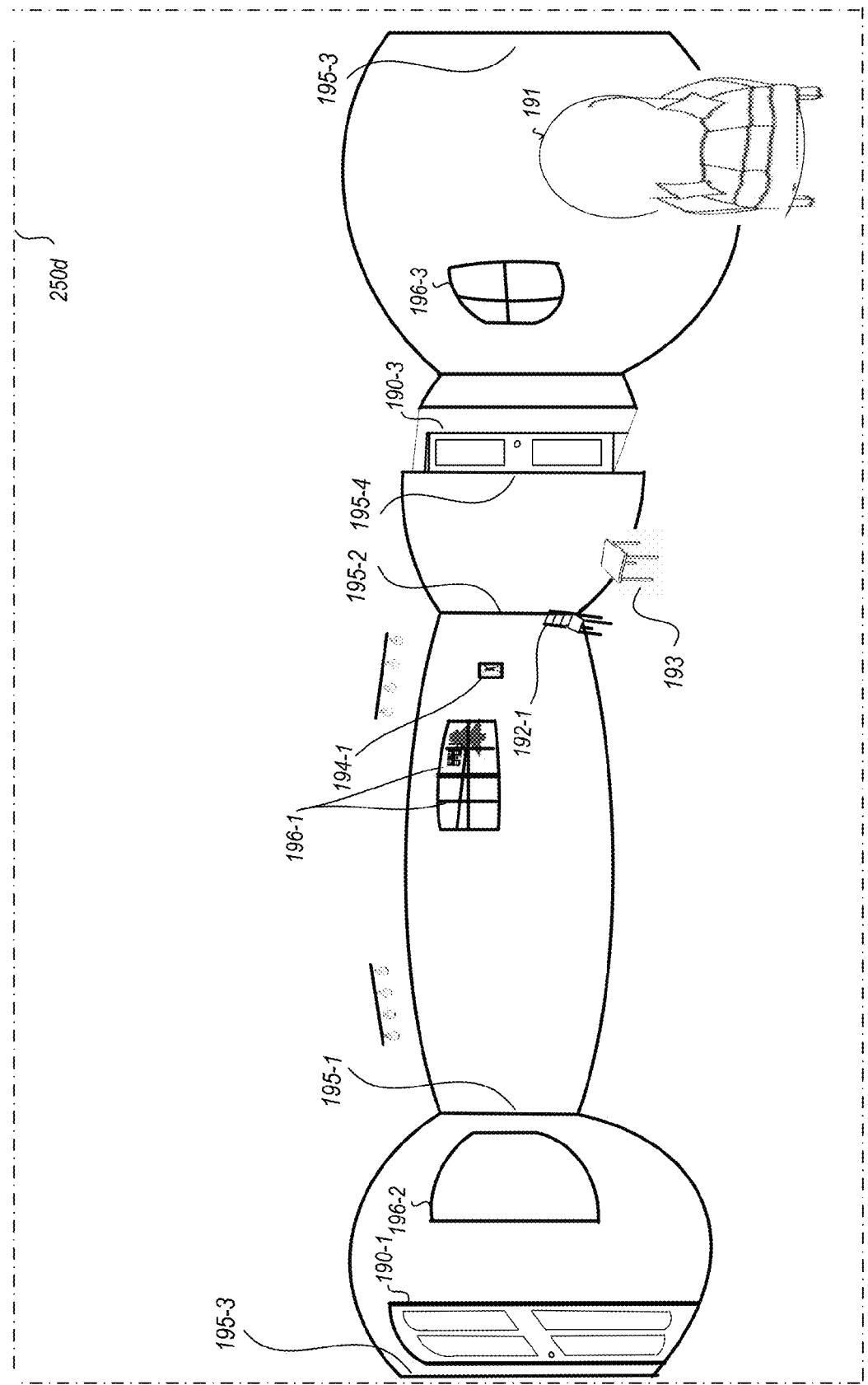

FIG. 2D continues the examples of FIGS. 2A-2C, and illustrates a 360° spherical panorama image 250*d* (e.g., taken from viewing location 210B), which displays the entire living room in an equirectangular format—since the panorama image does not have a direction in the same manner as the perspective images of FIGS. 2A-2C, the directional indicator 109 is not displayed in FIG. 2D. A portion of the panorama image 250*d* which corresponds to the first perspective image 250*a* is shown in approximately the center portion of the image 250*d*, while the left portion of the image 250*d* and the far-right portion of the image 250*d* contain visual data corresponding to that of the perspective images 250*b* and 250*c*. This example panorama image 250*d* includes windows 196-1, 196-2 and 196-3, furniture 192-1, 193 and 191, a door 190-1 and an opening to the hallway (with the opening showing part of a door 190-3 visible in the hallway from the viewing location for image 250*d*). Image 250*d* further illustrates a variety of room borders in a manner similar to that of the perspective images, but with the horizontal borders being displayed in an increasingly curved manner the farther they are from horizontal midline of image—the visible borders include vertical inter-wall borders 195-1, 195-2 and 195-3, vertical border 195-4 at the left side of the hallway opening, vertical borders at the right side of the hallway opening and the southeast corner of the living room, and horizontal borders between the walls and the floor and between the walls and the ceiling.

Figure 2E:
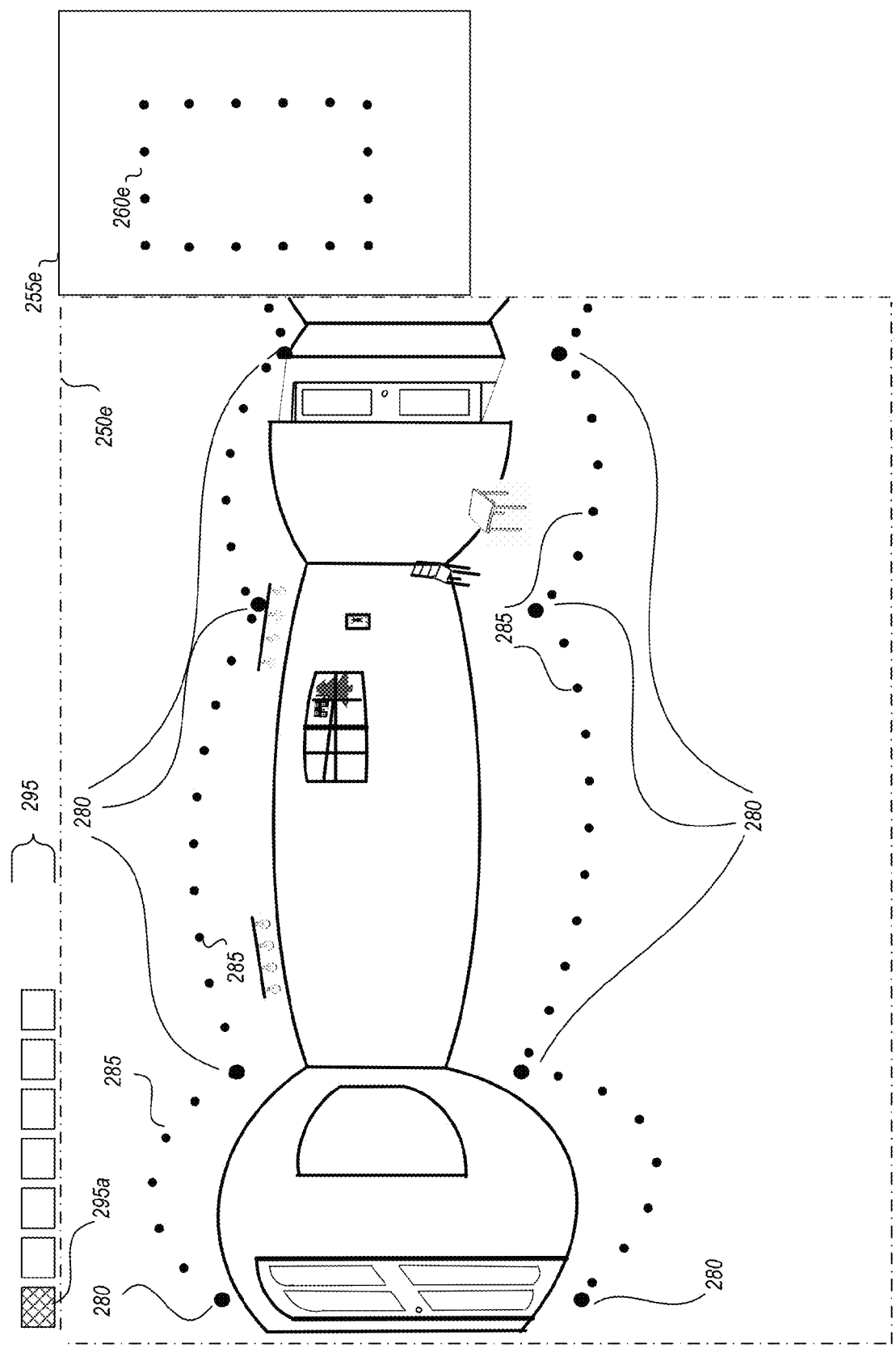

FIG. 2E continues the examples of FIGS. 2A-2D, and again illustrates the 360° spherical panorama image of the living room from FIG. 2D as part of a first pane 250*e* of a building information determination GUI (e.g., provided via automated operations of the MIGM system and being displayed to an MIGM system operator user, not shown), along with user-selectable GUI controls 295 to select different types of functionality, user-manipulatable visual border and corner GUI controls 280 and 285 overlaid on the panorama image in the first GUI pane 250*e* in order to specify the room border outline, and a second GUI pane 255*e*. The second GUI pane 255*e* displays an initial room shape 260*e* corresponding to the visual border and corner GUI controls 280 and 285 in the first GUI pane, such that changes to the room shape in the second GUI pane or to the visual border and corner GUI controls 280 and 285 in the first GUI pane cause corresponding changes in the other pane. GUI control 295*a* is currently selected, corresponding in this example to displaying the GUI controls 280 and 285 to enable the user to provide room shape definition information for the room visible in the displayed panorama image—it will be appreciated that such GUI controls 295 may be displayed and/or accessed in other manners in other embodiments (e.g., via menus, keyboard selections, etc.).

Figure 2F:
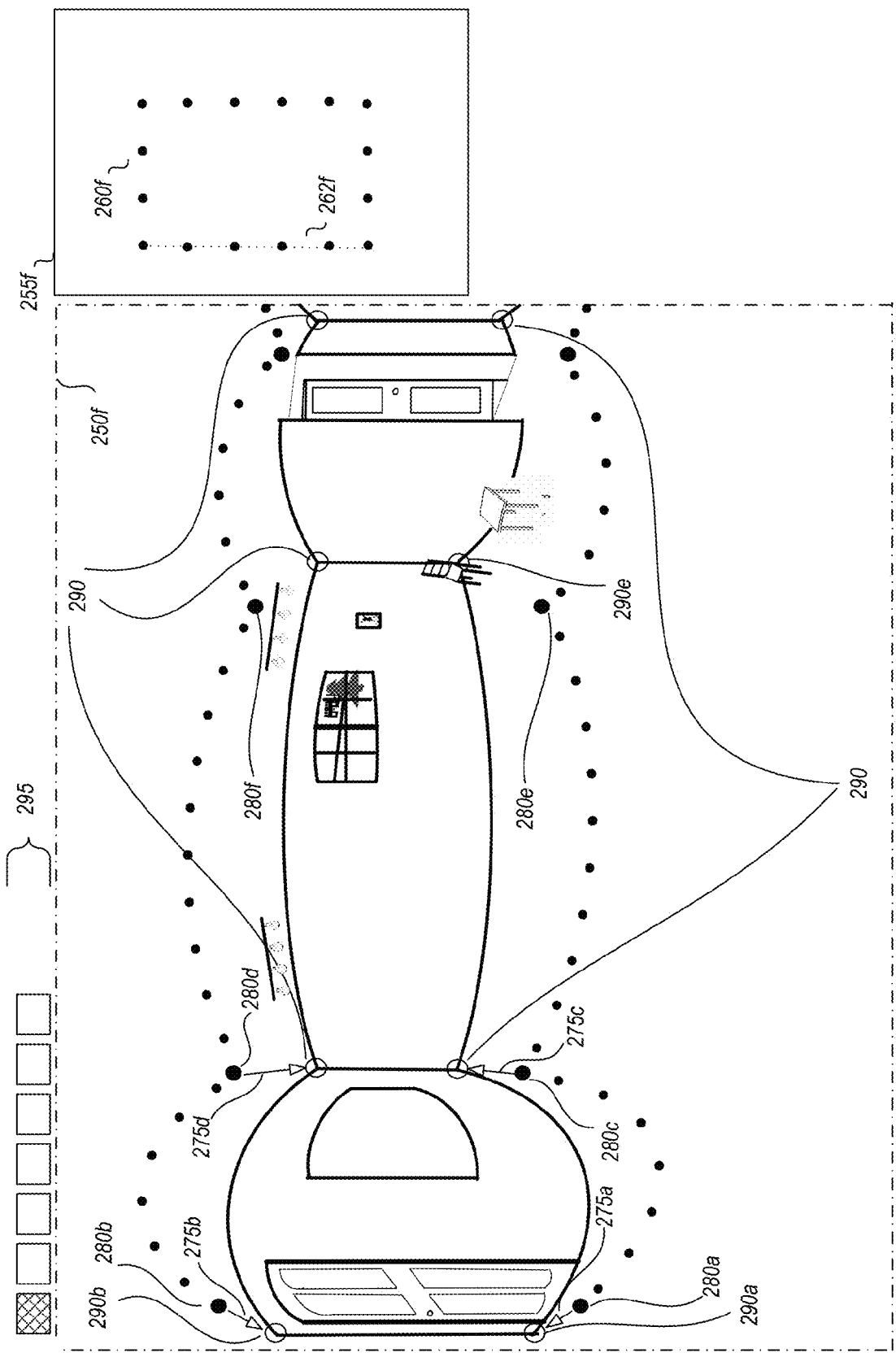
Figure 2G:
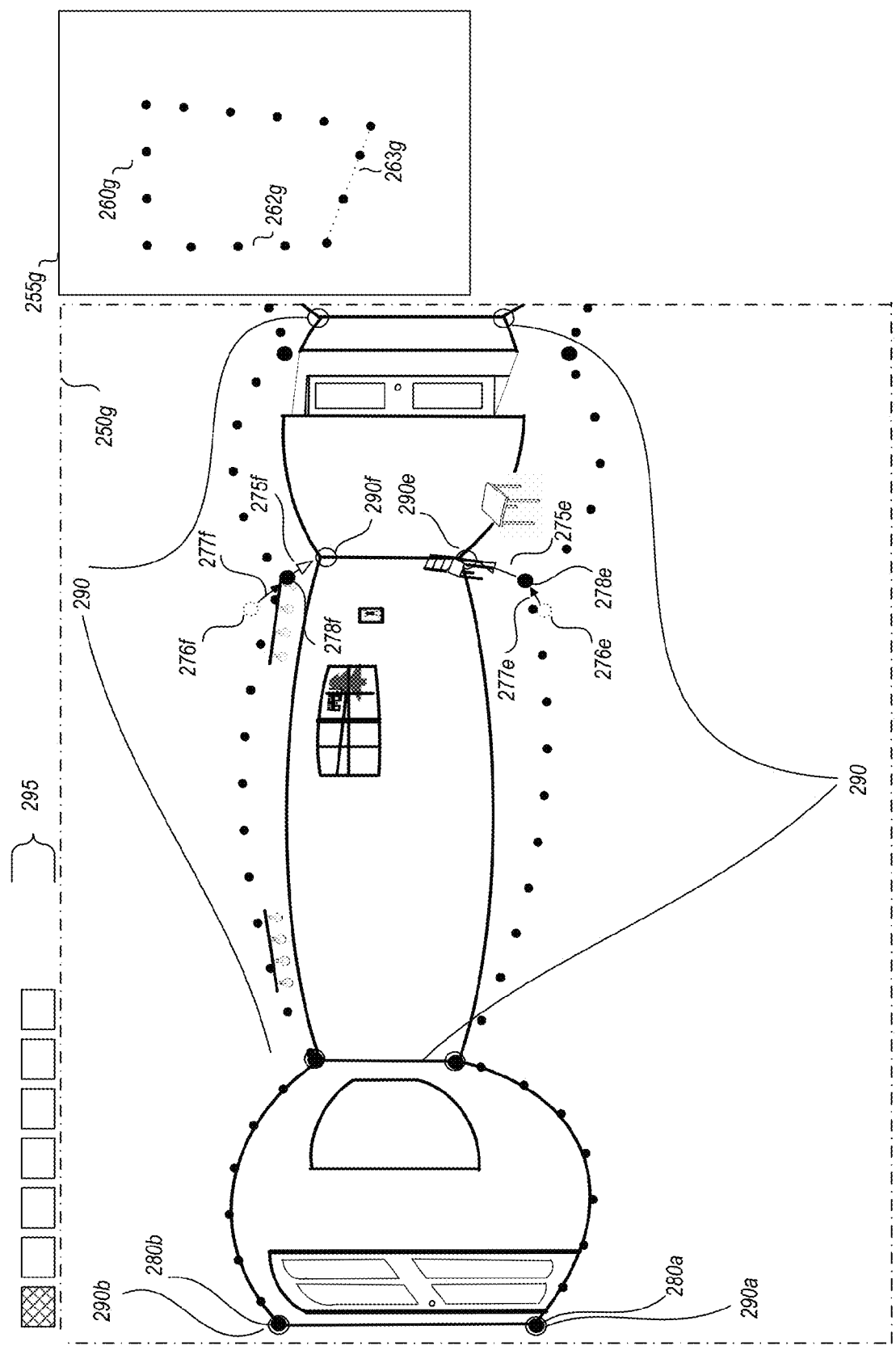

In this example, the GUI controls 280 and 285 include corner visual representations 280 that represent corners in which multiple borders converge, and border visual representations 285 that represent borders between walls and the ceiling and between walls and the floor. After the corner and border visual representations are displayed in the GUI, the user is able to manipulate the visual representations to match corresponding features of the room that are visible in the underlying panorama image, as illustrated in further detail with respect to FIG. 2F. In particular, FIG. 2F further illustrates that the corner visual representation 280B is to be moved 275*b* (e.g., dragged by the user) to a target location 290*b*, and the corner visual representation 280*a* is to be moved 275*a* (e.g., dragged by the user) to the target location 290*a*, with similar movements 275*c* and 275*d* to be made by the user for the corner visual representations 280*c* and 280*d* corresponding to the northwest room corner's floor and ceiling, respectively, and with further corresponding adjustments (not shown) to be made by the user for the other corner visual representations 280 and/or border visual representations 285, etc. In some embodiments, the target locations 290 are not visibly displayed in the GUI, with the user instead selecting the appropriate locations in the displayed image that correspond to the locations of interest in the room. In other embodiments, the MIGM system may perform automated operations to determine candidate corner locations for such target locations (e.g., likely corner locations based on image analysis, such as using machine learning techniques), and if so the GUI may visually indicate them to the user (such as in the manner shown in FIG. 2F) and/or allow the user to snap a visual corner representation 280 to the nearest corresponding determined candidate corner location (or otherwise to a most appropriate determined candidate corner location). As visual corner representation 280*a* is moved to the location 290*a*, the visual border representations attached to that corner representation will similarly move toward the actual corresponding border, as illustrated in FIG. 2G, and other visual corner and/or border representations may similarly shift (e.g., in smaller amounts). In other embodiments and situations, the user may instead move a visual border representation to a corresponding actual border, and the visual corner representations attached to such visual border representations will similarly move toward their actual corresponding corners. Additional visual corner representation 290*e* illustrates, however, that some corners and/or borders in the room may be partially or fully obscured in the panorama image, such as in this case by the chair in the corner—if so, the user may nonetheless closely fit the visual border and corner representations to the obscured areas (e.g., by fitting the visual representations for other nearby unobscured parts of the borders and/or corners, with the visual representations for the obscured areas being dragged to their correct locations despite being obscured), although the MIGM system may not determine candidate locations for borders and/or corners that are sufficiently obscured to prevent corresponding image analysis (e.g., fully obscured). In addition, as the visual corner and/or border representations are moved in the first GUI pane 250*f*, the current room shape 260*f* in the second GUI pane 255F is updated accordingly, such as to have a portion 262*f* of the room shape be modified as corresponding portions of the visual border and corner representations along the west wall of the living room are modified.

FIG. 2G continues the examples of FIGS. 2A-2F, and illustrates a point in time after the visual corner and border representations for the west wall of the living room have been specified by the user to match the corresponding features in the image (e.g., based on the visual corner representations 280a-d being fitted to their corresponding room corners shown in the image. At this point in time, after the visual corner and border representations for the west wall of the living room were moved, portions of the other visual corner and border representations for other parts of the living room have similarly been adjusted, such as for visual corner representation 280e to have been adjusted 277e from its previous position 276e to a current position 278e, for visual corner representation 280f to have been adjusted 277f from its previous position 276f to a current position 278f, and for at least some of the visual border representations (e.g., those between visual corner representations 280d and 280f, those between visual corner representations 280c and 280e, etc.). In addition, since the visual corner and border representations for the other walls of the living room have not yet been fully fitted to their corresponding room borders and corners by the user, the current room shape 260g in the second GUI pane 255g is no longer a rectangle, as the current modified dimensions of the west wall (as defined by its fitted visual corner and border representations) are shorter than the current dimensions for the east wall (as defined by its not fully fitted visual corner and border representations). Accordingly, the user continues to perform manipulations in FIG. 2G to move the visual corner and border representations for the remaining walls of the room, such as to further move 275e the visual corner representation 280e from its current location 278e to its target location of 290e (e.g., via dragging and/or snapping), and to further move 275f the visual corner representation 280f from its current location 278f to its target location of 290f (e.g., via dragging and/or snapping). As such further user manipulations are performed in the first GUI pane 250g, corresponding changes will be made to the defined room shape 260g in the second GUI pane 255g, although the results of those corresponding changes are not shown in the example of FIG. 2G.

Figure 2H:
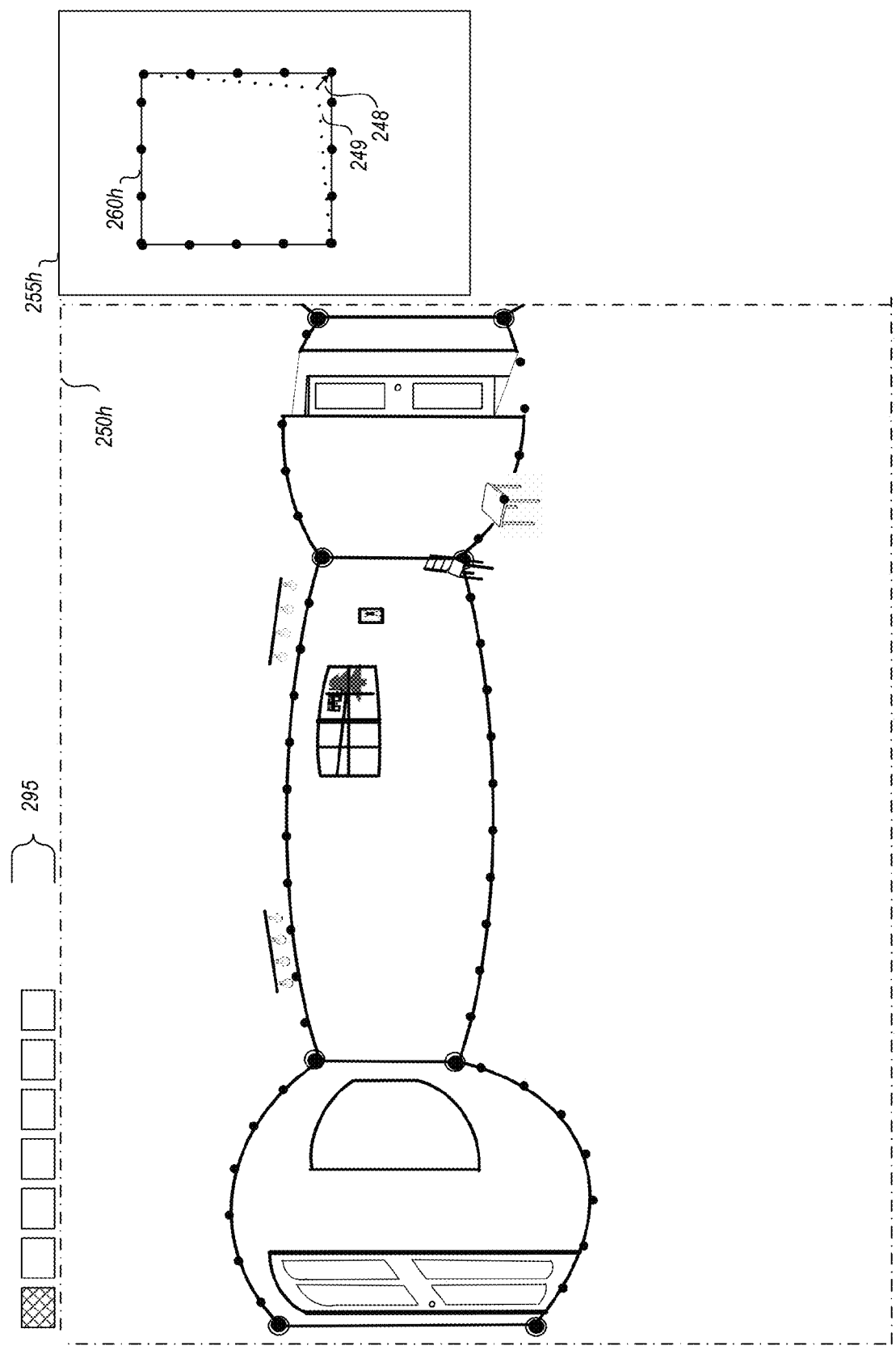

FIG. 2H continues the examples of FIGS. 2A-2G, and illustrates a later point in time after all of the visual corner and border representations overlaid on the panorama image have been fitted to corresponding features of the room as shown in the panorama image. The resulting room shape 260h in the second GUI pane 255h is similarly updated. It will be appreciated that distortions in the panorama image and/or imprecise placement by the user of the visual border and corner representations may cause the resulting room shape 260h to not be exact in some situations (e.g., not be completely rectangular, even if the corresponding room actually is), such as is illustrated with initial room shape variant 249 in the room shape (corresponding to the south-easterly corner of the living room)—if so, adjustments 248 may be made to correct such imperfections, whether on the room shape in the second GUI pane 255h or on the visual corner and border representations overlaid on the panorama image in the first GUI pane 250h, whether manually by the user or automatically by the MIGM system, and whether immediately after the room shape is defined or instead during later processing. For example, the MIGM system may in some embodiments perform automated operations to apply shape constraints and/or optimizations to the initial user-defined room shape (e.g., the version with variant 249), such as to enforce presumptions for factors such as straight walls and 90° corners (such that adjacent walls are perpendicular, and opposing walls are parallel). After any final adjustments have been made, the specification of the room shape for the living room is defined. in addition, while such room shape determination activities are not illustrated for other rooms of the house 198, it will be appreciated that such further room shape determination activities may be performed for some or all rooms of the house.

Figure 2I:
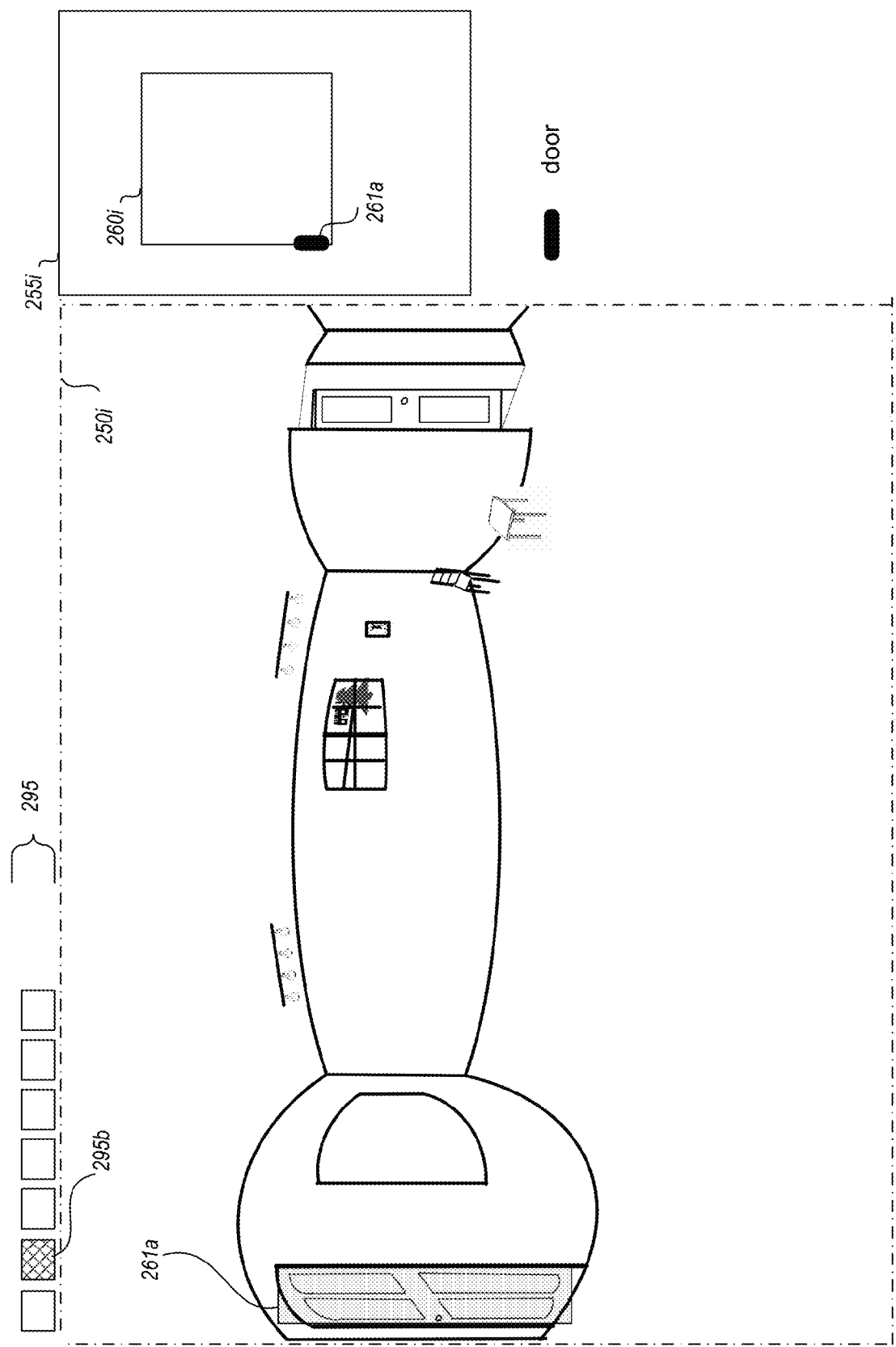

FIG. 2I continues the examples of FIGS. 2A-2H, and illustrates additional user manipulations that may be performed to identify elements of interest in the living room, such as to identify inter-room doors in FIG. 2I (e.g., corresponding to selection of GUI control 295b). In this example, a user-manipulatable visual door representation 261a is overlaid on the panorama image shown in the first GUI pane 250i, and the user manipulates the location of the visual door representation to be placed over the actual door 190-1 shown in the panorama image, optionally modifying the size of the visual door representation (e.g., width and/or height) to match the door size if needed. In some embodiments, the location and size of the visual door representation are fully specified by the user, while in other embodiments the MIGM system may perform automated operations to identify location and/or size of one or more candidate doors in the panorama image (e.g., likely doors based on image analysis, such as using machine learning techniques), and if so the initially displayed visual door representation 261a may use such automatically determined candidate door location and size information for its initial placement. As the user manipulates the visual door representation in the first GUI pane 250i, a corresponding visual door indicator 261a is added to and modified in the room shape 260i shown in the second GUI pane 255i. As with the previously discussed visual border and corner representations, the user may also directly modify the visual door indicator 261a in the second GUI pane 255i (e.g., to modify its size and/or location in the room shape 260i), whether instead of or in addition to modifying the visual door representation 261a in the first GUI pane, and if so the visual door representation 261a in the first GUI pane is modified accordingly.

Figure 2J:
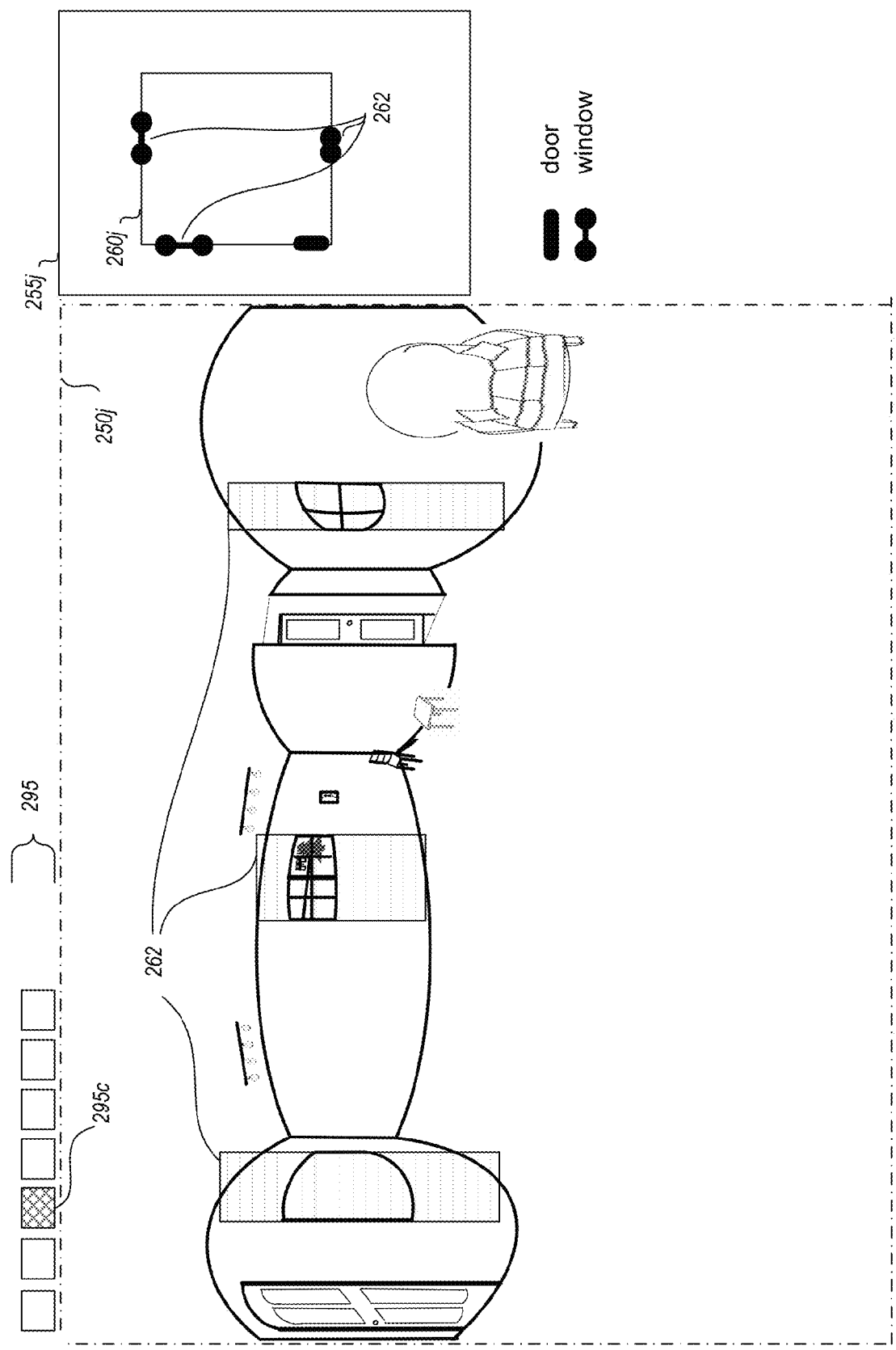

FIG. 2J continues the examples of FIGS. 2A-2I, and illustrates additional user manipulations that may be performed to identify other elements of interest in the living room, such as to identify windows in the room (e.g., corresponding to selection of GUI control 295c). In the example of FIG. 2J, multiple user-manipulatable visual window representations 262 are overlaid on the panorama image shown in the first GUI pane 250j (whether sequentially or simultaneously), and the user manipulates the location of the visual window representations to be placed over the actual windows shown in the image, optionally modifying the size of the visual window representations (e.g., width and/or height) to match the actual window sizes in the room if needed. In some embodiments, the location and size of one or more of the visual window representations are fully specified by the user, while in other embodiments the MIGM system may perform automated operations to identify candidate window location and size in the panorama image (e.g., likely windows based on image analysis, such as using machine learning techniques), and if so the initially displayed visual window representations may use such automatically determined candidate window location and size information for their initial placements. As the user manipulates the visual window representations in the first GUI pane 250j, corresponding visual window indicators 262 are added to and modified in the room shape 260j in the second GUI pane 255j. As with the previously discussed visual door representations, the user may also directly modify the visual window indicators 262 in the second GUI pane 255j (e.g., to modify their size and/or location in the room shape 260*j*), whether instead of or in addition to modifying the visual window representations 262 in the first GUI pane, and if so the visual window representations 262 in the first GUI pane are modified accordingly.

Figure 2K:
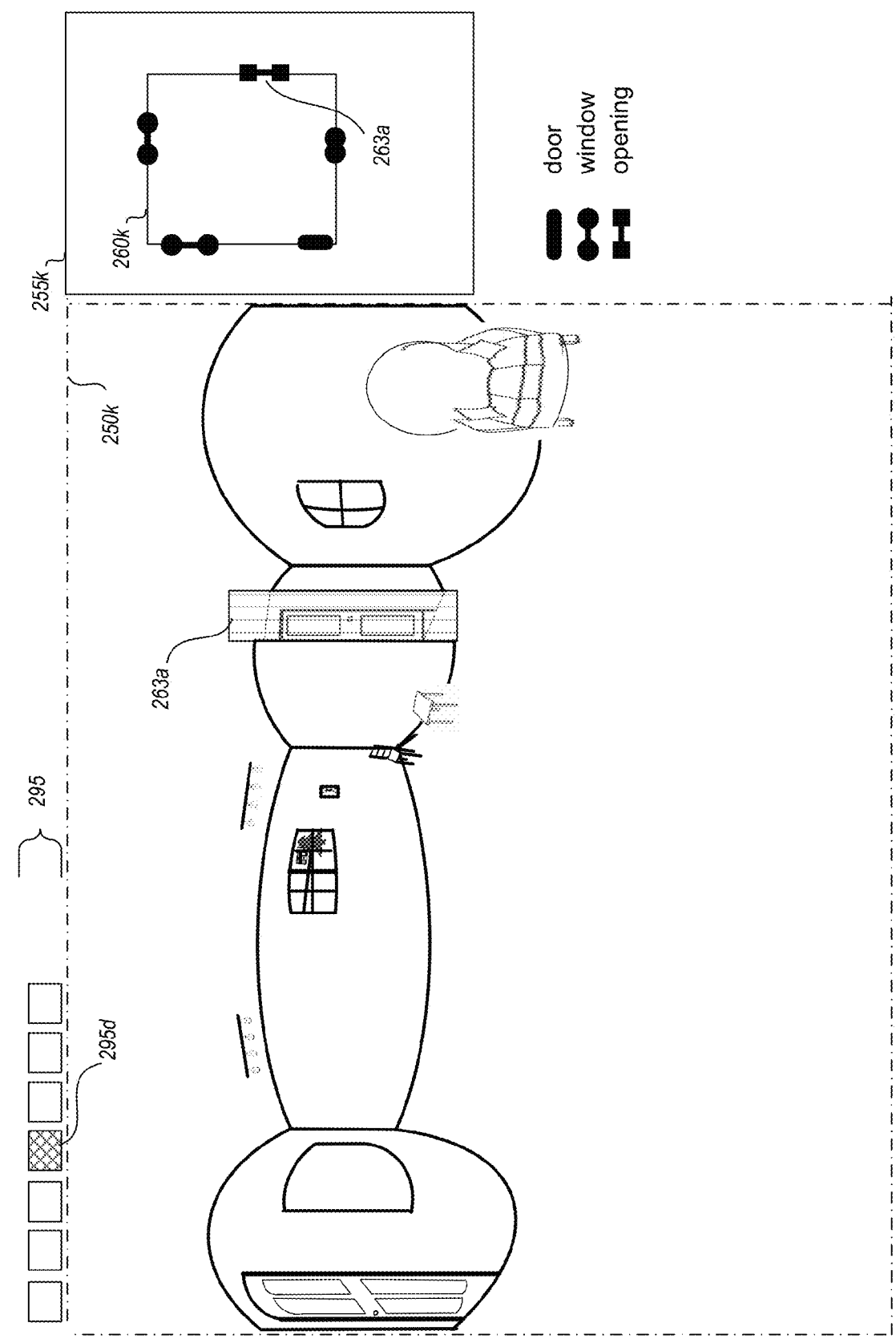

FIG. 2K continues the examples of FIGS. 2A-2J, and illustrates additional user manipulations that may be performed to identify other elements of interest in the living room, such as to identify inter-room openings in or out of the room (e.g., corresponding to selection of GUI control 295*d*). In the example of FIG. 2K, a user-manipulatable visual opening representation 263*a* is overlaid on the panorama image shown in the first GUI pane 250*k*, and the user manipulates the location of the visual opening representation to be placed over the actual opening shown in the image from the living room to the hallway, optionally modifying the size of the visual opening representation (e.g., width and/or height) to match the actual opening size in the room if needed. In some embodiments, the location and size of the visual opening representation is fully specified by the user, while in other embodiments the MIGM system may perform automated operations to identify candidate opening location and size in the panorama image (e.g., likely openings based on image analysis, such as using machine learning techniques), and if so the initially displayed visual opening representation may use such automatically determined candidate opening location and size information for its initial placement. As the user manipulates the visual opening representation in the first GUI pane 250*k*, a corresponding visual opening indicator 263*a* is added to and modified in the room shape 260*k* in the second GUI pane 255*k*. As with the previously discussed visual representations, a user may also directly modify the visual opening indicator 263*a* in the second GUI pane 255*k* (e.g., to modify its size and/or location in the room shape 260*k*), whether instead of or in addition to modifying the visual opening representation 263*a* of the first GUI pane, and if so the visual opening representation 263*a* in the first GUI pane is modified accordingly.

FIG. 2AE continues the examples of FIGS. 2A-2AD, and illustrates additional details about user manipulations that may be performed to identify elements of interest in the living room, such as to identify types of building information that are points of interest ("POIs") and/or to determine information to be subsequently displayed for such POIs (e.g., as part of a corresponding building information display GUI provided by automated operations of a building map viewer system, such as to show various types of information overlaid on a 2D floor map model in a manner similar to that of FIG. 2W, overlaid on a 3D computer model in a manner similar to that of FIG. 2AG, etc.), and optionally corresponding to selection of an additional GUI control (not shown) in a building information determination GUI of the MIGM system that is being displayed to an MIGM system operator user (not shown). In this example, various user-manipulatable POI visual representations 199*a*-199*g* may be overlaid (e.g., sequentially, simultaneously, etc.) on the panorama image 250*ae*, optionally at initial locations and/or with initial shapes that are automatically determined by the MIGM system via automated operations to analyze the visual data of the image 250*ae* and identify potential POIs of one or more types, with the user able to manipulate the locations and/or shapes of the visual representations to be placed over the actual corresponding POIs visible in the image 250*ae* if needed (e.g., if initial locations and/or shapes that are automatically identified by the MIGM system are not exact). In this example, bounding boxes are used to surround the pixels corresponding to a POI, but other manners may be used to specify the pixels of the image corresponding to a particular POI in other embodiments (e.g., by clicking on or otherwise selecting two points at opposing corners of a rectangle shape, by clicking on or otherwise selecting three or more points that form corners of a non-rectangular shape, etc.), including in some embodiments and situations to identify a 2D surface in an image of a 3D object and to have the MIGM system automatically determine a corresponding 3D shape (e.g., for a user to manually specify the top of a kitchen island or a table and have the MIGM system automatically determine a height based on automated analysis of visual data in the image; for a user to manually specify the face of a fireplace or a front vertical surface of a cabinet or piece of furniture and have the MIGM system automatically determine a depth based on automated analysis of visual data in the image; etc.). In the example of FIG. 2AE, the visual representations 199*a*-199*g* for types of building information used as POIs include an outlet 199*a* for one or more types of wiring (in this example, a combined electrical and cable outlet), window 199*b* (e.g., with corresponding user-supplied and/or automated determined annotated information including a view type, such as street, water, mountains, etc.; window type, such as picture window or window that opens via swinging or sliding; etc.), fixed or attached furnishings 199*c* (e.g., window curtains or drapes; carpets or tiles or other floor coverings, optionally with information about color or texture or other attributes; type of wall covering such as wallpaper or paint, optionally with information about color or texture or other attributes; etc.), moveable furnishings 199*d* (e.g., a tapestry on a wall), furniture 199*e* (e.g., built-in furniture, such as a window seat; moveable furniture; etc.), lighting fixture type 199*f*, piping or other conduit information 199*g* (e.g., to correspond to an HVAC air vent), switches for lights and other electrical apparatuses, other control elements for user-manipulatable functionality, etc. As the user specifies some or all of the visual representations, corresponding visual indicators may be added to and modified in a corresponding room shape in a separate displayed area (e.g., a separate GUI pane similar to panes 255*i*-255*k* of FIGS. 2I-2K), not shown in this example, or more generally on a floor map model or other computer model (e.g., a 3D or 2.5D computer model with illustrated height information) for the building (e.g., in a manner similar to that illustrated with respect to FIGS. 2W and 2AG), and if such a separate displayed area is used, the user may also directly modify the corresponding visual indicators in that separate displayed area (e.g., to modify a visual indicator's size and/or location within a room shape or otherwise within a 2D floor map model or other computer model) with corresponding updates shown in a corresponding visual representation 199 overlaid on the image 250*ae*, whether instead of or in addition to directly modifying the corresponding visual representation 199 overlaid on the image 250*ae*.

FIG. 2AF continues the examples of FIGS. 2A-2AE, and illustrates additional details about user manipulations that may be performed to identify elements of interest in the living room, such as to identify POIs that correspond to additional types of structural elements (e.g., types of ceilings, floors, walls, built-in elements, etc.) and/or to determine information to be subsequently displayed for such POIs (e.g., as part of a corresponding building information display GUI provided by automated operations of a building map viewer system, such as to show various types of information overlaid on a 2D floor map model in a manner similar to that of FIG. 2W, overlaid on a 3D computer model in a manner similar to that of FIG. 2AG, etc.), and optionally corresponding to selection of an additional GUI control (not shown) in a building information determination GUI of the MIGM system that is being displayed to an MIGM system operator user (not shown). In this example, an additional user-manipulatable POI visual representation 199*h* may be overlaid on the image 250*af*, optionally at an initial location and/or with an initial shape that are automatically determined by the MIGM system via automated operations to analyze the visual data of the image 250*af* and identify potential POIs of one or more types, with the user able to manipulate the locations and/or shapes of the visual representations to be placed over the actual corresponding POIs visible in the image 250*af* if needed (e.g., if initial locations and/or shapes that are automatically identified by the MIGM system are not exact), such as using bounding boxes or other manners to specify the pixels of the image corresponding to a particular POI (e.g., by clicking on or otherwise selecting two points at opposing corners of a rectangle shape, by clicking on or otherwise selecting three or more points that form corners of a non-rectangular shape, etc.). In the example of FIG. 2AF, the visual representation 199*h* corresponds to identifying a type of ceiling, which in this example is a vaulted ceiling and is identified using one or more planar surfaces corresponding to that ceiling (e.g., multiple piecewise planar surfaces), although in other embodiments may be specified in other manners as discussed elsewhere herein for other types of building information. As the user specifies some or all such additional visual representations, corresponding visual indicators may be added to and modified in a corresponding room shape in a separate displayed area (e.g., a separate GUI pane similar to panes 255*i*-255*k* of FIGS. 2I-2K), not shown in this example, or more generally on a floor map model or other computer model (e.g., a 3D or 2.5D computer model with illustrated height information) for the building (e.g., in a manner similar to that illustrated with respect to FIGS. 2W and 2AG), and if such a separate displayed area is used, the user may also directly modify the corresponding visual indicators in that separate displayed area (e.g., to modify a visual indicator's size and/or location within a room shape or otherwise within a 2D floor map model or other computer model) with corresponding updates shown in a corresponding visual representation 199 overlaid on the image 250*af*, whether instead of or in addition to directly modifying the corresponding visual representation 199 overlaid on the image 250*af*. It will be appreciated that various other types of building information may be determined in other situations not illustrated with respect to FIGS. 2I-2K and 2AE-2AF, including for other types of rooms such as bathrooms (e.g., sinks/bathtubs/showers and associated types of plumbing fixtures, floor type, counter type, types of lighting fixtures, etc.), kitchens (e.g., sinks and associated types of plumbing fixtures, floor type, counter type, cabinet types, types of lighting fixtures, kitchen islands and/or other build-ins, appliances, etc.), utility rooms (e.g., sinks and associated types of plumbing fixtures, floor type, counter type, types of lighting fixtures, appliances, etc.), etc., as discussed in greater detail elsewhere herein.

Figure 2L:
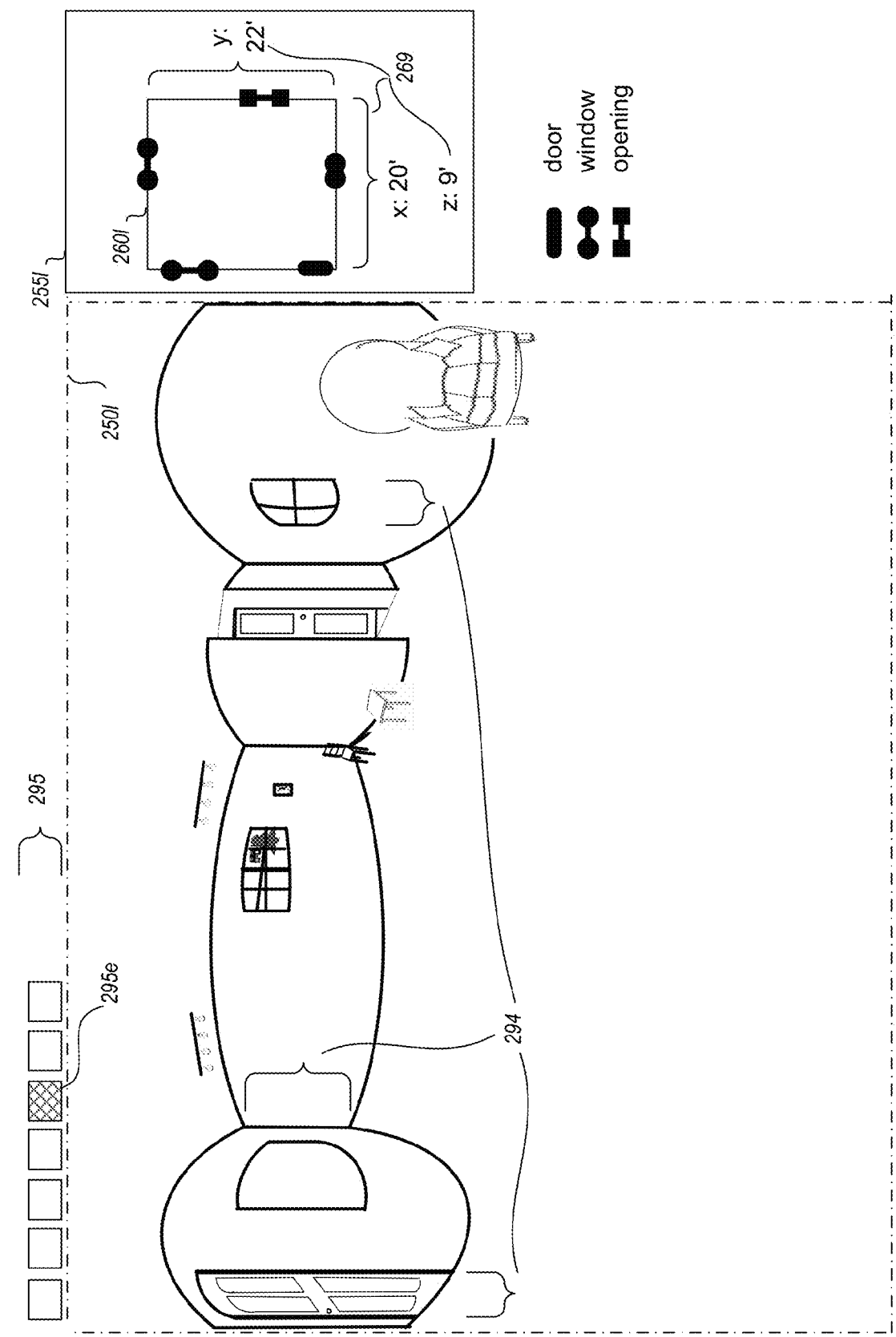

FIG. 2L continues the examples of FIGS. 2A-2K, and illustrates additional user manipulations that may be performed to identify other information of interest in the living room, such as to identify dimension information for the room (e.g., corresponding to selection of GUI control 295*e*). In the example of FIG. 2L, one or more user-manipulatable visual dimension representations 294 are overlaid on the panorama image shown in the first GUI pane 250*l*, and the user manipulates the location and size of the visual dimension representations to correspond to features of the room that have known or likely sizes, such as the width of a door or window, the height of a door or wall, etc., although it will be appreciated that other types of elements may be used for size information in other embodiments. For example, in at least some embodiments, one or more objects of known size are added to one or more images captured in one or more rooms (e.g., a piece of 8½×11 inch paper laid on a floor of a room; a smart phone with a known pattern visible on its screen, such as a particular model of an iPhone smart phone; etc.), and the additional user manipulations involve identifying one or more aspects of the known-size object(s) (e.g., a location and size of the diagonal of the paper; the pattern on the smart phone screen, along with a determination or other identification of the particular smart phone model in order to retrieve the size of the screen on which the pattern is displayed; etc.), whether in addition to or instead of identifying the location and size of other aspects of the room that were not added for that purpose—such additional user manipulations may include, for example, drawing or placing a line along the diagonal of the paper, or otherwise specifying the portion(s) of the image that correspond to the one or more aspects of the known-size object(s) displayed in the image. In such embodiments, the identifying of the location and size of the known-size object(s) may be further used to determine a camera height for the camera used to capture that image (and thus the camera height for all images if they all use the same camera height). In addition, in some embodiments, dimension information for room features and/or added known-size object(s) is fully specified by the user, while in other embodiments the MIGM system may perform automated operations to identify candidate dimension information for the panorama image (e.g., likely dimensions from image analysis, such as using machine learning), and if so the initially displayed visual dimension representations may use such automatically determined candidate dimension information for their initial placements and sizes. In the example of FIG. 2L, as the user manipulates the visual dimension representations in the first GUI pane 250*l*, corresponding dimension information 269 is added to and modified for the room shape 260*l* in the second GUI pane 255*l*, such as to specify overall dimensions of the room. As with the previously discussed visual representations, a user may also directly modify the dimension information 269 in the second GUI pane 255*l*, whether instead of or in addition to modifying the visual dimension representations 294 of the first GUI pane.

FIG. 2M continues the examples of FIGS. 2A-2L, and illustrates additional user manipulations that may be performed in the GUI to identify other information of interest for the living room, such as to determine the position within the room from which an image was taken (e.g., corresponding to selection of GUI control 295*f*). In the example of FIG. 2M, a perspective image is shown in a third GUI pane 250*m*, with three user-manipulatable visual vertical representations 246*a*-246*c* shown, and with two user-manipulatable visual horizontal representations 247*a* and 247*b* shown. The user manipulates the location of the visual vertical and horizontal representations to correspond to identifiable locations in the living room for vertical and horizontal surfaces, respectively, such as to position the visual vertical representations in the northeast and northwest corners and at the left edge of the windows 196-1, and to position the visual horizontal representations along the north wall and the west wall of the room along surfaces known or believed to be horizontal (e.g., bottoms or tops of windows or doors). As the user manipulates the visual vertical and horizontal representations in the first pane, corresponding visual indicators are added to and modified for the room shape 260m of the fourth GUI pane 255m, such as to show the corresponding locations and features in the room shape for those visual representations in the first GUI pane. As with other previously discussed visual representations, a user may also directly modify the visual indicators in the room shape 260m of the second pane 255m, whether instead of or in addition to modifying the visual representations in the first GUI pane.

In the illustrated example of FIG. 2M, an additional 360° spherical panorama image 245m is also displayed for the purpose of explanation (e.g., for potential display in the third GUI pane 250m, such as before or after display of the perspective image), although in some embodiments only a single image may be shown at one time while doing image position determination. In this example, the panorama image is able to be manipulated by the user in a similar manner to that of the perspective image, including to position three user-manipulatable visual vertical representations 244 in the panorama image. However, the horizontal representations used for the perspective image are not used for the panorama image, since the distance from the image's viewing location to the walls may be determined based at least in part on the size of the walls and their amount of curvature, rather than on the degree of the angle between the visual horizontal representations on adjacent walls in the perspective image. While a fourth GUI pane with a corresponding room shape is not shown for the panorama image, it will be appreciated that if the panorama image is shown in the third GUI pane in place of the perspective image, the room shape information in the fourth GUI pane will correspond to the panorama image and will be manipulated in a similar manner to that described for the perspective image. In other embodiments, other types of user manipulations may be performed to determine the position of an image's viewing location. In addition, in some embodiments, the MIGM system may perform automated operations to determine a candidate position of an image's viewing location (e.g., a likely position based on analysis of features in image, such as using machine learning techniques), and if so the determined candidate viewing location position may instead be used for initial placement of visual vertical and/or horizontal representations.

Figure 2N:
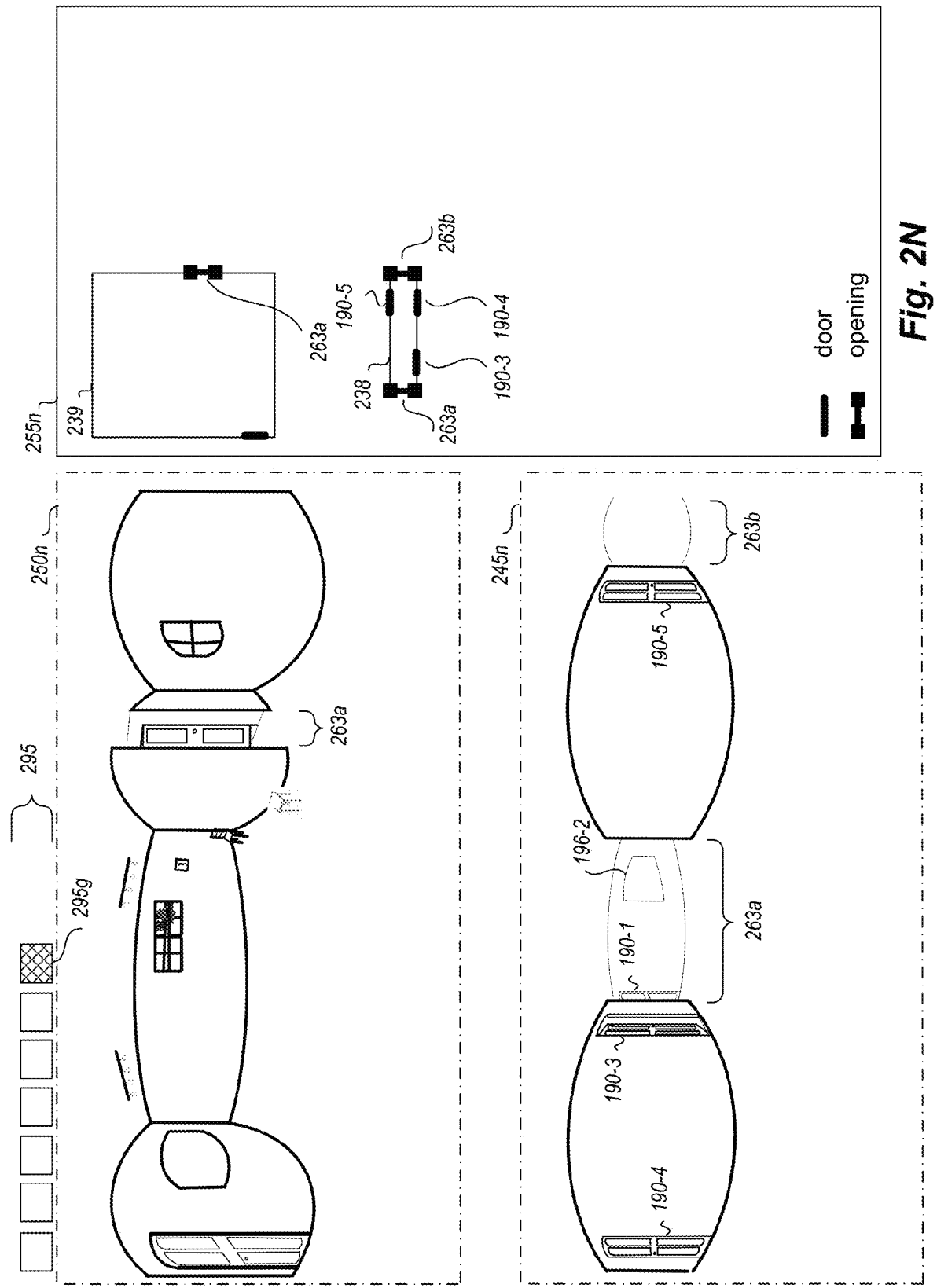

FIGS. 2N-2Q illustrate further user manipulations to specify layout information for multiple room shapes (e.g., corresponding to selection of GUI control 295g), such as after the room shape determination process has been performed for all of the rooms of the house 198. In particular, FIG. 2N continues the examples of FIGS. 2A-2M, and includes two image display panes (a fifth GUI pane 250n, and a sixth GUI pane 245n), and a corresponding seventh GUI pane 255n with room shape layout information. In the example of FIG. 2N, the fifth GUI pane displays the 360° spherical panorama image for the living room, while the sixth GUI pane displays a 360° spherical panorama image for the hallway connected to the living room (as well as to other rooms, as shown in FIG. 1B). In this example, the living room and hallway share an inter-room opening 263a, with that opening being identified for reference purposes in the living room in the fifth GUI pane and in the hallway in the sixth GUI pane, and to be subsequently inter-connected by the user as being part of the same opening. The seventh GUI pane shows room shapes 239 and 238 corresponding to the living room and hallway, respectively, with information about inter-room doors and openings as previously specified for the living room and hallway during the room shape determination process—since information to specify the room layout has not yet been specified by the user, the two room shapes are shown separately from each other.

Figure 2O:
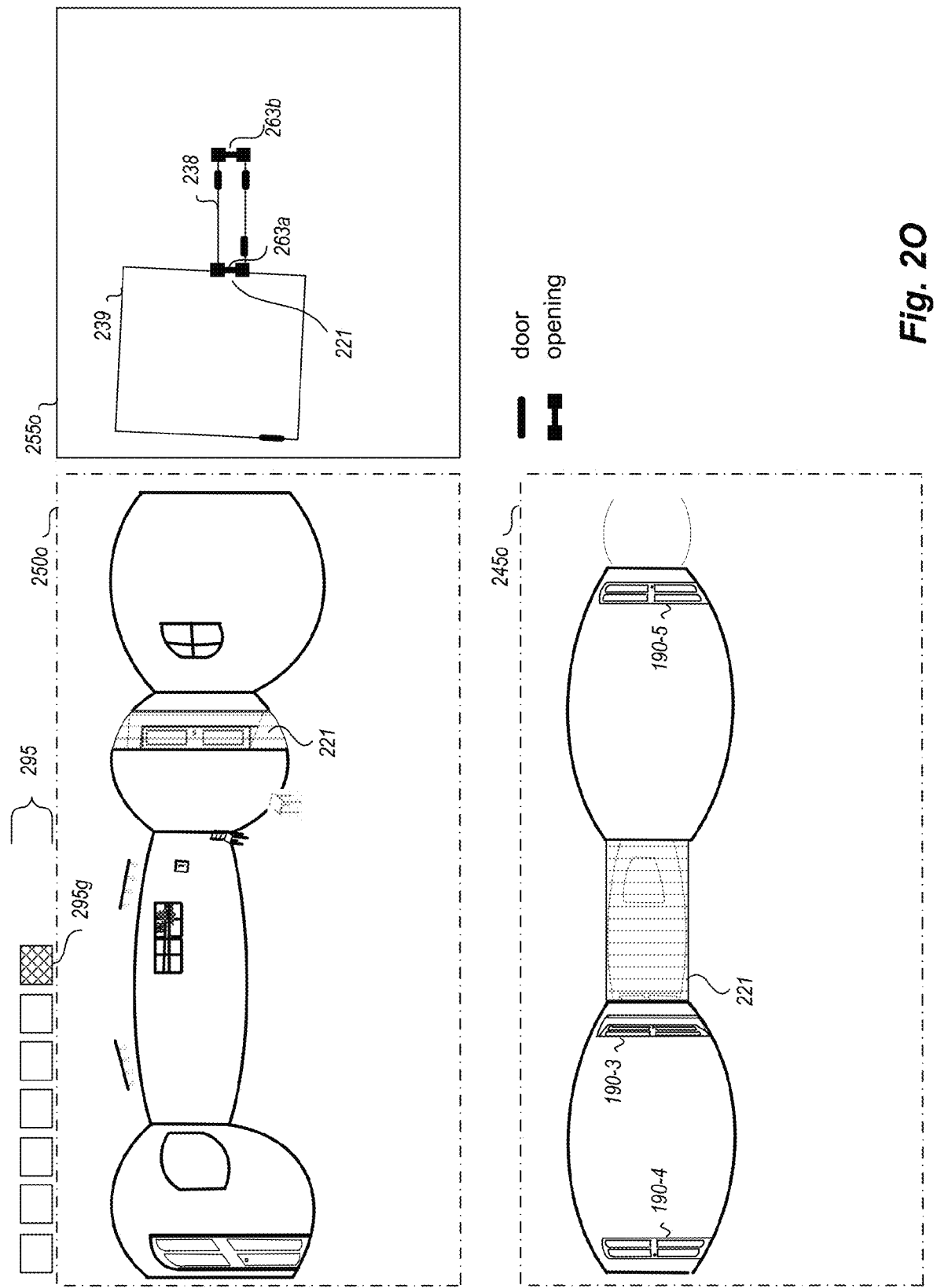

FIG. 2O continues the examples of FIGS. 2A-2N, and illustrates additional user manipulations that may be performed in the GUI to specify relative room layout information for the two rooms. In particular, user-manipulatable matching visual opening representations 221 are displayed on both panorama images in the fifth and sixth GUI portions of FIG. 2O, and the user proceeds to associate those opening representations 221 to the inter-room passage 263a illustrated in FIG. 2N. As the size and location of the openings may have previously been specified for the living room and hallway during the room shape determination process, the user may not need to manipulate the visual representations 221 in FIG. 2O, but is able to do so as needed. As the user specifies the connection between the openings in the living room and the hallway as being the same inter-room passage, the locations of the corresponding room shapes 239 and 238 are adjusted in the seventh GUI pane 255o to be connected at the locations of that inter-room passage, with the room shapes being rotated and/or moved as needed to connect those locations in the two rooms. As illustrated in the example of the seventh GUI pane of FIG. 2O, however, the initial relative layout of the room shapes may not be precisely aligned at first, such as with room shape 239 being at a slight angle relative to that of room 238 (e.g., due to imperfections in the locations and/or connections of the inter-room openings). While such layout problems may be immediately adjusted by the user and/or by the MIGM system in an automated manner (e.g., by applying layout constraints and/or optimizations, such as that room shapes connect at parallel walls) in some embodiments and situations, the alignments of the various rooms may also be later adjusted as additional rooms are incrementally added to the overall room layout for the house, as illustrated further with respect to FIG. 2P.

In particular, FIG. 2P continues the examples of FIGS. 2A-2O, and again illustrates the 360° spherical panorama image for the hallway (although this time in the fifth GUI pane 250p)—however, the sixth GUI pane 245p in this example newly illustrates the 360° spherical panorama image for an additional bedroom on the south side of the house that connects to the hallway via door 190-3, in order to specify the layout between the hallway and the additional bedroom. In addition, the seventh GUI pane 255p has been updated to show, in addition to the previous layout of the connected room shapes for the living room and hallway, an additional room shape 237 for the additional bedroom, with the information in the seventh GUI pane corresponding to after the user has made an initial connection between the hallway and the additional bedroom via the door 190-3—however, the incorrect alignment of the room shapes for the living room and the hallway continue to be present in the seventh GUI pane. In particular, the user has already used displayed user-manipulatable visual door representations 222 in the two panorama images to connect the door 190-3 in both images as being part of the same inter-room passage between the hallway and the additional bedroom, with the room shapes in the seventh GUI pane having been updated accordingly. However, in this example the user has made an imprecise specification of the visual representation 222 in the panorama image for the additional bedroom shown in the sixth GUI pane 245p, with the visual representation 222 being at the west edge of the additional bedroom, and causing the location 222 of the door 190-3 to be incorrect for the room shape 237 in the seventh GUI portion 255p, resulting in the room shape 237 in the seventh GUI pane 255p being separated from the living room by a distance that is greater than what is actually present in the house 198.

Automated and/or manual corrections may be made to the incorrect visual representation 222 placement in the panorama image of the additional bedroom and/or the incorrect alignment of the room shapes for the living room and hallway. In this example, a subsequently modified version 256p of the room layout information is shown in which adjustments have been made to correct both the incorrect initial mapping location of the door 190-3 and the previous imprecise alignment of the living room relative to the hallway—however, it will be appreciated that both information 255p and 256p may not be shown simultaneously in at least some embodiments (e.g., instead in a serial manner as the adjustments are made), although both versions are shown in the example for the sake of explanation. Such adjustments to correct the initial imprecisions may be made manually by the user via the GUI in at least some embodiments and situations (e.g., adjusting the visual representation 222 placement in the panorama image of the additional bedroom, adjusting the hallway opening information for the living room and/or hallway, etc.), while in other embodiments and situations the MIGM system may instead perform automated operations to correct the alignment of the three room shapes relative to each other. While not illustrated in these examples, the additional rooms of the house 198 may similarly be incrementally added to the combination of room shape layouts, to produce an initial specification of the layout of all of the rooms.

Figure 2Q:
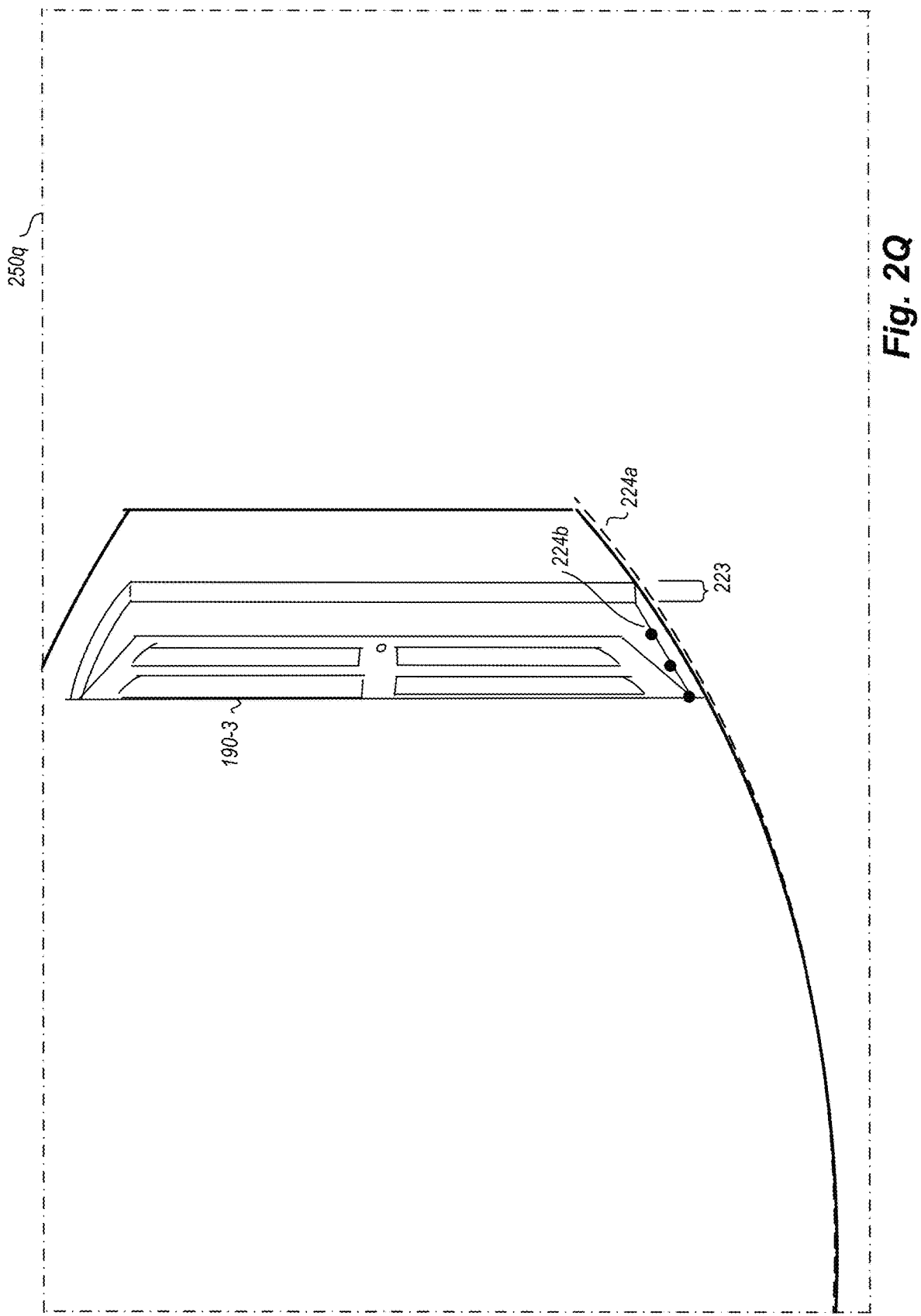

FIG. 2Q continues the examples of FIGS. 2A-2P, and in particular illustrates one manner for the user to more precisely specify connection information between two rooms for a doorway or opening. In particular, FIG. 2Q illustrates an enlarged portion 250q of the 360° spherical panorama image for the hallway, with the door 190-3 being shown in additional detail. In this example, additional information is specified to represent the doorway from both the side of the hallway 244a and the side of the room 224b, with the difference 223 corresponding to the width (or thickness) of the wall in this example. In particular, the user may manipulate visual representations 224a and 224b of the door (and of additional portions of the hallway and additional bedroom, not shown) to match the room borders for the hallway and for the additional bedroom in this image, and such wall width information may be further used in the room layout information to specify a corresponding width of the walls between the hallway and the additional bedroom. Similar information can be specified for other doors and inter-room openings, with corresponding wall width being determined and also used in a similar manner for the combination of room shape layouts.

Figure 2R:
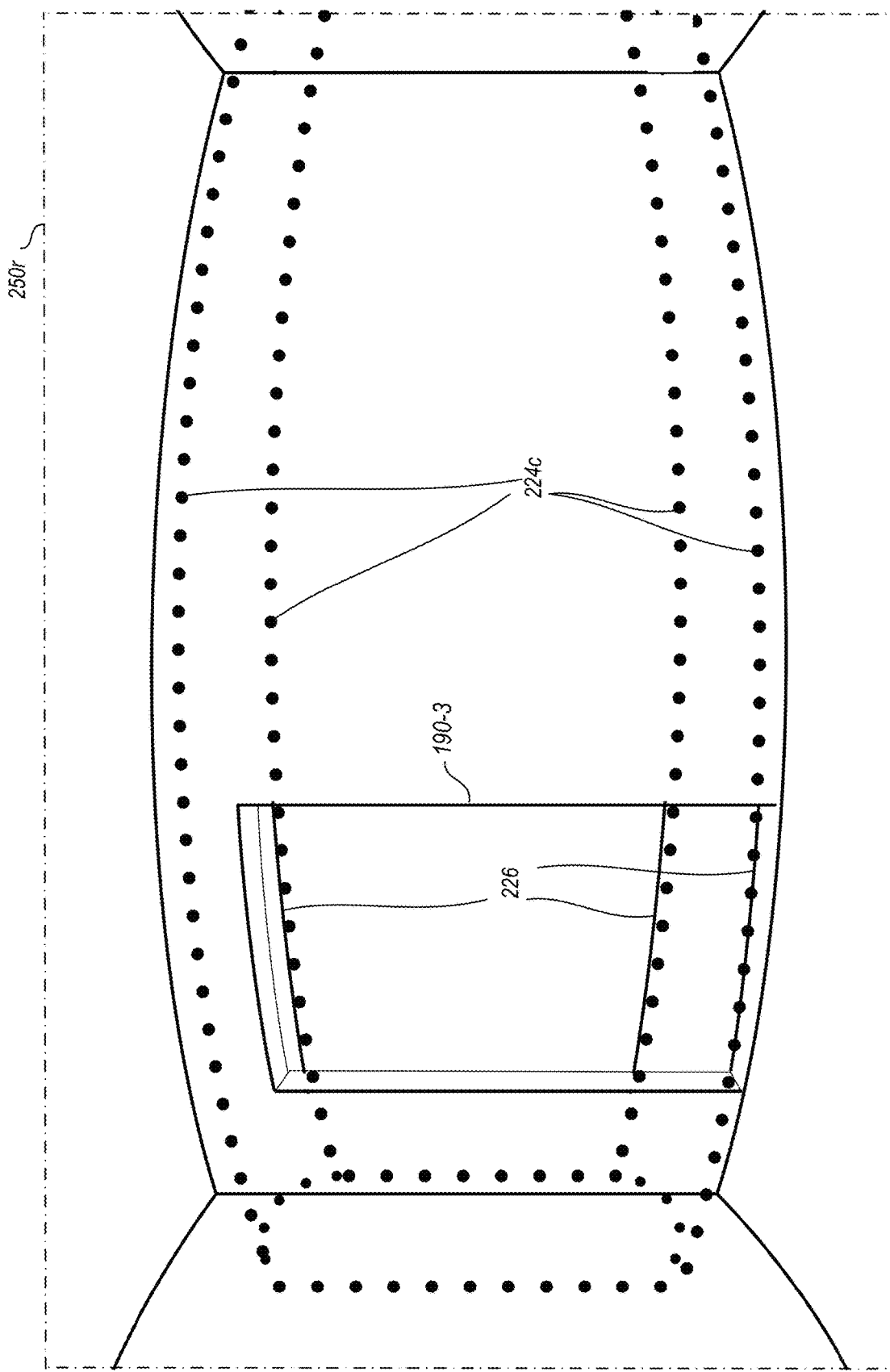

FIG. 2R continues the examples of FIGS. 2A-2Q, and in particular illustrates one manner for the user to more precisely specify inter-room connection information for a doorway or opening between two rooms, such as to determine relative placement of two or more rooms and the width (or thickness) of wall(s) between them. In particular, FIG. 2R illustrates an enlarged portion 250r of the 360° spherical panorama image for the additional bedroom previously illustrated in pane 245p of FIG. 2P, but with the door 190-3 being removed to provide further clarity, and a portion of the hallway being present through the doorway from the additional bedroom (including wall-to-floor and wall-to ceiling borders 226 on the north side of the hallway). In this example, as part of specifying the border for the adjacent room (in this example, the hallway) in a manner similar to that shown in FIG. 2Q with respect to border 224b, an outline 224c of the adjacent room (e.g., a 3D outline or mesh or point cloud, such as when overlaid on an image or on a 3D visual representation of a 3D computer model; a 2D outline, such as when overlaid on a 2D floor map; etc.) is shown (e.g., all parts of the adjacent room that would be visible in portion 250r of the image if the walls of the additional bedroom were not present), and the user may manipulate the visual representations 224c of the adjacent room to match the borders 226 of the hallway that are visible, in order to determine a more precise fit. In a manner similar to FIG. 2Q, wall width information may be further determined and used, but is not illustrated in this example. In addition, in at least some embodiments and situations, once a width (or thickness) of a doorway and/or wall has been determined for one or more rooms of a building (e.g., in a manner similar to that discussed with respect to FIGS. 2Q and 2R), in some embodiments the MIGM system will further use such determined width/thickness as a default for some or all other doorways and/or walls in the building (e.g., in a manner that is modifiable by the user as appropriate for specific doorway/wall situations that differ from that default), such as when initially positioning an outline of one room relative to another room.

After all of the room shape layout information has been specified and any such wall width information has been determined, the final results may be used to generate a 2D floor map of the house, optionally after final optimizations have been performed and visual aspects of the final floor map have been added—such final optimizations may include, for example, one or more of ensuring consistent visual aspects (e.g., line widths, colors, text styles, etc.), placing textual room labels at preferred locations on the final floor map, adding missing spaces such as small closets or other additional areas not included on the defined room shape layouts (e.g., areas that did not have any images taken from within them, resulting in empty spaces within an exterior of the building that are not identified in the defined room shape layouts, such as closets, cabinets, pantries, fireplaces, staircases, enclosed areas with ductwork and/or piping and/or wiring and/or cabling and other inaccessible areas, etc.), merging multiple overlapping and/or adjacent walls, correcting any geometric anomalies, etc. For example, determination of such missing spaces may occur as part of the process of combining multiple partial room shapes for a room into an overall room shape and/or the process of adding additional room shapes relative to positions of one or more other room shapes, such as discussed with respect to FIGS. 2X-2AF and elsewhere herein, including in some such embodiments for a human annotator user to use other existing walls to explicitly model such spaces. In at least some embodiments, the described techniques may include performing at least some such updates in an automated manner, and then providing corresponding GUI tools for one or more users to make final manual adjustments (e.g., GUI tools similar to those of a drawing or painting program) to a floor map for the house that is generated. FIG. 2W illustrates one example 230 of such a final 2D floor map for the house 198, such as may be presented to an MIGM system operator user and/or end user in a GUI 255w (e.g., a building information determination GUI provided by automated operations of the MIGM system, a building information display GUI provided by a building map viewer system, etc.), and with various types of information being added to the combination of room shape layouts—it will be appreciated that a 3D or 2.5D floor plan showing wall height information may be similarly generated in some embodiments, whether in addition to or instead of such a 2D floor map. In this example, room labels have been added to some or all rooms (e.g., "living room" for the living room), room dimensions have been added for some or all rooms, visual indications of fixtures or appliances or other built-in features have been added for some or all rooms, visual indications of positions of additional types of associated and linked information have been added (e.g., of panorama images and/or perspective images that an end user may select for further display, of audio annotations and/or sound recordings that an end user may select for further presentation, etc.), visual indications of doors and windows may be shown, etc.—in addition, in at least some embodiments and situations, some or all such types of information may be provided by one or more MIGM system operator users (e.g., to receive textual room labels from those users), such as during activities described with respect to FIGS. 2E-2U or instead at other times. In addition, in this example a user-selectable control 228 is added to indicate a current floor that is displayed for the floor map, and to allow the end user to select a different floor to be displayed—in some embodiments, a change in floors or other levels may also be made directly from the floor map, such as via selection of a connecting passage such as the stairs to floor 2 in the illustrated floor map. It will be appreciated that a variety of other types of information may be added in some embodiments, that some of the illustrated types of information may not be provided in some embodiments, that visual indications of and user selections of linked and associated information may be displayed and selected in other manners in other embodiments, that other types of user-selectable information and other user-selectable controls may be provided in other manners in other embodiments, etc.

FIG. 2AG continues the examples of FIGS. 2A-2AF, and illustrates an example of a GUI (e.g., a building information determination GUI provided by automated operations of the MIGM system, a building information display GUI provided by automated operations of a building map viewer system, etc.) that includes information corresponding to selection of control 202ag by a user (not shown). In this example, the control 202ag is a slider that controls what types of information about infrastructure are overlaid on information displayed in one or more panes or other areas of the GUI, such as with respect to wiring of one or more types, piping or other conduits, etc., and such as may be further specified using a user-selectable 'settings' control and/or based on previously selected or otherwise specified information (e.g., user preferences)—in other embodiments, one or more toggle controls may instead be used to turn on or off the display of information about one or more types of infrastructure POIs (or other types of building information displayed as POIs). In this example, a single GUI pane or other areas is shown with information about the building, which in this example is a 3D computer model of the main floor (or "Floor 1") of the house 198, and the use of the control causes types of building information discussed with respect to FIG. 2P to be displayed, including a visual indicator 233ag corresponding to an air vent and a visual indicator 232ag corresponding to an electrical outlet. It will be appreciated that the selected type(s) of infrastructure may be displayed throughout the portions of the house currently shown in the GUI based on analysis of visual data of corresponding images, including to be overlaid on other types of underlying information (e.g., on images, interactive tours, 3D computer models, 2D floor map models, etc.), and in some cases may be displayed with a user-selectable visual indicator to enable a particular POI to be selected to cause additional information to be displayed (e.g., one or more images from which the information for the POI was determined, additional types of information about the type of infrastructure corresponding to a selected POI, etc.). The illustrated building information of FIG. 2AG further includes other types of information in addition to that shown in FIG. 2W with respect to its displayed 2D floor map, including heights of walls (and optionally with the walls including visual representations of the actual walls, such as texture-mapped images of the walls displayed on the walls in the 3D computer model, or otherwise colors and/or textures corresponding to the actual walls), information about areas external to the house (e.g., for deck 118), a visual indication 234ag of a ceiling type for the living room (e.g., a vaulted ceiling, such as may be determined in a manner discussed with respect to FIG. 2AF, etc.). It will be appreciated that a variety of other types of information may be added in some embodiments, that some of the illustrated types of information may not be provided in some embodiments, that visual indications of and user selections of linked and associated information may be displayed and selected in other manners in other embodiments, that other types of user-selectable information and other user-selectable controls may be provided in other manners in other embodiments, etc.

Figure 2S:
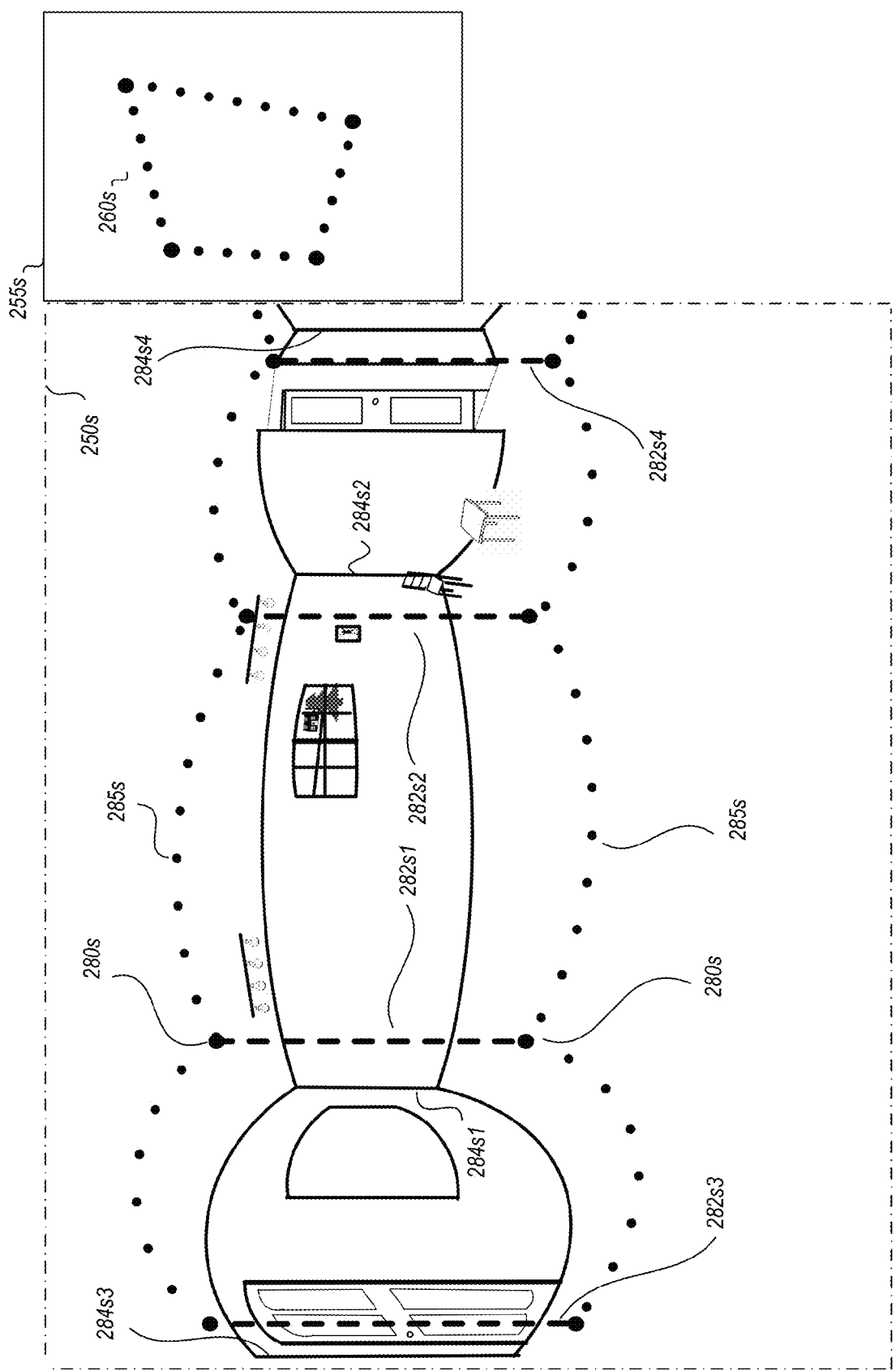
Figure 2T:
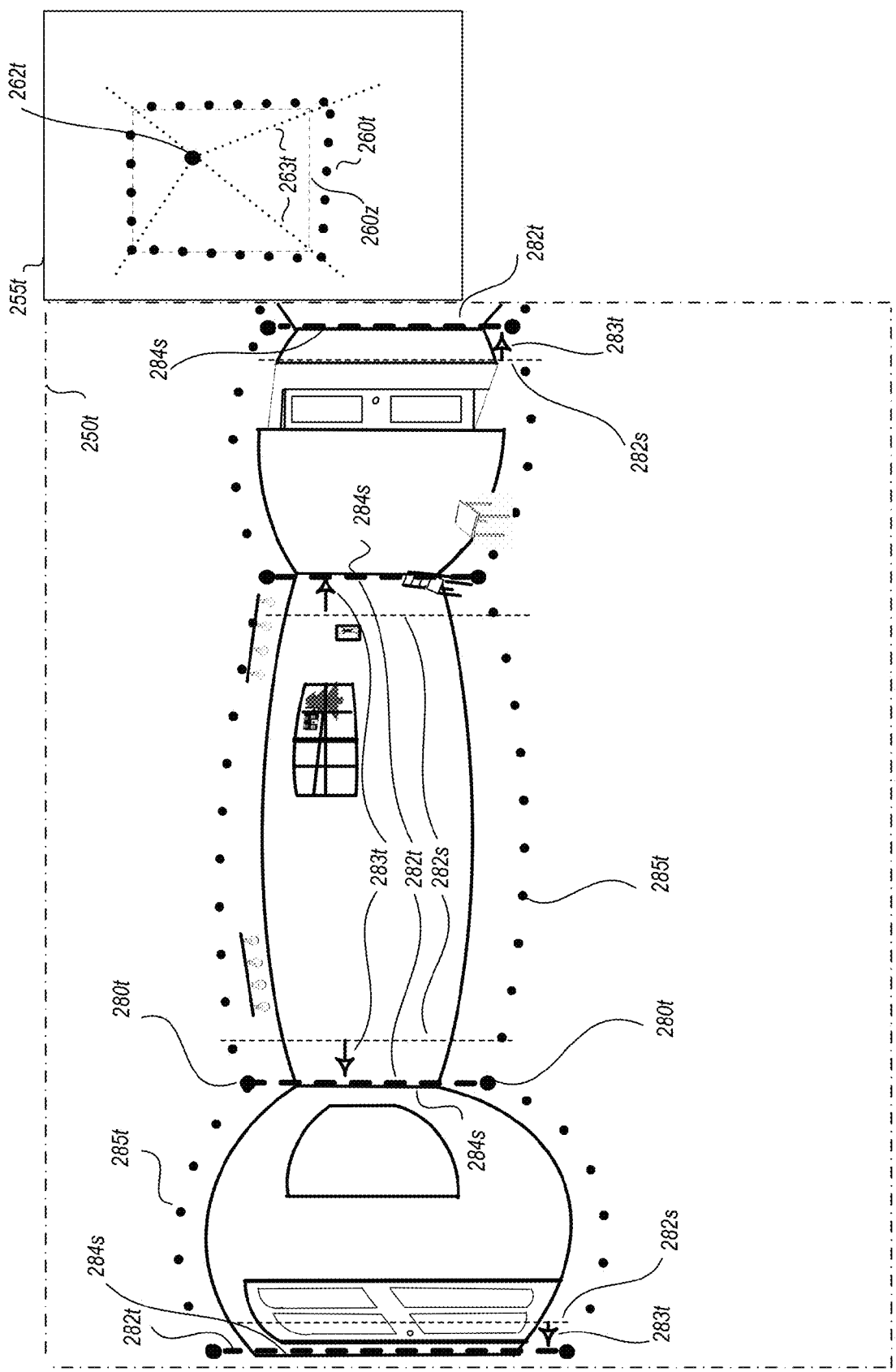

FIGS. 2S and 2T continue the examples of FIGS. 2A-2R, and illustrate an alternative embodiment of user-manipulatable visual border and corner GUI controls as shown in FIGS. 2E-2H. In particular, in the example of FIG. 2S, the displayed user-manipulatable GUI controls in the first GUI pane 250s include not only visual wall-to-floor and wall-to-ceiling border controls 285s and visual corner controls 280s in a manner similar to that of FIG. 2E, but also include additional user-manipulatable inter-wall border controls 282s not shown in FIG. 2E, such as control 282s1 corresponding to inter-wall border 284s1, control 282s2 corresponding to inter-wall border 284s2, and other controls 282s3-s4 corresponding to other displayed inter-wall borders 284s3-s4, respectively. As in FIGS. 2E-2H, a second GUI pane 255s is shown with an initial room shape 260s corresponding to the visual border and corner GUI controls 280, 282 and 285 in the first GUI pane, such that changes to the room shape in the second GUI pane or to the visual border and corner GUI controls 280, 282 and 285 in the first GUI pane cause corresponding changes in the other pane. Some of the details of FIG. 2E are not included again in FIG. 2S for the sake of brevity, such as the GUI controls 295.

FIG. 2T illustrates further initial user manipulations 283t that are performed in this example embodiment to move the displayed inter-wall border controls 282 to be co-located or otherwise overlapping with the corresponding inter-wall borders 284s in the displayed image of the room in pane 250t, such as before manipulating border and corner controls 280 and 285, and by dragging the inter-wall border controls from their initial positions 282s of FIG. 2S to the new user-specified positions 282t of FIG. 2T—in this example, the initial pre-manipulation positions 282s of the displayed inter-wall border controls are shown in FIG. 2T using non-bold dashed lines for the sake of reference, but may not otherwise be visible to the user(s) using the GUI once the displayed inter-wall border controls are manipulated. By adjusting the displayed inter-wall border controls 282 in the illustrated manner, a corresponding resulting room shape 260t in the pane 255t of FIG. 2T is modified, such as in this example to have a modified room shape that is closer to an actual rectangular shape of the illustrated room—additional subsequent manipulations (not shown here) of displayed user-manipulatable wall-to-floor and wall-to-ceiling border controls 285t and corner controls 280t may be used to further refine the fit of the border and corner controls to the actual borders and corners in the room in a manner similar to that of FIGS. 2F-2H.

As discussed with respect to FIG. 2H and also illustrated in FIG. 2T, a room shape for the illustrated room that results from the user manipulations of the displayed border and corner controls 280, 282 and 285 may not be a perfect fit to the actual shape of the room, such as due to minor variations in locations of manipulated border and corner controls relative to the actual corresponding borders and corners in the image. Accordingly, in at least some embodiments, one or more room shape optimizations may be performed in at least some embodiments after those user manipulations for the room are completed, such as to modify room shape 260t to a final optimized room shape 260z in the example of FIG. 2T. Such an optimization process may, in at least some embodiments, include determining if each of the inter-wall connections/corners in the room shape 260 are within a threshold amount of 90° (e.g., within a specified fraction of a degree or 1° or 5° or 10° or 15° or 20° or 25° or 30°, etc.), and if so adjusting each such inter-wall connection/corner to be 90°, resulting in a rectangular room shape if the room has 4 corners. As part of such an adjustment, in order to determine which wall position(s) and/or orientation(s) are to be moved for the room shape optimization process, an assumption may be employed that the inter-wall border locations 282t specified by the user(s) are correct, with pane 255t of FIG. 2T further illustrating a capture location 262t within the room from which the image shown in pane 250t was taken, and lines 263t shown corresponding to the angles from that capture location to the inter-wall border locations 282t as specified by the user(s)—while information 262t and 263t is shown in this example for the sake of understanding, in other embodiments such information may not be displayed to the user(s). Given this assumption, and using a resulting combination of a constraint of 90° for each of the inter-wall borders/corners (for this example room) and a constraint of each inter-wall border being along one of the lines 263t, the final rectangular shape 260z may be determined that satisfies those constraints and best matches lengths of walls between inter-wall border locations 282t. As discussed elsewhere, a modification to the displayed room shape in the pane 255t may cause corresponding changes in pane 250t to the wall-to-ceiling borders and/or the wall-to-floor borders and/or the corners, although such further modifications to the displayed controls 280 and 285 in pane 250t corresponding to optimized final room shape 260z are not illustrated in this example. In one non-exclusive example embodiment, the room shape optimization process is modeled as a non-linear least squares optimization that enforces the following constraints.

Optimize the delta of each depth d from the image capture location to the inter-wall border locations, i.e. the new depths are (1+d) for each unknown depth d:
The initial position of each vertex is achieved at d=0 lower-bound constraints d>−1 are added, so that the room shape does not flip over.

Optimize the depth of each corner within the threshold amount of 90° (referred to at times herein as a 'Manhattan corner') so that those angles become 90 degrees (with the resulting vertices values referred to as the 'M' set of Manhattan corners below)

Fix all non-Manhattan corners, i.e. introduce hard constraints on the depth of oblique corners that are not within the threshold amount of 90° (with the resulting values referred to as the 'VM' set below, corresponding to the set of all vertices V minus the set of M Manhattan vertices—the second term in the equation below adds fixed constraints for all non-Manhattan corners, i.e. we want to keep the original positions)

Add small L2 weight decay on the unknown depths, i.e. prefer simpler solutions that don't move the shape too much—the third term in the equation below adds this regularization Use 'dot' in the equation below to be a dot product that also normalizes its input vectors Use hundreds of iterations of the Levenberg-Marquardt algorithm to optimize the objectives, based on the following equation.

$$\Sigma_{i \in M} dot((1+d_i)*v_i - (1+d_{i-1})*v_{i-1}, (1+d_{i+1})*v_{i+1} - (1+d_i)*v_i)^2 + \Sigma_{i \in V \setminus M} 100*d_i^2 + \Sigma_{i \in M} 0.01*d_i^2, s.t. d_i > -1$$

Figure 2U:
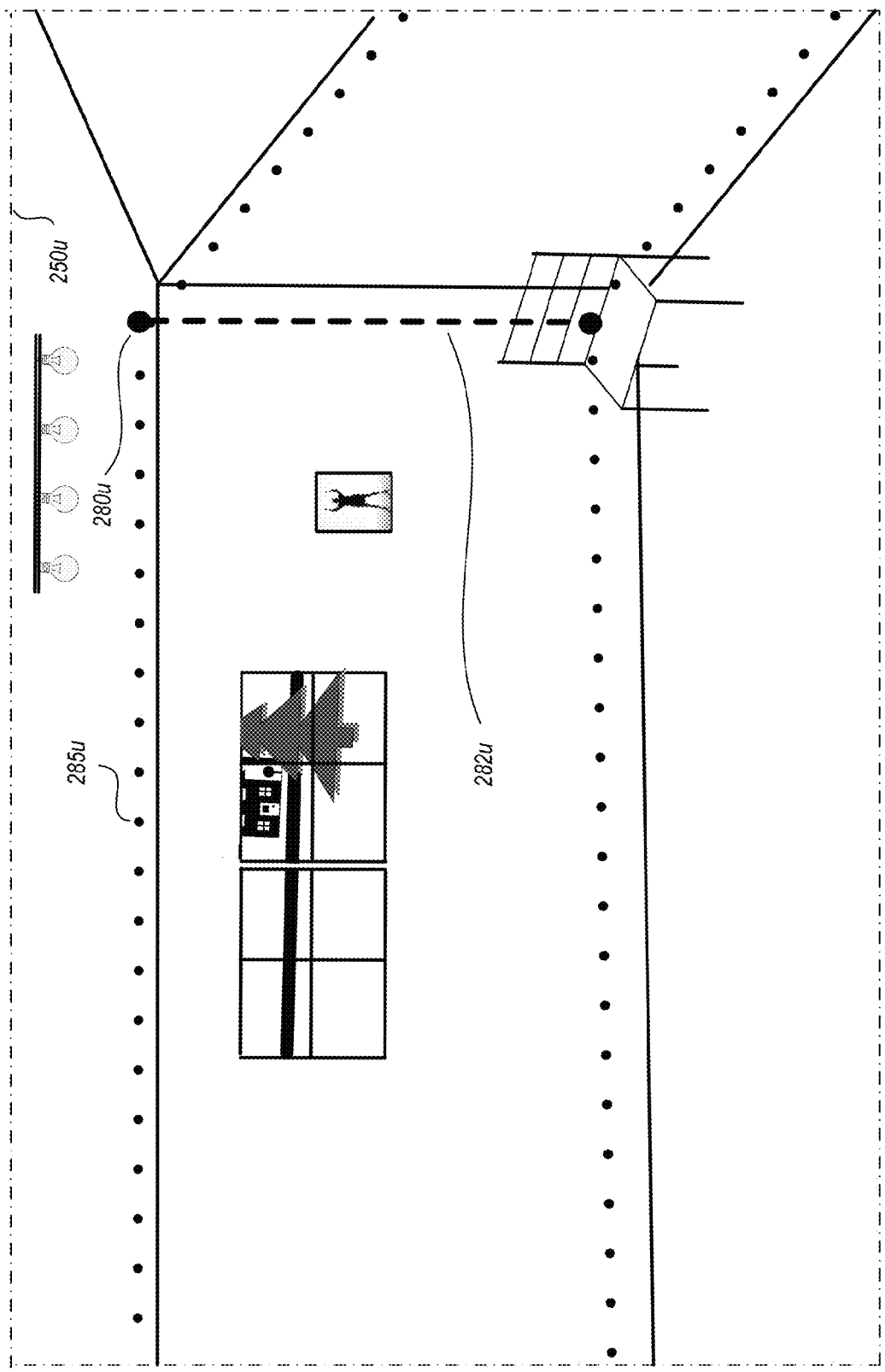

FIG. 2U continues the examples of FIGS. 2A-2T, and illustrates another alternative embodiment of user-manipulatable visual border and corner GUI controls as previously shown. In particular, in the example of FIG. 2U, the image shown in pane 250u is a perspective image of the same room with rectilinear visual representations in both the horizontal and vertical directions, and thus showing only a portion of the room—a corresponding second pane 255 is not illustrated in this example, but could be displayed and used in a manner similar to that discussed for FIGS. 2E-2H and 2S-2T in other embodiments. In the example of FIG. 2U, user-manipulatable GUI border and corner controls 280, 282 and 285 are again shown, but with the wall-to-floor and wall-to-ceiling border controls 285u being straight lines in this example to correspond to the underlying image format. In a manner similar to that previously discussed, one or more users may manipulate the controls 280u and/or 282u and/or 285u (e.g., by first manipulating the inter-wall border controls 282u first in a manner similar to FIGS. 2S-2T, by manipulating border controls 280u and/or corner controls 285u in a manner similar to FIGS. 2E-2H, etc.) to fit the border and corner controls to the actual borders and corners displayed in the image, and with part of a corresponding room shape (not shown) being determined accordingly. In embodiments such as those shown in FIG. 2U, multiple perspective images of the room may be used to collectively show 360° of horizontal coverage in the room (e.g., to show all inter-wall borders/corners in the room), and thus the user(s) of the GUI may sequentially manipulate displayed visual border and corner controls for each such perspective image in order to fully define the room shape for the room.

Figure 2V:
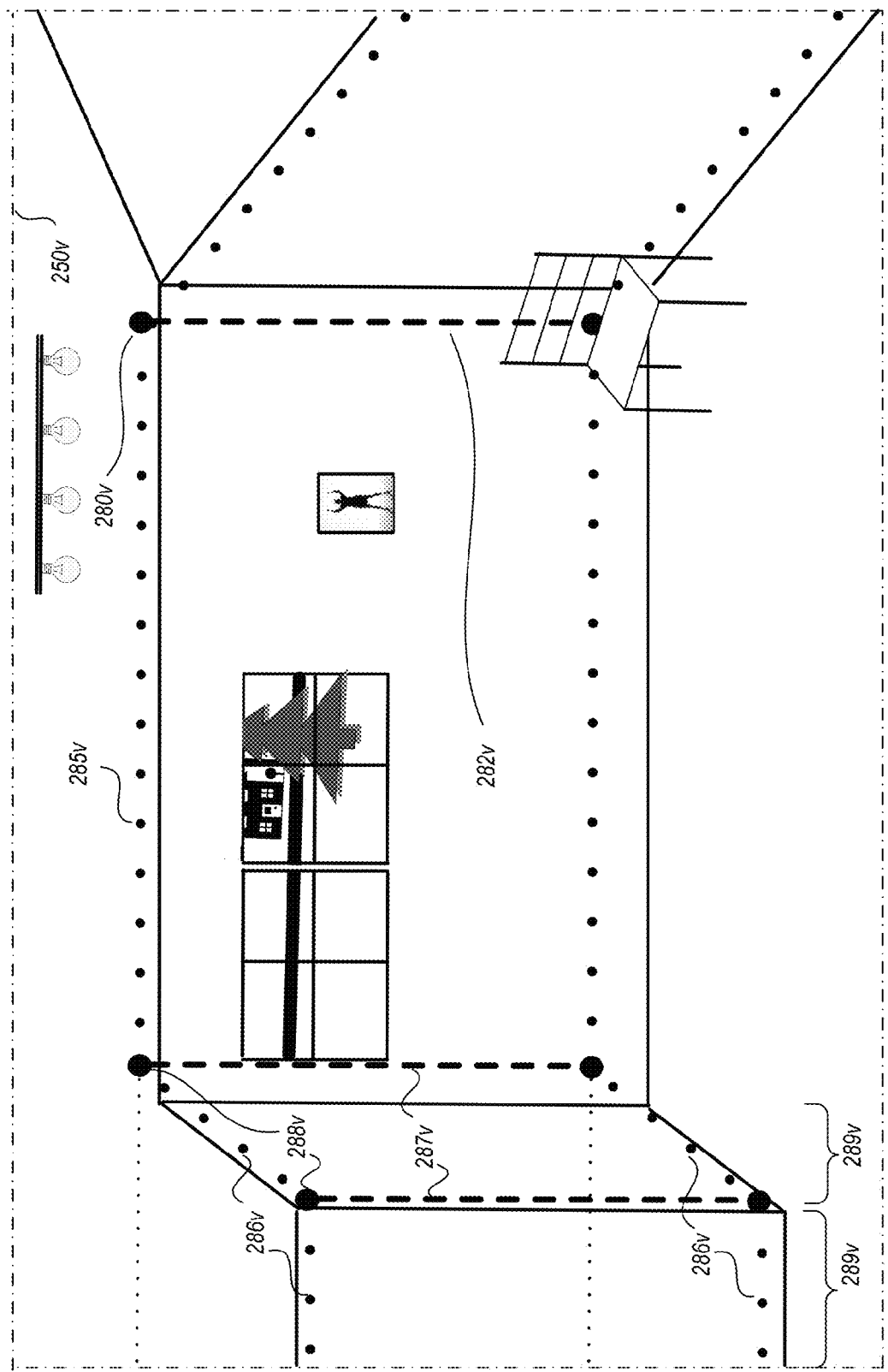

FIG. 2V continues the examples of FIGS. 2A-2U, and illustrates additional types of user-manipulations that may be performed in at least some embodiments. In particular, FIG. 2V shows an image 250v similar to that of FIG. 2U, but in which the underlying room does not have a purely rectangular shape, such as due at least in part to additional walls 289v shown in the image. In such situations, the initial displayed user-manipulatable border and corner controls 280, 282 and 285 that are provided to the user(s) of the GUI may be similar to those shown in FIG. 2U for such a perspective image (or those shown in FIGS. 2E and 2S for a panorama image in an equirectangular format, such as with four inter-wall borders/corners initially shown), but the user may perform additional manipulations (e.g., using additional user-selectable controls, not shown) to add one or more additional inter-wall borders 287v and corresponding additional wall-to-floor and wall-to-ceiling borders 286v and corners 288v for each of the additional room enclosure elements shown in the image, and to then position them at appropriate locations to correspond to the elements in the image. As part of doing so, initial inter-wall borders may, in at least some embodiments, be assumed to be 90° corners, with the corresponding GUI controls added in positions to reflect the assumption, but with the user(s) of the GUI able to modify the angles of the corners as appropriate. In this manner, room shapes for arbitrarily shaped rooms may be specified via user manipulations of corresponding GUI controls.

Figure 2W:
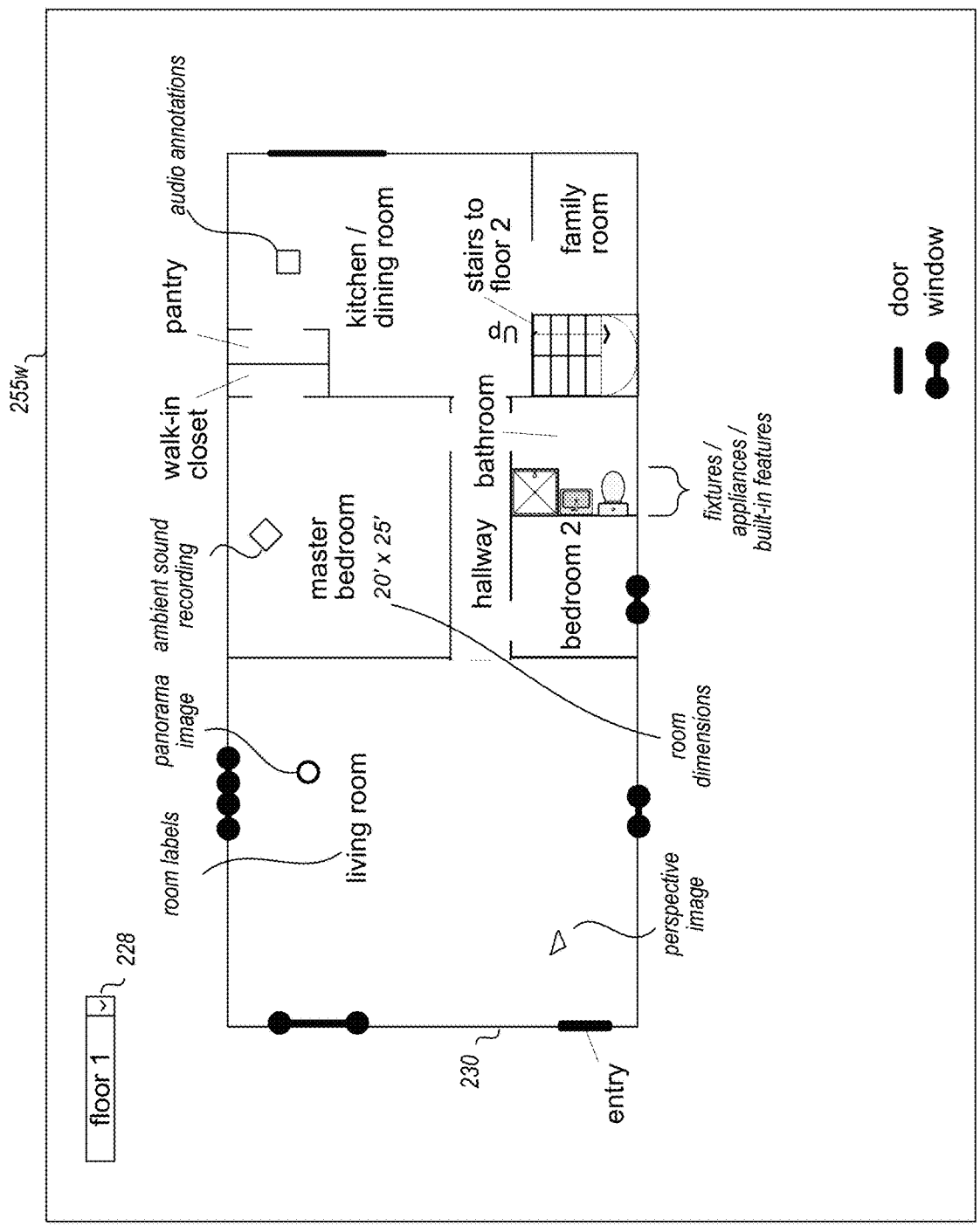
Figure 2X:
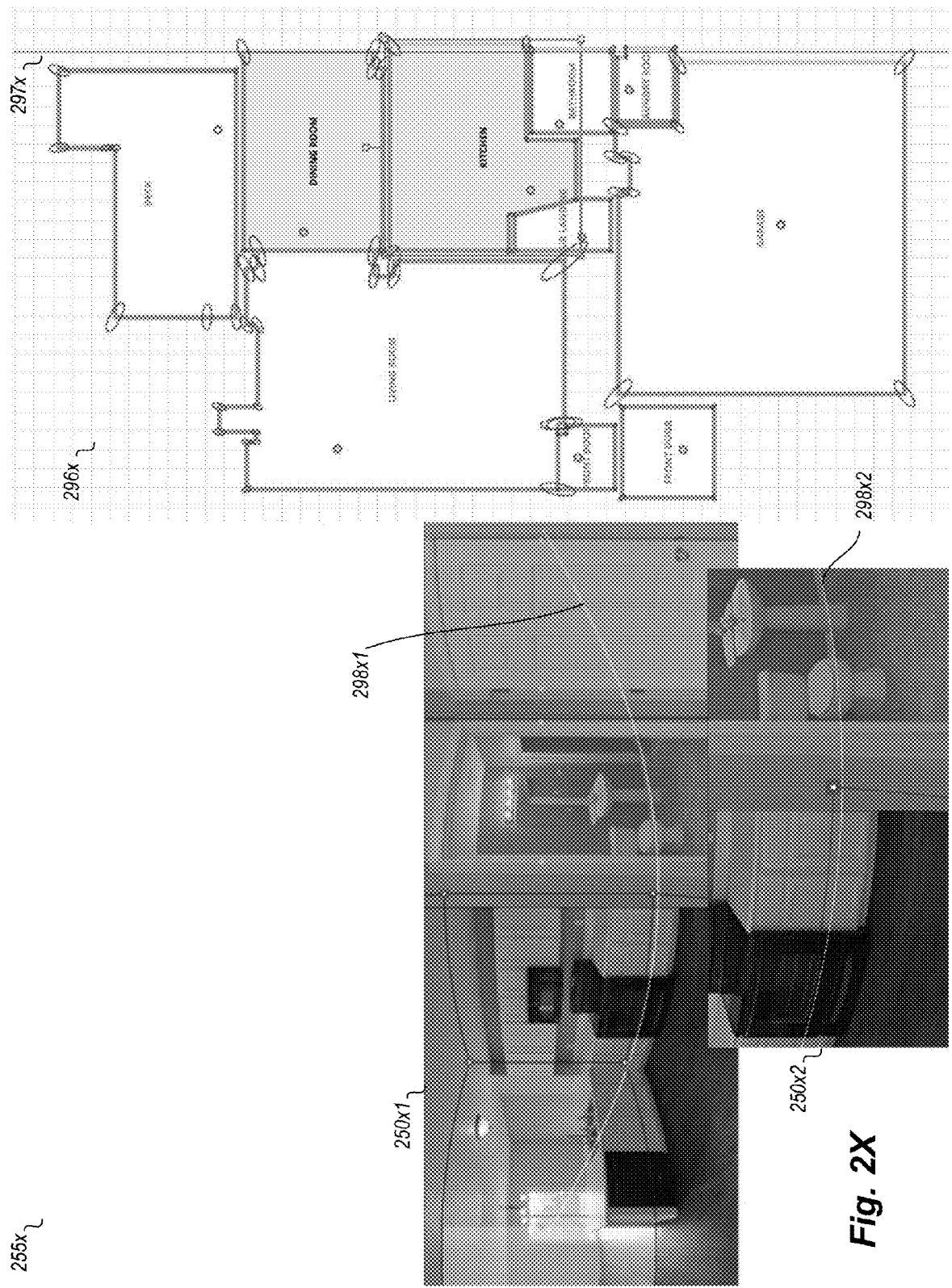

FIG. 2X continues the examples of FIGS. 2A-2W, and illustrates additional types of user-manipulations and/or automated operations of the MIGM system that may be performed in at least some embodiments. In particular, FIG. 2X shows information 255x corresponding to determining and using guidelines to align or otherwise fit corresponding elements (e.g., walls) displayed on a floor map and/or overlaid on an image, such as with respect to the red guideline 297x displayed on the right side of the example floor map 296x of information 255x, and/or the white guidelines 298x1 and 298x2 shown on the example panorama images 250x1 and 250x2 (displayed in this example in equirectangular format). For example, on this floor map 296x, purple dots indicate camera positions at which images are acquired, red ellipses indicate uncertainties of the estimated position of room corners generated from visual data of the images, pink thick lines show the walls consistent with the right (or "east") wall of the dining room (e.g., the right walls of the kitchen, bathroom, laundry room and possibly garage), with the red guideline 297x being automatically determined (e.g., computed) based on these consistent walls (e.g., using positions of one or more walls that are automatically determined to match each other, such as by being within a defined wall alignment threshold distance of each other).

In at least some such embodiments, collections of matching walls may be fitted to such guidelines, including to incorporate weighting for underlying corners of the walls based at least in part on associated uncertainties in locations of such corners. For example, walls on the right (east) side of the example house in floor map 296x may be fitted to guideline 297x, with ellipses optionally added to show uncertainty in the position of each wall—in this example, the initial location and/or shape of the "kitchen" room has an east wall that does not match the guideline 297x, and may be adjusted (whether automatically, or manually based on user input) to match the location of that guideline, whether by maintaining the kitchen's room shape and moving that room shape laterally to the left (or "west"), which in this example would cause the left (or "west") side of the kitchen's room shape to overlap with or otherwise impinge on the room shape for the living room, or instead by changing the shape of the kitchen's room shape (e.g., by moving the right wall of the kitchen's room shape inward to match the guideline 297x, while maintaining the locations of the other walls of the kitchen). Such guidelines overlaid on a floor map may also optionally be projected back into corresponding images (e.g., panorama images) to show where walls visible in the images should be located. In the example kitchen of image 250x1, for example, the kitchen cabinets hide where the floor meets the wall, and the blue lines represent an initial estimated room shape based on an initial prediction of where the east wall is located (e.g., where the east wall meets the floor), but the projected guideline 298x1 shows the difference from the initial estimated room shape that corresponds to that shown on the floor map, with the room shape estimate able to be modified to match the wall location of the projected guideline 298x1. Image 250x2 is a magnified portion of image 250x1, with the white guideline 298x2 providing an almost exact match to the baseboard of the bathroom, as reflected on the floor map.

Figure 2Y:

FIG. 2Y continues the examples of FIGS. 2A-2X, and illustrates additional information 255y that includes an additional example floor map 296y. In this example, the walls of the rooms on the left and right sides at the top are fitted to red guideline 297y1, and the shape and/or location of the room at the top in the middle can be adjusted to reflect the guideline 297y1 (e.g., so that the top side of that room matches that guideline). In addition, supporting walls on the left side and right side of the center top room are also identified, as illustrated with example guidelines 297y2 and 297y3, respectively, and can be used to fit the walls of other rooms (e.g., the room with icon "P1").

Figure 2Z:
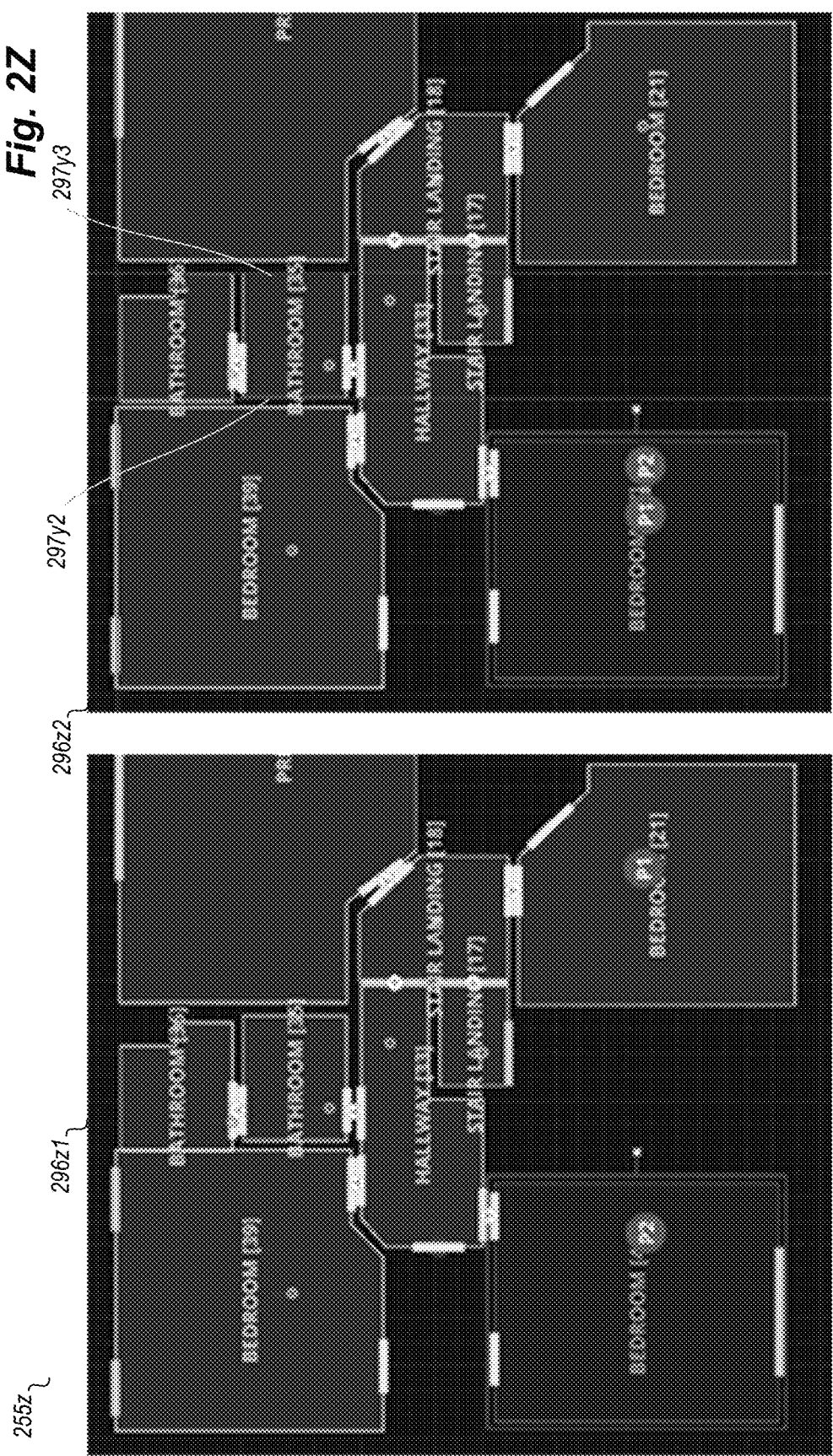
Figure 2A:
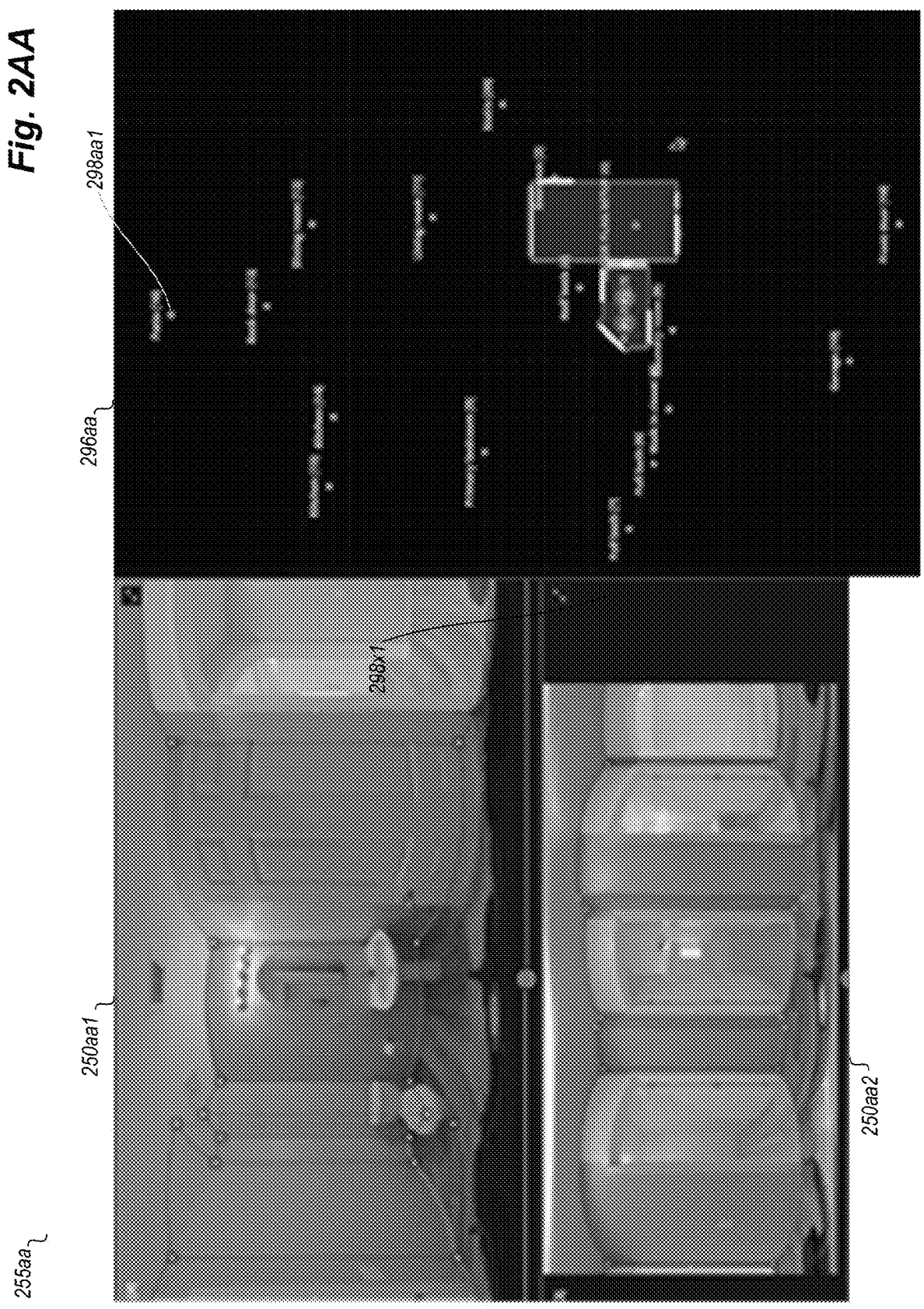
Figure 2A:
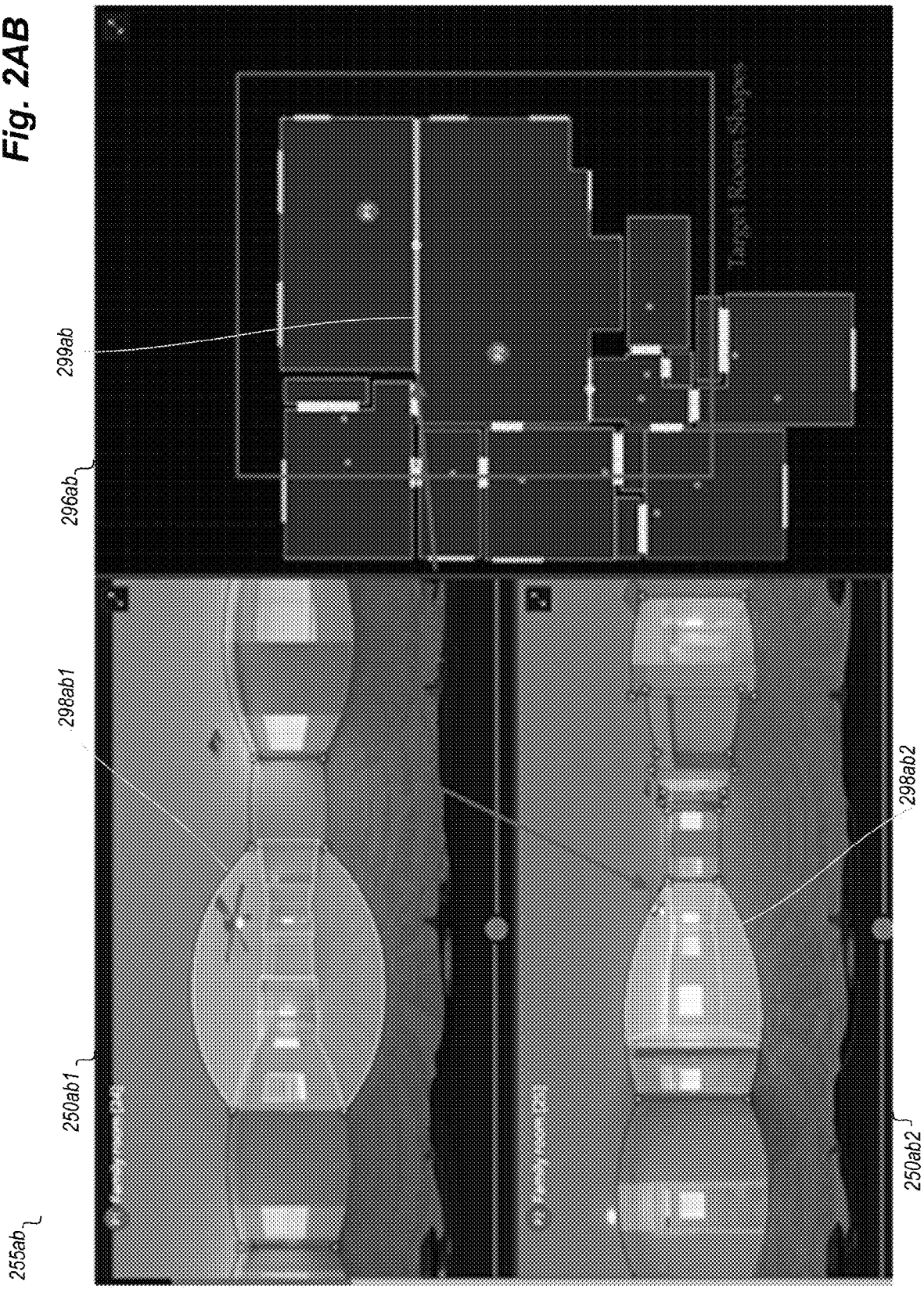
Figure 2A:
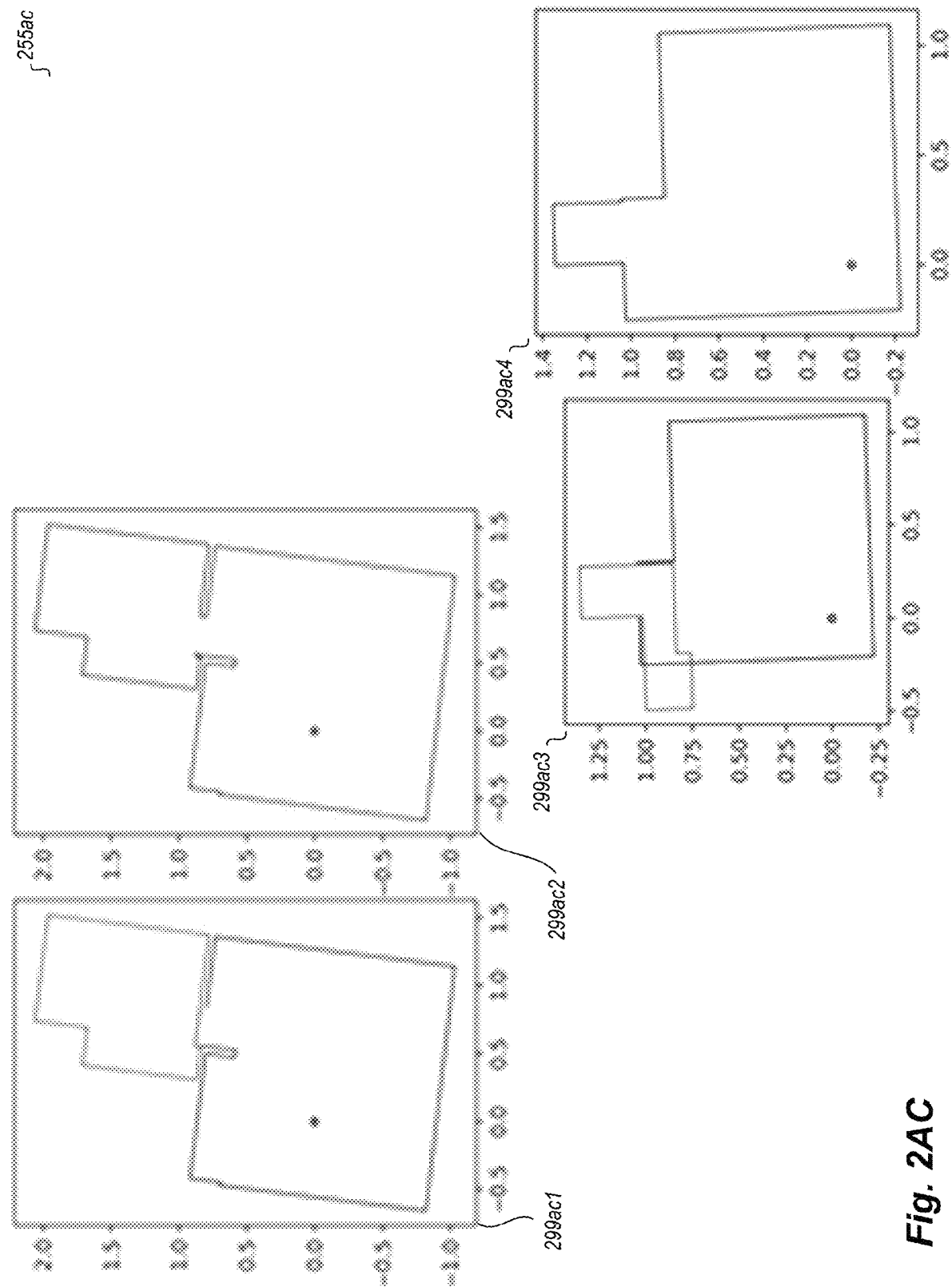
Figure 2A:
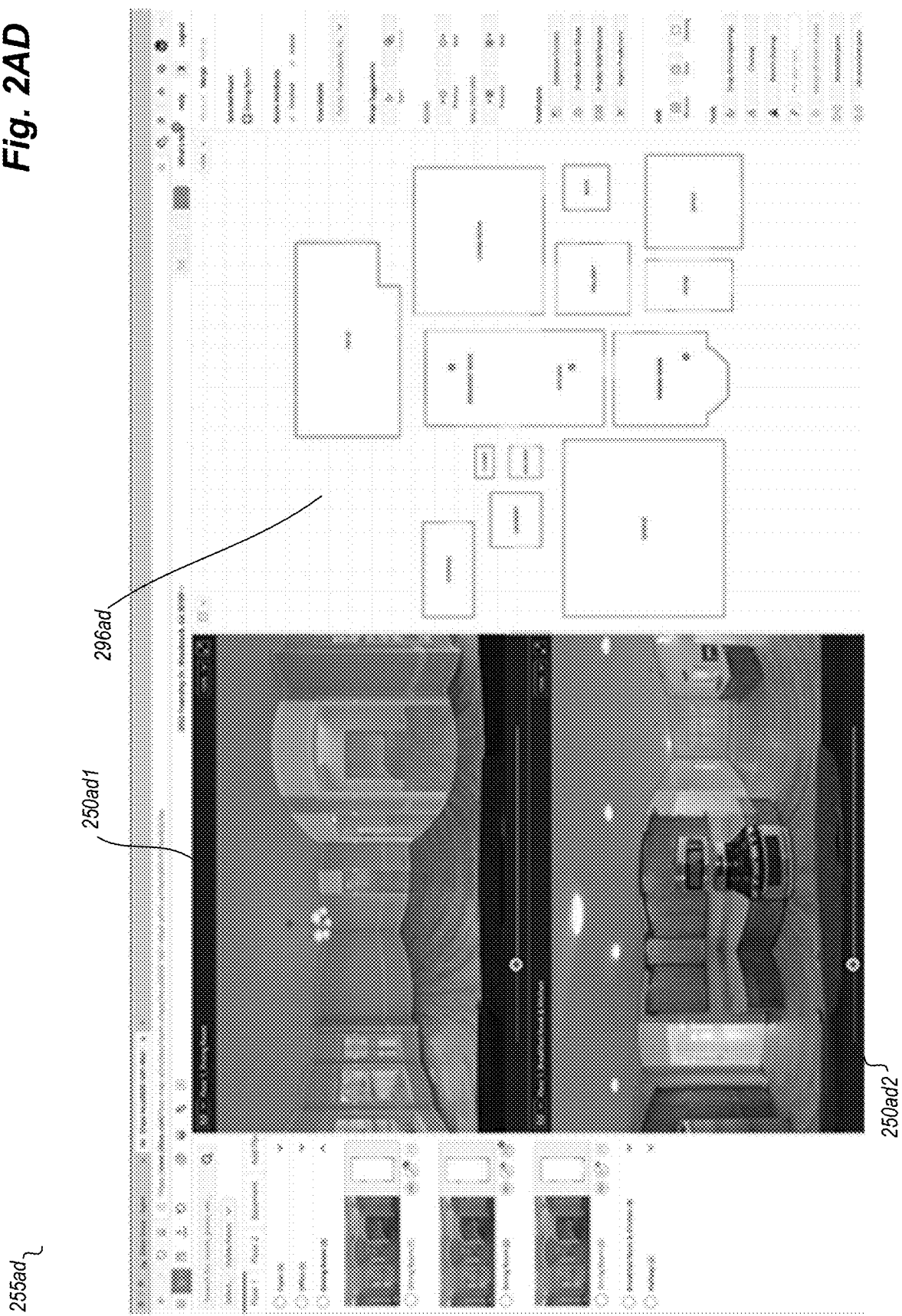
Figure 2A:
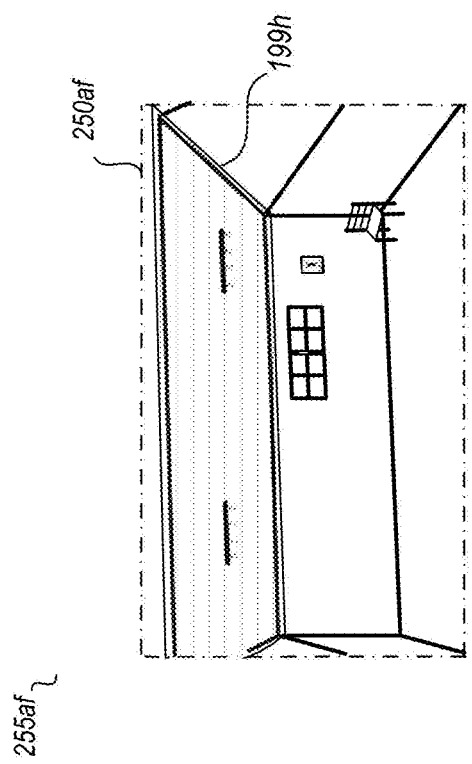
Figure 2A:
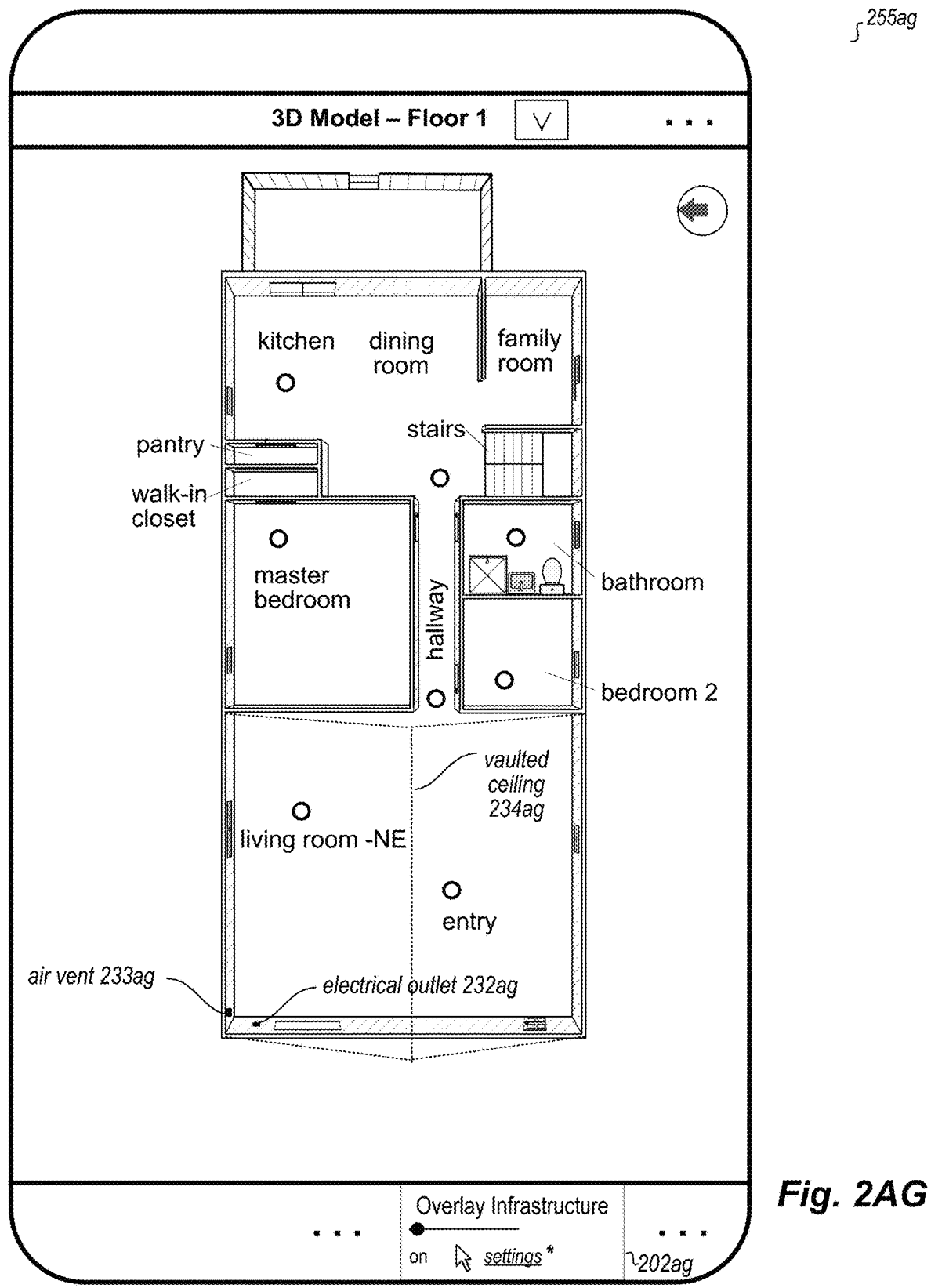

FIG. 2Z continues the examples of FIGS. 2A-2Y, and illustrates additional information 255z that includes additional example floor maps 296z1 and 296z2 that show updates to a portion of the floor map 296y of FIG. 2Y. In this example, in floor map 296z1, the room labeled "Bathroom [36]" at the top center is a current target to be aligned to another room below it labeled "Bathroom [35]"—in the example of floor map 296z1, an initial fitting of the two bathrooms together is performed using a naïve method of aligning the centerline of their adjacent doors, but doing so results in the Bathroom room being positioned so that its left/west edge impinges on the right/east edge of the "Bedroom [39]" room on the upper left of the floor map, which is physically implausible since the two edges should be separated by a wall thickness. In the updated example floor map 296z2, guidelines 297z1 and 297z2 are automatically determined (e.g., computed) for the walls of the Bathroom room, with the location of the Bathroom room updated in floor map 296z2 to an updated position after optimizations relative to these guidelines are determined. While such guidelines may in some embodiments and situations be displayed and used by one or more human annotator users to adjust room locations and/or shapes (e.g., to indicate a wall of one room and select functionality to automatically align another indicated room wall with that wall, to indicate three or more rooms and select functionality to automatically align all those walls, etc.), in other embodiments such adjustments to room locations and/or shapes may instead be performed automatically. In addition, such guidelines may in some embodiments and situations be used to prevent location/shape errors from accumulating as multiple rooms of a building are sequentially fitted together, such as by enforcing consistent locations of multiple consistent walls.

In one non-exclusive embodiment with respect to such guidelines, guidelines are determined in the following manner, using edges of multiple estimated room shapes that are roughly aligned, and using estimated uncertainties in the edges. In this embodiment, there are two types of guidelines, with the first type referred to for purposes of this example as a "wall guideline" that uses wall edges to infer a global line representing a single building wall extending across multiple rooms, and which has several potential uses, including the following: displayed as a visual cue for a human annotator user as they interactively position a room or manually edit a room's wall; used for an automated positioning operation, such as may be manually invoked or otherwise selected by a human annotator user (e.g., "shift the position of this estimated room shape to align its selected edge with the indicated guideline"); used for an automated shape-editing operation, such as may be manually invoked or otherwise selected by a human annotator user (e.g., "shift the selected edge of this estimated room shape to align with the indicated guideline in an updated estimated room shape"); etc. The second type of guideline in this example embodiment is referred to for purposes of this example as a "room auto-position guideline", in which two room shapes are to be aligned (designated "reference" and "target" room shapes for the purposes of this example embodiment) and wall features (e.g., a window, doorway, non-doorway wall opening, etc.) in each correspond to each other, and in which automatically determined uncertainties in estimated room shapes (e.g., of corners and/or walls) are used to generate a cost function and find a specific position that best aligns the walls, such as entirely automatically and without any human input or other intervention (e.g., without any intervention from a human annotator user).

With respect to this non-exclusive embodiment, a representation of uncertainty in the edges of each room shape (e.g., for walls of the room shape) is used as a basis for automatically determining guidelines to use. For example, room shapes may, for example, be predicted by a neural network model, hand-drawn by a human annotator, etc., with the resulting shape being an estimate formed using visual data of image pixels captured from a camera to estimate the pixel coordinates of an intersection of the room walls with the room floor (e.g., using corners of the room). Imprecision may be modeled in the estimate of a 2D pixel position $p=[p_u, p_v]$ of the intersection as noise $\sigma$, such that the true intersection is expected to be within $p \pm \sigma$. Given a known camera height and with each pixel in a panoramic camera image corresponding to a known angle relative to the camera center, a first line segment (in image coordinates) between $[p_u, p_v]$ and $[p_u, p_v+\sigma]$ can be projected onto the floor Cartesian coordinate system, and a second line segment between $[p_u, p_v]$ and $[p_u \pm \sigma, p_v]$ can similarly be projected. Considering these two projected segments as the major and minor half-axes of an ellipse, an ellipse is then fitted that represents a covariance matrix $\Sigma$ of a two-dimensional Gaussian distribution in the floor coordinate system, allowing uncertainty to be represented (with the projected footprint of the pixel noise $\sigma$ depending on the distance the camera is from the estimated room corner, such that there is more uncertainty at corners that are farther from the camera)—the floor map $296x$ of FIG. $2X$ illustrates these uncertainty ellipses computed for the estimated rooms in an example floor map, and while uncertainty is represented in this example as a 2D quantity represented at each corner, it could have other forms in other embodiments (e.g., a 1D, or one-dimensional, quantity associated with each wall).

Continuing with this non-exclusive embodiment, and with respect to an example GUI that may be provided by the MIGM system, when a user selects a wall w in room r and chooses functionality related to providing a guideline (e.g., "show guideline for wall"), a guideline for that wall is determined and displayed, with the guideline determined via a two-step process as follows: find a set C of walls, from rooms other than r, that are consistent with wall w; and fit a guideline to those walls. To find a set of consistent walls, functionality may be provided that takes a set of inputs and provides that set of consistent walls, with inputs such as the following: wall $w=<v0, v1>$ where $v0$ and $v1$ are the 2d Cartesian coordinates of its endpoints; uncertainty representations $\Sigma_0$ and $\Sigma_1$ for $v0$ and $v1$, respectively; and room r. Let R be the set of walls $u=<e_0, e_1>$, with uncertainties $\Gamma_0$ and $\Gamma_1$, that meet conditions as follows: room(u) !=r; perp(u) is within 5 degrees of perp(w); and either the infinite extension of u passes within a Mahalanobis distance $d_t$ of $v_t$ (computed using $\Sigma_t$) for either $v_0$ or $v_1$, or the infinite extension of w passes within a Mahalanobis distance $d_t$ of $e_i$ (computed using $\Gamma_i$) for either $\in_0$ or e, and in which perp(w) returns the 2D vector that is perpendicular to wall w and pointing outwards from room(w), Mahalanobis distance is in units of "squared standard deviations", and $d_t$ is typically 2.7162030315 and this 2.716 value means that this distance will contain 97.5% of the samples from the 2D gaussian distribution. To fit a guideline to a set of consistent walls, functionality may be provided that takes inputs including a set E of consistent edges e, in the 2D floor coordinate system (e.g., identified as indicated above) and that provides output including the following: a representation of a best-fitting line as coefficients $<a,b,c>$, where $ax+by+c=0$ defines a line x; and a range of variation $<c_{min}, c_{max}>$ in estimated coefficient c. Automated determinations to do so may include the following: compute the component-wise median, aka marginal median, of $e_{i\perp}$, for all $e_i \in E$, where $e_{i\perp}$ is the perpendicular vector to edge $e_i$, and set the output a, b to be this vector x; compute c by iteratively generating sets of $2\|E\|$ two-dimensional samples, one for each vertex of each edge in E, with each sample drawn from the probability distribution for that vertex, and an $ax+by+c$ line fitted to each set of samples, holding a and b fixed to the values computed from the component-wise median (e.g., only solving for c for each set); and compute the output c as the median of the c values computed from each iteration, also storing the $15^{th}$ and $85^{th}$ percentile of these values as $<c_{min}, c_{max}>$ to provide an estimate of the range of variation in the estimate c. In the floor map $296x$ of FIG. $2X$, the red guideline $297x$ on the right side of the floor map is the guideline represented by the a,b,c returned from this algorithm, given the pink walls as input.

Continuing with this non-exclusive embodiment, uncertainty representations used to compute wall guidelines can also be used to automatically choose the best position of a room shape being added to a partially-constructed floor map. Consider an evolving partial floor map that contains a set of estimated room shapes that have been positioned relative to each other, let a "reference" room shape be one such room shape in this map, with another estimated room shape called the "target" T to be added to the evolving partial floor map, and with a designated wall feature in the reference (e.g., a doorway) that aligns with another designated wall feature in the target (e.g., with such an alignment determined automatically from automated models or algorithms, or manually from a human annotator user). A naïve way to position the target in the partial floor map is to align the center lines of the corresponding reference wall feature and target wall feature, and offset the two wall features in a direction along these center lines by a determined wall thickness (e.g., a standard wall thickness, such as 4.5"; a default wall thickness previously determined between two rooms, such as in a manner similar to that discussed with respect to FIGS. 2Q-2R; etc.), as illustrated in floor plan $296z1$ of FIG. $2Z$. Wall guidelines can be used to refine the target room's initial position determined by such a naïve method, including starting at that initial position of T, computing for each wall of T the other walls that are consistent with it (e.g., as described above), and fitting a guideline to each group of consistent walls as described previously (some walls of T may not have any consistent walls, so they may not have a guideline). A cost function may be defined on a 1D shift $\Delta$ of the target room T in a direction parallel to the wall feature based on these guidelines, with the costs being the sum over all walls $w=<v_0, v_1, \Sigma_0, \Sigma_1>$ of T that have a guideline $g_w$ of: $\Sigma_{i \in \{0,1\}} \text{conf}(w) \text{ mdist}(v_i+\Delta, \Sigma_i, g_w)$ where mdist(p, $\Sigma$, g) is the minimum Mahalanobis distance of the guideline line g from point p using covariance matrix $\Sigma$, and conf is a confidence weighting defined as $\text{conf}(w,g)=\text{length}(w)$ (1/

($g_{max}-g_{min}$), such that longer walls increase confidence, and guidelines with more variation decrease confidence. length (w) may be determined to be the Euclidean distance between $v_0$ and $v_1$ but other functions may be used (e.g., log weighting, a rectified linear function, etc.). A 1D line search is performed looking for the shift A of the target room that minimizes this cost function, and the target room is positioned at that shift. The refined position of "Bathroom [36]" room in floor map 296z2 of FIG. 2Z illustrates this approach, in which doors between the "Bathroom [36]" and "Bathroom [35]" rooms are no longer center-aligned and instead the east and west walls of the "Bathroom [36]" room are now closely aligned with those of the "Bathroom [35]" room and at a plausible offset from the "Bedroom [39]" room east wall.

FIG. 2AA continues the examples of FIGS. 2A-2Z, and illustrates additional information 255aa that includes an additional example floor map 296aa and two corresponding images 250aa1 and 250aa2 (each shown in equirectangular format). In this example, determined image poses (e.g., image location and orientation) are used to assist with room shape determination and/or room merge correction performed as part of floor map generation, such as to assist a human annotator user with such activities. For example, image poses (e.g., for panorama images) may be localized into one or many clusters each having its own coordinate system so that inter-image pose information between the images of a cluster are defined in that coordinate system, such as with each panorama pose having xyz-coordinates and a yaw rotation angle—if so, such localized cluster image poses may be used to align the image(s) of the cluster and corresponding estimated room shapes with other images and corresponding estimated room shapes that have already been added onto a floor map being generated.

As one non-exclusive example, the yellow dots (e.g., dot 298aa1) in the example floor map 296aa of FIG. 2AA indicate panorama images whose location and corresponding estimated room shapes are not yet added into the evolving partial floor map (currently having two room shapes located relative to each other) but have been localized inside aligned clusters. A human annotator user may use such a GUI to select which panorama image's estimated room shape to add to the floor map, such as by hovering over a yellow dot or otherwise selecting it, and causing estimated room shape and door/window/opening predictions to be obtained for the selected panorama image (e.g., to retrieve previously determined information, to dynamically generate such information, etc.) and to provide a preview of the estimated room shape (e.g., a 2D room shape overlaid the floor plan, a 3D room shape overlaid on a panorama image, etc.) being aligned with an existing structure (e.g., estimated room shape) located on the partial floor map and/or on a panorama image. To generate the alignment, automated operations may be performed to identify the closest door/window/opening pair between the predicted estimated room shape and an existing structure of the floor map, and a human annotator user may interact with the GUI to finalize placement of the predicted room shape on the floor map, and then may continue adding more panorama images and corresponding estimated room shapes in a similar manner. In addition, image 'localization' (e.g., determination of the acquisition location of the image, such as within an estimated room shape or otherwise on a floor map) information may be determined in various manners (e.g., from structure-from-motion analysis, co-visibility and angular-correspondence-based pose regression analysis, SLAM-based tracking analysis, etc.), with additional example details included in U.S. Non-Provisional patent application Ser. No. 17/585,433, filed Jan. 26, 2022 and entitled "Automated Building Floor Plan Generation Using Visual Data Of Multiple Building Images"; in U.S. Non-Provisional patent application Ser. No. 17/564,054, filed Dec. 28, 2021 and entitled "Automated Building Information Determination Using Inter-Image Analysis Of Multiple Building Images"; and in U.S. Provisional Patent Application No. 63/279,247, filed Nov. 21, 2021 and entitled "Automated Analysis Of Visual Data Of Images To Determine The Images' Acquisition Locations On Building Floor Plans"; each of which is incorporated herein by reference in its entirety. While the yellow dots are overlaid on the floor map 296aa in this example, such yellow dots may be overlaid at corresponding locations on one or both of the images 250aa1 or 250aa2, whether in addition to or instead of the floor map 296aa, to enable a human annotator user to select such yellow-dot panorama locations within a panorama image (or other image) and to fit an estimated room shape (e.g., 3D room shape) overlaid on that panorama image to fit with corresponding visual data within that panorama image (e.g., in a manner previously discussed with respect to FIG. 2R and elsewhere herein).

FIG. 2AB continues the examples of FIGS. 2A-2AA, and illustrates additional information 255ab that includes an additional example floor map 296ab and two corresponding images 250ab1 and 250ab2 (each shown in equirectangular format). In particular, images 250ab1 and 250ab2 correspond to two different panorama images captured at different locations within a single room (e.g., a large room) and having two different initial estimated partial room shapes 298ab1 and 298ab2 respectively corresponding to separate parts of that room (shown as 3D estimated room shapes using blue lines overlaid on the images, and with corresponding 2D estimated room shapes shown on the floor map), with the longer pink line 299ab on the floor map illustrating a non-doorway wall opening that is initially present between the two partial room shapes despite there not being any wall at that location in the actual large room. The illustrated GUI may be used to combine these two partial room shapes into a single overall estimated room shape for the room, such as based on combining geometry predictions from multiple images.

As one non-exclusive example, geometry predictions from N images taken from different sides of the same room are combined, and with each image typically having one or more sections that are more accurate than other sections (e.g., due to distance from an image's acquisition location to surrounding walls, intervening objects blocking parts of walls and/or other structures in the room, etc.). In order to accurately combine two or more estimated room shapes while retaining information of use (e.g., information previously validated or otherwise specified by one or more human annotator users), the relative inter-image poses between the images are preferably determined as precisely as possible (e.g., refined using room shape projection and overlap, such as described with respect to FIGS. 2AA and 2R and elsewhere herein), and any previously supplied information from one or more human annotator users (e.g., with respect to room shapes, multi-room alignments, image localizations, etc.) preferably remains unchanged after the shape combination processing.

FIG. 2AC continues the examples of FIGS. 2A-2AB, and illustrates additional information 255ac that includes example partial room shapes 299ac1 being combined to form an example overall room shape 299ac2, and that includes example partial room shapes 299ac3 being combined to form an example overall room shape 299ac4. In particular, on the left side of each example, an annotated first partial room shape (black contour) from a first image is shown, generated in this example by a human annotator user who starts from a predicted first partial room shape from the first image and refines it to improve precision, and with a predicted second partial room shape (green contour) from a second image being shown in an initial alignment relative to the annotated first partial room shape (e.g., by matching the apparent non-doorway wall openings between the two room shapes). On the right side of each example, the blue contour shows the resulting combined room shape for the room, with the annotated first partial room shape and the predicted second partial room shape being combined, with details from the black contours (reflecting previously supplied information from one or more human annotator users) being preserved.

As one non-exclusive example of a processing flow corresponding to the activities discussed with respect to FIGS. 2AA and 2AB, a first image P1 (e.g., panorama image 298ab1 of FIG. 2AB) is selected, and initial predicted estimated room shape S1 (e.g., the black contour line of information 299ac1) for that image P1 is added to a floor map (e.g., as a first room shape on the floor map). The room shape S1 is optionally edited by one or more human annotator users to refine the room shape S1. A second image P2 (e.g., panorama image 298ab2 of FIG. 2AB) is then selected, and initial predicted estimated room shape S2 (e.g., the green contour line of information 299ac1) for that image P2 is added to the floor map and spatially associated with S1 (e.g., using generated inter-image pose information, whether automatically determined or manually specified by a human annotator user, such as by specifying locations of a particular point on each of the images P1 and P2; by using other manually specified information on images P1 and/or P2, such as in a manner previously discussed with respect to FIG. 2M; etc.). Inter-image relative pose information between images P1 and P2 may then be refined via one or more interactions of a human annotator user with the GUI, such as with the estimated room shapes S1 and S2—as part of doing so, an image feature detector (e.g., SIFT, AKAZE, etc.) can optionally be used to generate points from image P1 corresponding to detected features, such as with the feature points being visually or structurally unique in P1 (e.g., parts of a doorway, window, inter-wall border, corner, selected spot on the floor, etc.) and being co-visible from image P2 so that a human annotator user can use these points to identify the same position in the two images and thus align them with relative inter-image pose information resulting (e.g., instead of or in addition to placing a re-projected shape contour overlaid on an image, such as in a manner previously discussed with respect to FIG. 2R). The annotated S1 room shape is then extended to include the predicted room shape S2 by combining those room shapes, such as by using door/window/openings from image P2 and specifying with which corresponding door/window/opening from image P1 to connect, and with the extended annotated S1 room shape then being editable from image P2. In this manner, the shape combination activities produce a single combined room shape, optionally along with related information about room objects and/or structural elements (e.g., windows, doorways, non-doorway openings, etc., using as input (1) an annotated partial room shape S1 from image P1 that corresponds to part of a room space, (2) a predicted room shape S2 from image P2 that includes areas of the room not covered by S1, and (3) relative inter-image pose information between images P1 and P2. As part of doing so, the activities may look for non-doorway wall opening O1 from S1, and match the 2 endpoints of O1 to corresponding portions of predicted shape S2 through O1, such as with the 2 sets of O1 endpoints from room shapes S1 and S2 being used for shape contour segmentation, and with the segmented piecewise contour from room shapes S1 and S2 being stitched together.

FIG. 2AD continues the examples of FIGS. 2A-2AC, and illustrates additional information 255ad that includes an additional example floor map 296ad and two corresponding images 250ad1 and 250ad2 (each shown in equirectangular format). In particular, images 250ad1 and 250ad2 correspond to two different panorama images captured at different locations in two different rooms but each having visual data corresponding to an overlapping area (e.g., part of one or both of the rooms, part of a separate third room visible from the acquisition locations of both images, etc.). The illustrated GUI may be used to group such images together by using determined inter-image pose information and predicted room shapes, and optionally with a shape-based threshold corresponding to the overlapping area, such as using concurrent actions of multiple human annotator users working on a single floor map but different rooms of a building.

As one non-exclusive example of a processing flow corresponding to the activities discussed with respect to FIG. 2AD, the system may automatically determine the one or more images for each room (e.g., from a cluster of multiple images for the room that are grouped together) that are best suited to use for initial annotation by a corresponding human annotator user (e.g., the one or more images that can be quickly annotated to generate an initial estimated room shape), such as by using a ranking strategy for each image with a confidence score based on a prediction confidence of at least one of one or more walls, one or more corners, one or more doorways, one or more windows one or more non-doorway wall openings, one or more distances to one or more room structures, an amount of occlusion (e.g., to walls and/or other structural room elements), etc. As annotation activities by one or more human annotator users are performed, a progress bar may be displayed for the overall process of generating some or all of the floor map (e.g., a current room, a current floor, an overall floor map, etc.), such as with a progress value for such a progress bar being defined by the percentage of areas annotated by one or more human annotator users relative to an entire estimated square-footage to be completed (e.g., an annotated area of a room relative to the entire room, an annotated area of a floor relative to the entire floor, an annotated area of a building relative to the entire building, etc.). In addition, by using determined inter-image pose information of the type discussed above, a quantity of separate tasks that each involve a combination of two different estimated room shapes to be completed may be determined, and optionally each directed to being performed (e.g., concurrently) by a different human annotator user.

In one non-exclusive example embodiment, a human annotator user starts with a first room shape, and performs manipulations to add an additional second room shape relative to the first room shape using information about inter-image pose information between at least one first image located within the first room shape (e.g., that has an acquisition location within that first room) and at least one second image located within the second room shape (e.g., that has an acquisition location within that second room). If the at least one second image is part of a cluster of multiple images outside the first room having a shared common coordinate system, once the inter-image pose information between the at least one first image and the at least one second image is determined (e.g., by aligning coordinate information for the at least one second image from that common coordinate system with other coordinate information for the at least one first image and optionally other images in other rooms that are part of a different common coordinate system), it provides initial determinations of relative positions of all of the images in the shared common coordinate system of the cluster with respect to the previously determined locations of the at least one first image and any other images in the separate common coordinate system. If such predicted image locations are indicated on a floor map or other displayed computer model (e.g., using yellow dots similar to those discussed with respect to FIG. 2AA), a human annotator user may hover over (or otherwise select) one of the dots corresponding to one of the images (or other visual indication of a predicted location of the image) to see a visual representation of a predicted room shape for the room in which that image is located, with that predicted room shape shown relative to the located room shapes for the first and second rooms (and any other rooms that have been added to the floor map or other computer model being generated). In this example, by further selecting (e.g., clicking or double clicking) the predicted room shape, it may be automatically added into the evolving floor map or other computer model being generated, such as using automated predictions that match inter-connecting doorways and/or non-doorway wall openings in manners discussed with respect to FIGS. 2AA-2AD and elsewhere herein, and with the human annotator user able to optionally further revise the positioning of the predicted room shape relative to the other room shapes and/or to change the predicted room shape to correspond to the visual data of the image.

In addition, such visual representations of predicted locations of additional images may further be used in other manners, including to be overlaid on another image and to be user-selectable in a manner similar to that discussed above—for example, hovering over (or otherwise selecting) such a visual representation (e.g., a yellow dot) overlaid on an image may cause a predicted room shape outline (e.g., a 3D outline or mesh or point cloud) for an additional room corresponding to that selected visual representation to be overlaid on the image, with the human annotator user able to adjust the overlaid room shape to match corresponding visual data in the image and to, by doing so, modify the positioning and/or shape of the additional room's outline to match the visual data of the image (and a corresponding room shape for the room in which that image is located, such as a room shape that is part of the evolving floor map or other computer model being generated). Moreover, when a new room shape for an additional room is being added in this example non-exclusive embodiment and that additional room has multiple images, multiple partial room shapes from those multiple images may be combined together to create an overall room shape for the new room, as well as add that new room shape to the overall evolving floor map or other computer model being generated. For example, an outline of one partial room shape may be overlaid on an image for another room (e.g., with another room shape for that other room having its room shape outline also overlaid on the image), to enable the human annotator user to merge the two partial room shapes (e.g., in a manner similar to that discussed elsewhere herein, including with respect to FIG. 2R). As discussed in greater detail elsewhere herein, initial locations, room shapes and connections may be automatically predicted by the MIGM system, with a human annotator user able to manually modify that predicted information via the building information determination GUI in the manners discussed above.

Additional details related to embodiments of a system for providing at least some such functionality of a MIGM system for analyzing building information and generating at least initial versions of corresponding 2D floor plans or other computer models (e.g., 3D computer models, virtual tours of inter-connected images, etc.) are included in U.S. Non-Provisional patent application Ser. No. 17/080,604, filed Oct. 26, 2020 and entitled "Generating Floor Maps For Buildings From Automated Analysis Of Visual Data Of The Buildings' Interiors"; in U.S. Non-Provisional patent application Ser. No. 17/013,323, filed Sep. 4, 2020 and entitled "Automated Analysis Of Image Contents To Determine The Acquisition Location Of The Image"; in U.S. Non-Provisional patent application Ser. No. 17/069,800, filed Oct. 13, 2020 and entitled "Automated Tools For Generating Building Mapping Information"; in U.S. Non-Provisional patent application Ser. No. 17/243,146, filed Apr. 28, 2021 and entitled "Automated Generation On Mobile Devices Of Panorama Images For Building Locations And Subsequent Use"; in U.S. Non-Provisional patent application Ser. No. 17/150,958, filed Jan. 15, 2021 and entitled "Automated Determination Of Image Acquisition Locations In Building Interiors Using Multiple Data Capture Devices"; in U.S. Non-Provisional patent application Ser. No. 17/201,996, filed Mar. 15, 2021 and entitled "Automated Determination Of Image Acquisition Locations In Building Interiors Using Determined Room Shapes"; in U.S. Non-Provisional patent application Ser. No. 17/185,793, filed Feb. 25, 2021 and entitled "Automated Usability Assessment Of Buildings Using Visual Data Of Captured In-Room Images"; and in U.S. Non-Provisional patent application Ser. No. 17/386,281, filed Jul. 27, 2021 and entitled "Automated Room Shape Determination Using Visual Data Of Multiple Captured In-Room Images"; each of which is incorporated herein by reference in its entirety.

Various details have been provided with respect to FIGS. 2A-2AG, but it will be appreciated that the provided details are non-exclusive examples included for illustrative purposes, and other embodiments may be performed in other manners without some or all such details.

Figure 3:
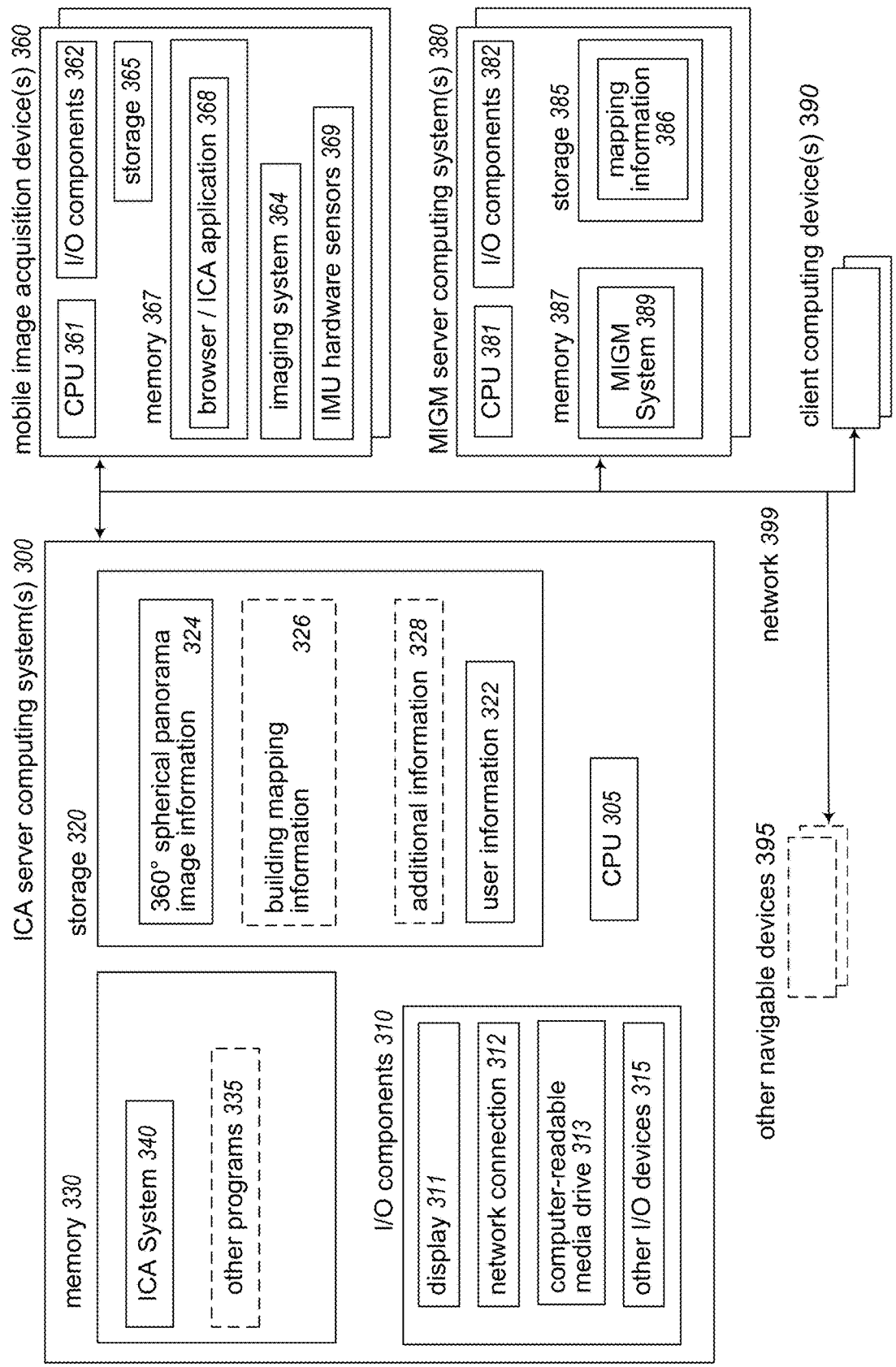
FIG. 3 is a block diagram illustrating computing systems suitable for executing embodiments of one or more systems that perform at least some of the techniques described in the present disclosure.

FIG. 3 is a block diagram illustrating an embodiment of one or more server computing systems 300 executing an implementation of an ICA system 340, and one or more server computing systems 380 executing an implementation of an MIGM system 389—the server computing system(s) and ICA and/or MIGM systems may be implemented using a plurality of hardware components that form electronic circuits suitable for and configured to, when in combined operation, perform at least some of the techniques described herein. In the illustrated embodiment, each server computing system 300 includes one or more hardware central processing units ("CPUs") or other hardware processors 305, various input/output ("I/O") components 310, storage 320, and memory 330, with the illustrated I/O components including a display 311, a network connection 312, a computer-readable media drive 313, and other I/O devices 315 (e.g., keyboards, mice or other pointing devices, microphones, speakers, GPS receivers, etc.). Each server computing system 380 may have similar components, although only one or more hardware processors 381, memory 387, storage 385 and I/O components 382 are illustrated for the sake of brevity.

The server computing system(s) 300 and executing ICA system 340, and server computing system(s) 380 and executing MIGM system 389, may communicate with each other and with other computing systems and devices in this illustrated embodiment via one or more networks 399 (e.g., the Internet, one or more cellular telephone networks, etc.), such as to interact with user client computing devices 390 (e.g., used to view floor maps, and optionally associated images and/or other related information), and/or mobile image acquisition devices 360 (e.g., used to acquire panorama images and optionally other information for buildings or other environments to be modeled), and/or optionally other navigable devices 395 that receive and use floor maps and optionally other generated information for navigation purposes (e.g., for use by semi-autonomous or fully autonomous vehicles or other devices). In other embodiments, some of the described functionality may be combined in less computing systems, such as to combine the ICA system 340 and the image acquisition functionality of device(s) 360 in a single system or device, to combine the ICA system 340 and the MIGM system 389 in a single system or device, to combine the ICA system 340 and the MIGM system 389 and the image acquisition functionality of device(s) 360 in a single system or device, etc.

In the illustrated embodiment, an embodiment of the ICA system 340 executes in memory 330 of the server computing system(s) 300 in order to perform at least some of the described techniques, such as by using the processor(s) 305 to execute software instructions of the system 340 in a manner that configures the processor(s) 305 and computing system 300 to perform automated operations that implement those described techniques. The illustrated embodiment of the ICA system may include one or more components, not shown, to each perform portions of the functionality of the ICA system, and the memory may further optionally execute one or more other programs 335—as one specific example, a copy of the MIGM system may execute as one of the other programs 335 in at least some embodiments, such as instead of or in addition to the MIGM system 389 on the server computing system(s) 380. The ICA system 340 may further, during its operation, store and/or retrieve various types of data on storage 320 (e.g., in one or more databases or other data structures), such as various types of user information 322, acquired 360° spherical panorama image information 324 (e.g., for analysis to generate floor maps; to provide to users of client computing devices 390 for display; etc.), optionally generated floor maps and other associated information 326 received from MIGM system 389 (e.g., generated and saved 2.5D and/or 3D models, building and room dimensions for use with associated floor plans, additional images and/or annotation information, etc.) and/or various types of optional additional information 328 (e.g., various analytical information related to presentation or other use of one or more building interiors or other environments captured by an ICA system).

In addition, an embodiment of the MIGM system 389 executes in memory 387 of the server computing system(s) 380 in the illustrated embodiment in order to perform at least some of the described techniques, such as by using the processor(s) 381 to execute software instructions of the system 389 in a manner that configures the processor(s) 381 and computing system 380 to perform automated operations that implement those described techniques. The illustrated embodiment of the MIGM system may include one or more components, not shown, to each perform portions of the functionality of the MIGM system, and the memory may further optionally execute one or more other programs (not shown). The MIGM system 389 may further, during its operation, store and/or retrieve various types of data on storage 385 (e.g., in one or more databases or other data structures), such as generated floor maps and optionally other associated information 386 (e.g., generated and saved 2.5D and/or 3D models, building and room dimensions for use with associated floor plans, additional images and/or annotation information, various analytical information related to presentation or other use of one or more building interiors or other environments, etc.)—while not illustrated in FIG. 3, the MIGM system may further store and use additional types of information, such as about MIGM system operator users, acquired 360° spherical panorama image information to be analyzed, etc.

Some or all of the user client computing devices 390 (e.g., mobile devices), mobile image acquisition devices 360, optional other navigable devices 395 and other computing systems (not shown) may similarly include some or all of the same types of components illustrated for server computing system 300. As one non-limiting example, the mobile image acquisition devices 360 are each shown to include one or more hardware CPU(s) 361, I/O components 362, storage 365, and memory 367, with one or both of a browser and one or more client applications 368 (e.g., an application specific to the MIGM system and/or ICA system) executing within memory 367, such as to participate in communication with the ICA system 340, MIGM system 389 and/or other computing systems—the devices 360 each further include one or more imaging systems 364 and IMU hardware sensors 369, such as for use in acquisition of images and associated movement/travel data of the device 360. While particular components are not illustrated for the other navigable devices 395 or other computing systems 390, it will be appreciated that they may include similar and/or additional components.

It will also be appreciated that computing systems 300 and 380 and the other systems and devices included within FIG. 3 are merely illustrative and are not intended to limit the scope of the present invention. The systems and/or devices may instead each include multiple interacting computing systems or devices, and may be connected to other devices that are not specifically illustrated, including via Bluetooth communication or other direct communication, through one or more networks such as the Internet, via the Web, or via one or more private networks (e.g., mobile communication networks, etc.). More generally, a device or other computing system may comprise any combination of hardware that may interact and perform the described types of functionality, optionally when programmed or otherwise configured with particular software instructions and/or data structures, including without limitation desktop or other computers (e.g., tablets, slates, etc.), database servers, network storage devices and other network devices, smart phones and other cell phones, consumer electronics, wearable devices, digital music player devices, handheld gaming devices, PDAs, wireless phones, Internet appliances, and various other consumer products that include appropriate communication capabilities. In addition, the functionality provided by the illustrated ICA system 340 and/or MIGM system 389 may in some embodiments be distributed in various components, some of the described functionality of the ICA system 340 and/or MIGM system 389 may not be provided, and/or other additional functionality may be provided.

It will also be appreciated that, while various items are illustrated as being stored in memory or on storage while being used, these items or portions of them may be transferred between memory and other storage devices for purposes of memory management and data integrity. Alternatively, in other embodiments some or all of the software components and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the ICA system 340 executing on server computing systems 300 and/or on devices 360, by the MIGM client software 389 executing on server computing systems 380, etc.) and/or data structures, such as by execution of software instructions of the one or more software programs and/or by storage of such software instructions and/or data structures, and such as to perform algorithms as described in the flow charts and other disclosure herein. Furthermore, in some embodiments, some or all of the systems and/or components may be implemented or provided in other manners, such as by consisting of one or more means that are implemented partially or fully in firmware and/or hardware (e.g., rather than as a means implemented in whole or in part by software instructions that configure a particular CPU or other processor), including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage mediums, such as a hard disk or flash drive or other non-volatile storage device, volatile or non-volatile memory (e.g., RAM or flash RAM), a network storage device, or a portable media article (e.g., a DVD disk, a CD disk, an optical disk, a flash memory device, etc.) to be read by an appropriate drive or via an appropriate connection. The systems, components and data structures may also in some embodiments be transmitted via generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of the present disclosure may be practiced with other computer system configurations.

FIG. 4 illustrates an example flow diagram of an embodiment of an ICA System routine 400. The routine may be performed by, for example, the ICA System 160 of FIG. 1A, the ICA System 340 of FIG. 3, and/or the ICA system described with respect to FIGS. 1B-2AG and as otherwise described herein, such as to acquire 360° spherical panorama images and/or other images at viewing locations within buildings or other structures, such as for use in subsequent generation of related floor maps and/or other mapping information. While portions of the example routine 400 are discussed with respect to acquiring particular types of images at particular viewing locations, it will be appreciated that this or a similar routine may be used to acquire video or other data (e.g., audio), whether instead of or in addition to such images. In addition, while the illustrated embodiment acquires and uses information from the interior of a target building, it will be appreciated that other embodiments may perform similar techniques for other types of data, including for non-building structures and/or for information external to one or more target buildings of interest. Furthermore, some or all of the routine may be executed on a mobile device used by a user to acquire image information, and/or by a system remote from such a mobile device.

The illustrated embodiment of the routine begins at block 405, where instructions or information are received. At block 410, the routine determines whether the received instructions or information indicate to acquire data representing a building interior, and if not continues to block 490. Otherwise, the routine proceeds to block 412 to receive an indication from a user of a mobile image acquisition device to begin the image acquisition process at a first viewing location. After block 412, the routine proceeds to block 415 in order to perform viewing location image acquisition activities in order to acquire a 360° spherical panorama image for the viewing location in the interior of the target building of interest, such as via one or more fisheye lenses on the mobile device, and such as to provide horizontal coverage of at least 360° around a vertical axis. As one non-exclusive example, the mobile image acquisition device may be a rotating (scanning) panorama camera equipped with a fisheye lens, such as a 180° fisheye giving a full sphere at 360° rotation. The routine may also optionally obtain annotation and/or other information from the user regarding the viewing location and/or the surrounding environment, such as for later use in presentation of information regarding that viewing location and/or surrounding environment.

After block 415 is completed, the routine continues to block 420 to determine if there are more viewing locations at which to acquire images, such as based on corresponding information provided by the user of the mobile device. If so, and when the user is ready to continue the process, the routine continues to block 422 to optionally initiate the capture of linking information (including acceleration data) during movement of the mobile device along a travel path away from the current viewing location and towards a next viewing location within the building interior. As described elsewhere herein, the captured linking information may include additional sensor data (e.g., from one or more IMU, or inertial measurement units, on the mobile device or otherwise carried by the user), as well as additional video information, recorded during such movement. Initiating the capture of such linking information may be performed in response to an explicit indication from a user of the mobile device or based on one or more automated analyses of information recorded from the mobile device. In addition, the routine may further optionally monitor the motion of the mobile device in some embodiments during movement to the next viewing location, and provide one or more guidance cues to the user regarding the motion of the mobile device, quality of the sensor data and/or video information being captured, associated lighting/environmental conditions, advisability of capturing a next viewing location, and any other suitable aspects of capturing the linking information. Similarly, the routine may optionally obtain annotation and/or other information from the user regarding the travel path, such as for later use in presentation of information regarding that travel path or a resulting inter-panorama connection link. In block 424, the routine determines that the mobile device has arrived at the next viewing location (e.g., based on an indication from the user, based on the forward movement of the user stopping for at least a predefined amount of time, etc.), for use as the new current viewing location, and returns to block 415 in order to perform the viewing location image acquisition activities for the new current viewing location.

Figure 5A:
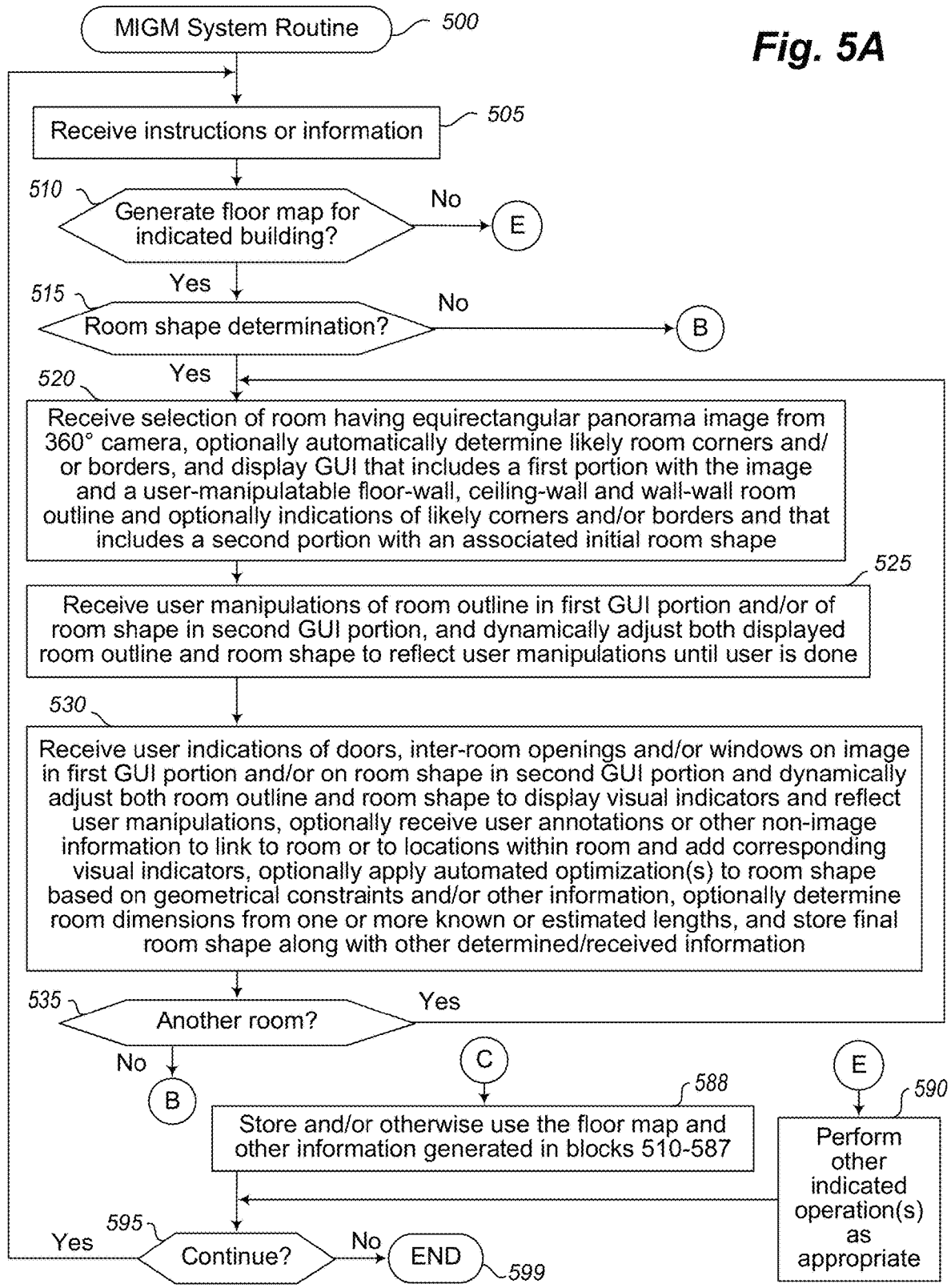
Figure 5C:
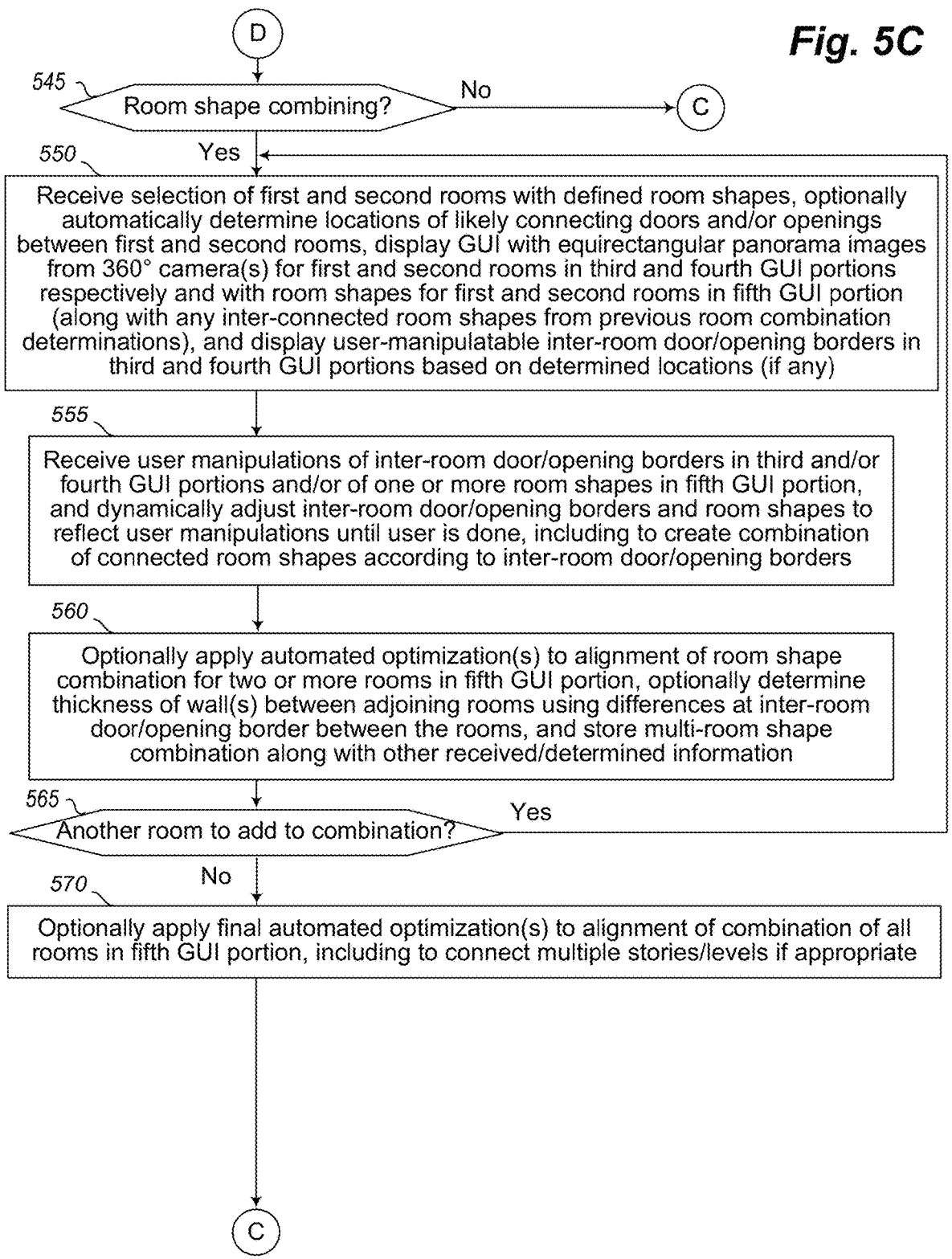

If it is instead determined in block 420 that there are not any more viewing locations at which to acquire image information for the current building or other structure, the routine proceeds to block 425 to optionally analyze the viewing location information for the building or other structure, such as to identify possible additional coverage (and/or other information) to acquire within the building interior. For example, the ICA system may provide one or more notifications to the user regarding the information acquired during capture of the multiple viewing locations and optionally corresponding linking information, such as if it determines that one or more segments of the recorded information are of insufficient or undesirable quality, or do not appear to provide complete coverage of the building. After block 425, the routine continues to block 435 to optionally preprocess the acquired 360° spherical panorama images before their subsequent use for generating related mapping information, such as to perform an equirectangular projection for each such image, such that straight vertical data (e.g., the sides of a typical rectangular door frame, a typical border between 2 adjacent walls, etc.) remains straight and in which straight horizontal data (e.g., the top of a typical rectangular door frame, border between a wall and a floor, etc.) at a horizontal midline of the image remains straight but is increasingly curved in the equirectangular projection image in a convex manner relative to the horizontal midline as the distance increases in the image from the horizontal midline. In block 477, the images and any associated generated or obtained information is stored for later use. FIGS. 5A-5C illustrate one example of a routine for generating a floor map representation of a building interior from the generated panorama information.

If it is instead determined in block 410 that the instructions or other information recited in block 405 are not to acquire images and other data representing a building interior, the routine continues instead to block 490 to perform any other indicated operations as appropriate, such as any housekeeping tasks, to configure parameters to be used in various operations of the system (e.g., based at least in part on information specified by a user of the system, such as a user of a mobile device who captures one or more building interiors, an operator user of the MIGM system, etc.), to obtain and store other information about users of the system, to respond to requests for generated and stored information, etc.

Following blocks 477 or 490, the routine proceeds to block 495 to determine whether to continue, such as until an explicit indication to terminate is received, or instead only if an explicit indication to continue is received. If it is determined to continue, the routine returns to block 405 to await additional instructions or information, and if not proceeds to step 499 and ends.

FIGS. 5A-5C illustrate an example embodiment of a flow diagram for a Mapping Information Generation Manager (MIGM) System routine 500. The routine may be performed by, for example, execution of the MIGM system 140 of FIG. 1A, the MIGM system 389 of FIG. 3, and/or an MIGM system as described elsewhere herein, such as to generate mapping information for a defined area based at least in part on analysis of images (e.g., 360° spherical panorama images) of the area. In the example of FIGS. 5A-5C, the generated mapping information includes a floor map of a building (e.g., a house), but in other embodiments, other types of mapping information may be generated for other types of buildings and used in other manners, as discussed elsewhere herein.

The illustrated embodiment of the routine begins at block 505, where information or instructions are received. The routine continues to block 510 to determine whether the instructions received in block 505 indicate to generate a floor map for an indicated building, optionally along with other related mapping information or other associated information about the building, and if so the routine continues to perform blocks 515-588 to do so, and otherwise continues to block 590.

In block 515, the routine further determines whether the instructions received in block 505 (or subsequently) indicate to determine a room shape of an indicated room in a building, and if so the routine continues to perform blocks 520-535 to do so, and otherwise continues to block 580. In block 520, the routine receives a selection (e.g., from an operator user of the MIGM system) of a 360° spherical panorama image with an equirectangular projection taken in a room of the building and/or of a room of the building having such a 360° spherical panorama image with an equirectangular projection, and proceeds to use the corresponding panorama image to define a shape of the room—as discussed in greater detail elsewhere herein, in situations in which a room has multiple 360° spherical panorama images, only one image may be analyzed in the described manner in some embodiments, or instead other of the additional images may be subsequently analyzed in other embodiments (e.g., to generate a refined version of the room shape based on a combination of information from multiple such analyzed images). In some embodiments, the routine may further perform automated operations to identify candidate locations of borders (e.g., between adjacent walls, between walls and a ceiling, and/or between walls and a floor) and/or corners in the room (such as via image analysis and using machine learning techniques), and then use that information to guide the room shape determination. The routine proceeds in block 520 to display a GUI (or update a previously displayed GUI) to show the panorama image in a first pane or other first portion of the GUI, while including a second pane or other second portion to show a visual representation of the changing room shape as it is being incrementally defined. The routine further overlays the displayed image with user-manipulatable visual border representations that include user-manipulatable visual corner representations at intersections of multiple such border representations, and in embodiments in which candidate locations of borders and/or corners were automatically determined, may use an initial position of the visual border and/or corner representations to be at those determined candidate locations (or allow the user to manually indicate to snap the visual border and/or corner representations to those determined candidate locations if so desired).

After block 520, the routine continues to block 525 to participate in a series of user interactions with the displayed GUI to define an estimate of the room shape for the room, with the user manipulating the visual border representations overlaid on the panorama image to match the visible borders in the image and/or the user manipulating the visual corner representations overlaid on the panorama image to match the visible corners in the image and/or the user manipulating the changing room shape in the second portion of the GUI to reflect shape of the room. As the user manipulates one or more of the visual border representations in the first GUI portion, visual corner representations in the first GUI portion, and/or the room shape in the second GUI portion, the information in both the first and second portions (e.g., the visual border and corner representations in the first GUI portion and the visual room shape in the second GUI portion) are updated to reflect the user manipulations (e.g., simultaneously with the user manipulations) and show the user changes that are made. Once the user is done, the final room shape in the second GUI portion provides a user-defined estimate of the room shape. As noted elsewhere herein, in some embodiments the routine may further perform one or more types of automated modifications to the user-defined room shape estimate to determine the final defined room shape, while in other embodiments the user-defined room shape estimate may be used as the final defined room shape, with non-exclusive examples of such automated modifications including applying shape constraints to increase the likelihood of having straight walls, perpendicular corners and parallel opposite walls (e.g., using a non-linear least squares solver, to correct the user-defined room shape estimate to include such features if the corresponding initial features in the user-defined room shape estimate are within a defined threshold amount of matching such features, etc.).

After the room shape is defined, the routine continues to block 530 to receive user-supplied information about elements of the room, such as structural elements including windows and passages into and/or out of the room (e.g., stairs, doors and other openings in the walls), and optionally non-structural elements of one or more types (e.g., countertops, bath tubs, sinks, fireplaces, other cuboid shapes, etc.). In particular, user-manipulatable visual representations are overlaid on the image in the first GUI portion for each type of element (e.g., sequentially, such as to first specify any doors, then specify any windows, then specify any non-door openings in the walls in or out of the room, etc.) and corresponding locations are visually shown in the defined room shape in the second GUI portion, and as the user manipulates the visual representations in the image in the first GUI portion and/or the visual location indications in the defined room shape in the second GUI portion to identify the locations and sizes of each element of interest, the visual representations in the first GUI portion and the visual location indications in the second GUI portion are updated to reflect the user manipulations (e.g., simultaneously with the user manipulations). In addition, the user may optionally specify other types of information for the room, such as to specify annotations or other descriptive information to be associated with the room or with particular locations in the room, and with the image in the first GUI portion and/or the room shape in the second GUI portion optionally being updated to include visual indicators of such annotations or other descriptive information. The routine may further automatically determine one or more measurements for the room via image analysis and/or receive user input regarding such measurements, such as to use a user-defined door width and/or floor-to-ceiling height to determine a scale to map a relative distance in the defined room shape or image to an actual corresponding distance in the room. After the various types of information for the room have been automatically determined and/or obtained, the defined room shape and additional determined and obtained information is stored for later use.

After block 530, the routine continues to block 535 to determine if there is another room (or another 360° spherical panorama image with an equirectangular projection for a room) for which to determine a room shape and additional related information, and if so returns to block 520. It will be appreciated that while various operations are discussed herein with respect to blocks 520-530 for determining and/or obtaining various types of information for a room, it will be appreciated that such operations made be performed in other orders in other embodiments, and that some such operations may not be performed in some embodiments.

If it is not determined in block 535 that there is another room for which to determine a room shape and additional related information for the room, or if it is not determined in block 515 that received instructions indicate to determine a room shape, the routine continues to block 580 to determine if the instructions received in block 505 (or subsequently) indicate to determine the position of an image in a room, and if so the routine continues to perform blocks 581-587 to do so, and otherwise continues to block 545. In block 581, the routine receives a selection (e.g., from an operator user of the MIGM system) of a room in the building and of an image taken in the room (e.g., a 360° spherical panorama image with an equirectangular projection, a perspective image with rectilinear lines, etc.), and proceeds to determine a position of the image in the room. In some embodiments, the routine may further perform automated operations to identify a candidate position of the image (such as a likely position from image analysis and using machine learning techniques), and then use that information to guide the image position determination. The routine proceeds in block 581 to display a GUI (or update a previously displayed GUI) to show the image in a sixth pane or other portion of the GUI (e.g., in a same or similar location to that of the first pane), while including a seventh pane or other seventh portion (e.g., in a same or similar location of the second pane) to show a visual representation of the room shape for the room with a visual indicator of the image position once it is determined.

In block 583, if the image is a perspective image rather than a 360° spherical panorama image with an equirectangular projection, the routine overlays the displayed image in the sixth GUI portion with two user-locatable visual horizontal indicators, and shows corresponding wall visual indicators in the room shape in the seventh GUI portion—if the image is a 360° spherical panorama image with an equirectangular projection, the routine instead proceeds to block 585. The routine further participates in a series of user interactions with the displayed GUI in block 583 to locate the visual horizontal indicators in horizontal locations along two walls within the room, such as the top or bottom of doors or windows, or the border between a wall and a ceiling or floor. The user also moves the corresponding wall visual indicators in the seventh GUI portion to show those walls on which the corresponding visual horizontal indicators in the sixth GUI portion indicate horizontal spaces. As the user manipulates the visual horizontal indicators in the sixth GUI portion and/or the wall visual indicators in the room shape in the seventh GUI portion, the information in both GUI portions is updated to reflect the user manipulations (e.g., simultaneously with the user manipulations) and show the user changes that are made. The image and the specified horizontal visual indicators are then further analyzed to determine the height of the camera within the room when the image was taken, such as based on the angle between horizontal visual indicators on two adjacent walls.

After block 583 (or after block 581 if the image is a 360° spherical panorama image with an equirectangular projection), the routine in block 585 overlays the displayed image in the sixth GUI portion with three user-locatable visual vertical indicators, and shows corresponding dot location visual indicators in the room shape in the seventh GUI portion. The routine further participates in a series of user interactions with the displayed GUI in block 585 to locate the visual vertical indicators in three vertical locations along one or more walls within the room that are also visually identifiable in the room shape in the seventh GUI portion, such as the sides of doors or windows, or the border between adjacent walls. The user also moves the corresponding location visual indicators in the seventh GUI portion to show the wall locations at which the corresponding visual vertical indicators in the sixth GUI portion are located. As the user manipulates the visual vertical indicators in the sixth GUI portion and/or the location visual indicators in the room shape in the seventh GUI portion, the information in both GUI portions is updated to reflect the user manipulations (e.g., simultaneously with the user manipulations) and show the user changes that are made. The image and the specified vertical visual indicators are then further analyzed to triangulate the location of the camera within the room when the image was taken, such as based on the distance in the image between vertical visual indicators relative to their locations on the walls of the room shape.

After the image location is determined (and the camera height for perspective images), a corresponding visual indicator is added to the room shape at the determined location to represent the image, and an indication of the image is associated with and linked to the visual indicator for later use. After block 585, the routine continues to block 585 to determine if there is another image position to determine, and if so returns to block 581. It will be appreciated that while various operations are discussed herein with respect to blocks 581-585 for determining image position information, it will be appreciated that such operations made be performed in other orders in other embodiments, and that some such operations may not be performed in some embodiments.

If it is not determined in block 587 that there is another image to position, or if it is not determined in block 580 that received instructions indicate to position an image, the routine continues to block 545 to determine if the instructions received in block 505 (or subsequently) indicate to combine room shapes of multiple indicated rooms in a building to determine their relative layout, and if so the routine continues to perform blocks 550-565 to do so, and otherwise continues to block 588. In block 550, the routine receives a first selection (e.g., from an operator user of the MIGM system) of a first 360° spherical panorama image with an equirectangular projection taken in a first room of the building and a second selection (e.g., from the operator user of the MIGM system) of a second 360° spherical panorama image with an equirectangular projection taken in a second room of the building, and/or first and second selections of the first room of the building and the second room of the building, and proceeds to use the first and second panorama images to define relative layouts of the first and second rooms based on one or more inter-room passages between the first and second rooms. In some embodiments, the routine may further perform automated operations to identify candidate locations of each inter-room passage between the first and second rooms in both of the first and second images (such as likely locations from image analysis and using machine learning techniques), and then uses that information to guide the layout determination of the room shapes for the first and second rooms. The routine further proceeds in block 550 to display a GUI (or update a previously displayed GUI) to show the first panorama image in a third pane or other third portion of the GUI (e.g., in the same or similar location at which the first GUI portion was previously displayed) and to show the second panorama image in a fourth pane or other fourth portion of the GUI, while including a fifth pane or other fifth portion of the GUI (e.g., in the same or similar location at which the second GUI portion was previously displayed) to show a visual representation of the changing relative locations of the first and second room shapes. The routine further overlays the displayed first image with a user-manipulatable first visual inter-room passage representation and overlays the displayed second image with a user-manipulatable second visual inter-room passage representation, and in embodiments in which candidate inter-room passage locations were automatically determined, may use an initial position of the first and second visual passage representations in the first and second images, respectively, to be at those determined candidate locations for the first and second images (or allow the user to manually indicate to snap one or both of the visual passage representations to their corresponding determined candidate location if so desired). In one or both of the first and second images, the routine may further in some embodiments overlay a visual room border representation of the other room, such that a difference between room border representations for the first and second rooms in one of the first and second images may reflect a width of the wall between the first and second rooms.

After block 550, the routine continues to block 555 to participate in a series of user interactions with the displayed GUI to define an estimate of the relative layouts of the room shapes for the first and second rooms, with the user manipulating the visual passage representations overlaid on the first and second panorama images in the third and fourth GUI portions, respectively, to match the inter-room passages between the first and second rooms that are visible in the first and second images, and/or the user manipulating the relative room shape layouts in the fifth portion of the GUI to reflect the layouts of the room shapes for the first and second rooms. As the user manipulates one or more of the visual passage representations in the third and/or fourth GUI portions, and/or the layout of the room shapes in the fifth GUI portion, the information in the third, fourth and fifth GUI portions (e.g., the visual passage representations in the third and fourth GUI portions and the visual layouts of the room shapes in the fifth GUI portion) is updated to reflect the user manipulations (e.g., simultaneously with the user manipulations) and show the user changes that are made. By connecting an inter-room passage between the first and second rooms, the location of the inter-room passage in the first room and the location of the inter-room passage are connected (e.g., are at the same location in the layout of the room shapes, minus any wall width between the room shapes). Similarly, if the first image is overlaid with visual room borders representing the second room (e.g., visible through the inter-room passage in the first image) and the second image is overlaid with visual room borders representing the first room (e.g., visible through the inter-room passage in the second image), the visual layouts of the room shapes in the fifth GUI portion may be updated to reflect additional user manipulations to further specify a location of those visual room borders (e.g., simultaneously with the user manipulations) and show the user changes that are made, such as to specify the width of the walls corresponding to the locations of those visual room borders. Once the user is done with the user manipulations for the first and second rooms, the final layouts of the room shapes for the first and second rooms in the fifth GUI portion provides a user-defined estimate of the layout of the room shapes.

The routine in block 560 then optionally applies one or more automated optimizations to the alignment of the room shape layout for the first and second rooms, such as to reflect the determined thickness of a wall between the rooms, and if so the resulting room shape layout in the fifth GUI portion for the first and second rooms will be stored for later use—if such an optimization is not performed at that time, the results of the room shape layout in the fifth GUI portion from block 555 will instead be stored for later use. It will be further appreciated that during later loops through blocks 550 and 555, the layouts of additional room shapes may be specified in an incremental manner to add on the previously specified layouts of at least the room shapes for the first and second rooms (and for other additional rooms as they are added), and the layout information for additional rooms may be further used to specify the relative layouts of the room shapes for all of those rooms. For example, if the room shape for a third room is subsequently added to the room layout combination for the first and second rooms, information about the third room may further assist in refining the relative layout of the first and second rooms, such as based on the shape of the third room (e.g., to prevent the room shapes of the first and second rooms from overlapping with the room shape of the third room). Similarly, if inter-room passages between the third room and the first room and between the third room and the second room exist, connecting those passages between those rooms will, when combined with the previously defined inter-room passage between the first and second rooms, cause the overall room shape layout for the first and second and third rooms to be consistent with the locations of all of those inter-room passages. Thus, after block 560, the routine continues to block 565 to determine if there are other rooms to add to the layout of room shapes, and if so returns to block 550.

If there are not more rooms to add to the layout, the routine continues to block 570 to optionally perform a final optimization of the layout of all of the rooms to determine a final automated room layout—if the final optimization is not performed, the existing layout of the rooms from the last pass through blocks 550-560 may be used as the final automated room layout. In the illustrated embodiment, if stairs or other connecting passages between stories or other levels of the building were not specified, they may be further specified in block 570 in a manner similar to that discussed in blocks 550-560, such as to connect the floor maps for different stories or levels of the building. In addition, while not illustrated in routine 500, one or more MIGM system users may perform final touch-ups to the final automated room layout to product the final floor map to be used, such as to produce a consistent style (e.g., line widths, colors, text styles, etc.), to add textual room labels if not previously specified and/or to place the textual room labels at preferred locations on the final floor map, to add missing spaces such as small closets, to correct any geometric anomalies, to modify locations of images and/or other associated and linked information, etc. It will be appreciated that while various operations are discussed herein with respect to blocks 550-570 for determining room shape layouts for a building, it will be appreciated that such operations made be performed in other orders in other embodiments, and that some such operations may not be performed in some embodiments.

After block 570, or if it is not determined in block 545 that received instructions indicate to determine room layout information for two or more rooms, the routine continues to block 588 to store and/or otherwise use the generated floor map information and optionally other generated information, such as to provide the generated information for display on one or more client devices, provide that generated information to one or more other devices for use in automating navigation of those devices and/or associated vehicles or other entities, etc. The generated floor map may include, for example, relative position and shape information for the various rooms without providing any actual dimension information for the individual rooms or building as a whole, and may further include multiple linked or associated sub-maps (e.g., to reflect different stories, levels, sections, etc.) of the building—it will be appreciated that if sufficiently detailed dimension information is obtained (e.g., as discussed with respect to block 530), a floor plan may be generated from the floor map that includes dimension information for the rooms and the overall building. While not illustrated in routine 500, in other embodiments the routine may generate other types of mapping information for the building, whether instead of or in addition to a 2D schematic floor map as discussed for this example embodiment of routine 500—non-exclusive examples of other mapping information include a 2.5D texture map in which 360° spherical panorama images can optionally be re-projected on the geometry of the displayed texture map, a 3D structure that illustrates accurate height information as well as width and length (and in which 360° spherical panorama images can optionally be re-projected on the geometry of the displayed 3D structure), etc. In addition, in some embodiments additional information may be generated and used, such as to determine a geographical alignment (e.g., with respect to true north or magnetic north) and/or geographical location (e.g., with respect to latitude and longitude, or GPS coordinates) for the building and corresponding parts of the generated floor map, and to optionally further align with other external information (e.g., satellite or other external images, including street-level images to provide a 'street view' of the building; neighborhood information, such as nearby street maps and/or points of interest; etc.). Other information about the building may also be retrieved from, for example, one or more external sources (e.g., online databases, 'crowd-sourced' information provided by one or more end users, etc.), and associated with and linked to the floor map and/or particular locations within the floor map—such additional information may further include, for example, exterior dimensions and/or shape of the building, additional images and/or annotation information acquired corresponding to particular locations within the building (optionally for locations different from viewing locations of the acquired panorama or other images), etc.

If it is instead determined in block 510 that the information or instructions received in block 505 are not to generate a floor map for an indicated building, the routine continues instead to block 590 to perform one or more other indicated operations as appropriate. Such other operations may include, for example, receiving and responding to requests for previously generated floor maps and/or other generated information (e.g., requests for such information for display on one or more client devices and/or to provide to one or more other devices for use in automated navigation), obtaining and storing information about buildings for use in later floor map generation operations (e.g., information about exterior images, dimensions, numbers or types of rooms, total square footage, etc.), etc.

After blocks 588 or 590, the routine continues to block 595 to determine whether to continue, such as until an explicit indication to terminate is received. If it is determined to continue, the routine returns to block 505 to wait for and receive additional instructions or information, and otherwise continues to block 599 and ends.

Figure 6:
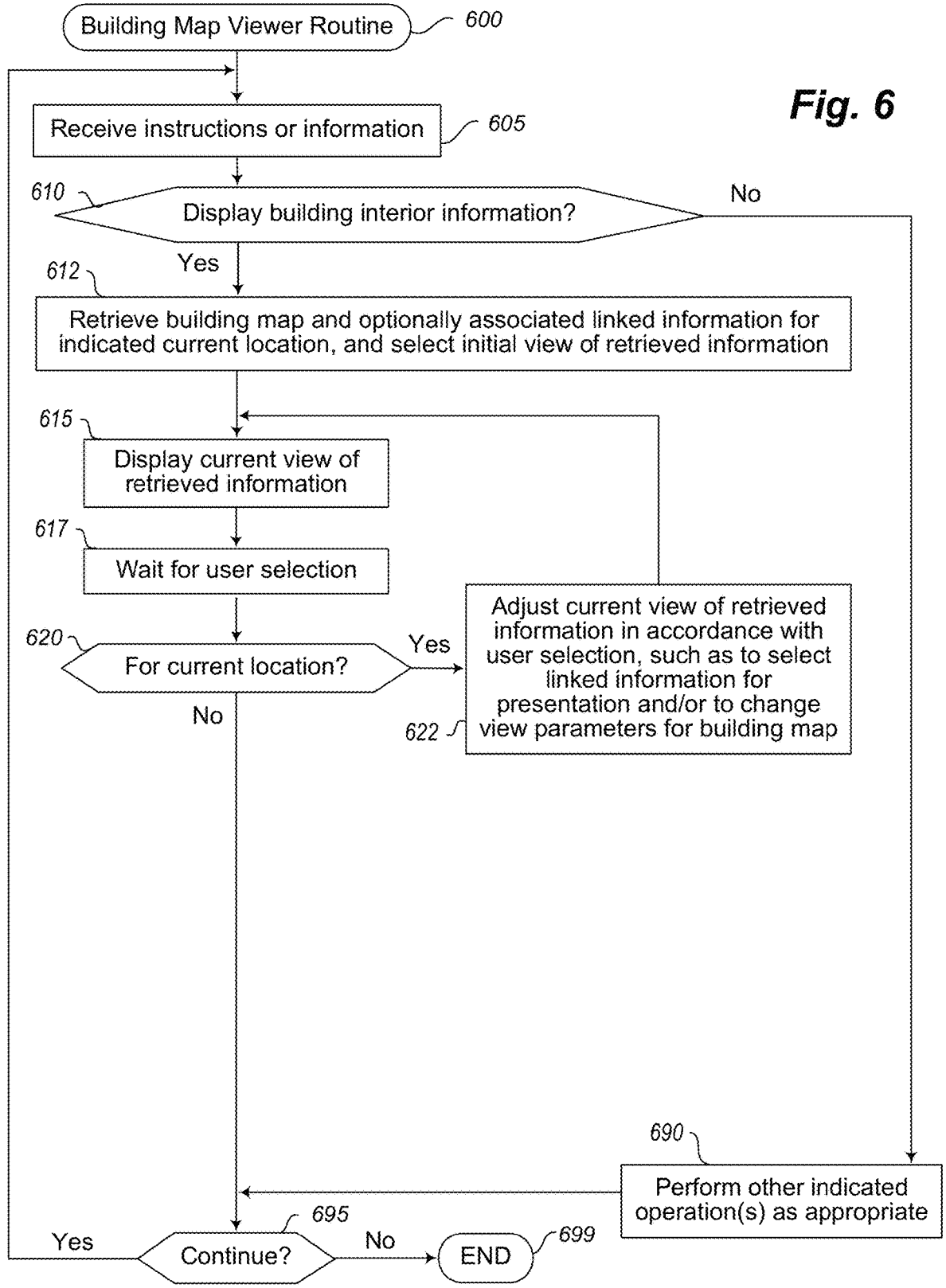
FIG. 6 illustrates an example embodiment of a flow diagram for a Building Map Viewer system routine in accordance with an embodiment of the present disclosure.

FIG. 6 illustrates an example embodiment of a flow diagram for a Building Map Viewer system routine 600. The routine may be performed by, for example, execution of a map viewer client computing device 175 and its software system(s) (not shown) of FIG. 1A, a client computing device 390 of FIG. 3, and/or a mapping information viewer or presentation system as described elsewhere herein, such as to receive and display mapping information (e.g., a floor map, whether 2D, 3D, 2.5D or other format) for a defined area, including to display images (e.g., 360° spherical panorama images) and/or other information associated with particular locations in the mapping information. In the example of FIG. 6, the presented mapping information is based on a floor map of a building (such as a house) that may optionally have additional associated linked information (e.g., images taken within the building, sounds recorded within the building, annotations or other descriptive information associated with particular locations within the building, etc.), but in other embodiments, other types of mapping information may be presented for other types of buildings or environments and used in other manners, as discussed elsewhere herein.

The illustrated embodiment of the routine begins at block 605, where instructions or information are received. At block 610, the routine determines whether the received instructions or information indicate to display or otherwise present information representing a building interior, and if not continues to block 690. Otherwise, the routine proceeds to block 612 to retrieve a floor map for the building and optionally indications of associated linked information for the floor map and/or a surrounding location, and selects an initial view of the retrieved information (e.g., a view of the floor map). In block 615, the routine then displays or otherwise presents the current view of the retrieved information, and waits in block 617 for a user selection. After a user selection in block 617, if it is determined in block 620 that the user selection corresponds to the current location (e.g., to change the current view), the routine continues to block 622 to update the current view in accordance with the user selection, and then returns to block 615 to update the displayed or otherwise presented information accordingly. The user selection and corresponding updating of the current view may include, for example, displaying or otherwise presenting a piece of associated linked information that the user selects (e.g., a particular image), changing how the current view is displayed (e.g., zooming in or out, rotating information if appropriate, selecting a new portion of the current view to be displayed or otherwise presented that was not previously visible, etc.).

If it is instead determined in block 610 that the instructions or other information recited in block 605 are not to present information representing a building interior, the routine continues instead to block 690 to perform any other indicated operations as appropriate, such as any housekeeping tasks, to configure parameters to be used in various operations of the system (e.g., based at least in part on information specified by a user of the system, such as a user of a mobile device who captures one or more building interiors, an operator user of the MIGM system, etc.), to obtain and store other information about users of the system, to respond to requests for generated and stored information, etc.

Following block 690, or if it is determined in block 620 that the user selection does not correspond to the current location, the routine proceeds to block 695 to determine whether to continue, such as until an explicit indication to terminate is received, or instead only if an explicit indication to continue is received. If it is determined to continue (e.g., if the user made a selection in block 617 related to a new location to present), the routine returns to block 605 to await additional instructions or information (or to continue on to block 612 if the user made a selection in block 617 related to a new location to present), and if not proceeds to step 699 and ends.

Non-exclusive example embodiments described herein are further described in the following clauses.

A01. A computer-implemented method for one or more computing devices to perform automated operations comprising:

obtaining, by the one or more computing devices, a plurality of images taken at a plurality of viewing locations within multiple rooms of a building, and defined room shapes for the multiple rooms and locations of inter-room openings between at least some of the multiple rooms that are determined based at least in part on visual data of the plurality of images;

determining, by the one or more computing devices and for a room combination of two or more rooms of the multiple rooms, a predicted room layout that includes relative positions of the defined room shapes of the two or more rooms based at least in part on locations of at least one of the inter-room openings in the defined room shapes of the two or more rooms;

presenting, by the one or more computing devices via a displayed graphical user interface (GUI) displayed to one or more users, a visual representation of the predicted room layout showing the relative positions of the defined room shapes of the two or more rooms, and receiving input from the one or more users for the predicted room layout to specify a final room layout of the defined room shapes of the two or more rooms that has final relative positions of the defined room shapes of the two or more rooms;

generating, by the one or more computing devices, at least a partial building floor map using the final room layout with the defined room shapes for the two or more rooms; and providing, by the one or more computing devices, the generated at least partial building floor map for further use.

A02. A computer-implemented method for one or more computing devices to perform automated operations comprising:

obtaining, by the one or more computing devices, a plurality of images taken at a plurality of viewing locations within a room of a building, and, for each of the plurality of images, a defined partial room shape for part of the room that is visible in that image and that is determined based at least in part on visual data of that image;

determining, by the one or more computing devices, a predicted overall room shape of the room based on combining the defined partial room shapes from the plurality of images, including matching one or more portions of the room that is each visible in at least two of the plurality of images;

presenting, by the one or more computing devices via a displayed graphical user interface (GUI) displayed to one or more users, a visual representation of the predicted overall room shape showing relative positions of the defined partial room shapes from the plurality of images, and receiving input from the one or more users for the predicted overall room shape to specify a final room shape of the room;

generating, by the one or more computing devices, at least a partial building floor map using the final room shape of the room; and providing, by the one or more computing devices, the generated at least partial building floor map for further use.

A03. A computer-implemented method for one or more computing devices to perform automated operations comprising:
   obtaining, by the one or more computing devices and for each of multiple rooms of a building, a defined room shape for the room that is determined based at least in part on visual data of one or more images taken at one or more viewing locations within the room;
   determining, by the one or more computing devices, relative positions of the defined room shapes for the multiple rooms based at least in part on locations of inter-room openings between at least some of the multiple rooms;
   presenting, by the one or more computing devices and via a displayed graphical user interface (GUI) displayed to one or more users, visual representations of a room layout showing the relative positions of the defined room shapes, and a visual guide that represents a location of a wall of the building that extends through two or more rooms of the multiple rooms;
   receiving, by the one or more computing devices, input from the one or more users via the displayed GUI for the room layout to specify a revised room layout by adjusting one or more of the defined room shapes to match at least one wall of each of the one or more defined room shapes to the presented visual guide;
   generating, by the one or more computing devices, at least a partial building floor map using the revised room layout with the defined room shapes; and
   providing, by the one or more computing devices, the generated at least partial building floor map for further use.

A04. The computer-implemented method of any one of clauses A01-A03 further comprising determining, by the one or more computing devices and based at least in part on the final room layout of the defined room shapes of the two or more rooms, positions of one or more images of the plurality of images in the final room layout and within at least one room shape of the defined room shapes of the two or more rooms.

A05. The computer-implemented method of clause A04 wherein the one or more images are part of a cluster of multiple images of the plurality of images that are aligned in a common coordinate system and that include one or more additional images having acquisition locations that are outside the two or more rooms, wherein the determining of the positions further includes determining additional positions of the one or more additional images outside of and relative to the defined room shapes of the two or more rooms, and wherein the method further comprises presenting, by the one or more computing devices via the displayed GUI, a visual representation of the at least partial building floor map that shows the defined room shapes of the two or more rooms of the final room layout and that further shows one or more indicators of the one or more additional images outside of the defined room shapes of the two or more rooms of the final room layout.

A06. The computer-implemented method of any one of clauses A01-A05 further comprising:
   presenting, by the one or more computing devices and before the presenting of the visual representation of the predicted room layout, information in the displayed GUI for use in generating the at least partial building floor map, including a display of the defined room shape for one room of the two or more rooms and one or more displayed visual indicators of one or more images of the plurality of images that are acquired at locations outside of the one room; and
   receiving, by the one or more computing devices and via one or more interactions of the one or more users with the presented information in the displayed GUI, a selection of an image of the one or more images that is acquired at a location inside another room of the two or more rooms different from the one room,
   and wherein the presenting of the visual representation of the predicted room layout is performed in response to the selection of the image acquired inside the another room of the two or more rooms.

A07. The computer-implemented method of clause A06 wherein the one or more visual indicators of the one or more images are displayed in a user-selectable manner, and wherein the selection of the image is performed via an interaction of one of the one or more users with a respective one of the one or more visual indicators for the selected image.

A08. The computer-implemented method of clause A07 further comprising, before the selection of the image via the respective one visual indicator for the selected image:
   receiving, by the one or more computing devices and via one or more further interactions of the one user with the respective one visual indicator for the selected image, an indication of the respective one visual indicator for the selected image; and
   displaying, by the one or more computing devices and in the displayed GUI in response to the indication of the respective one visual indicator for the selected image, a visual representation of at least some of the another room that is generated at least in part from visual data of the selected image,
   and wherein the interaction of the one user with the respective one visual indicator for the selected image is further performed based at least in part on the displayed visual representation of the at least some of the another room.

A09. The computer-implemented method of any one of clauses A01-A08 wherein the receiving of the input from the one or more users to specify the final room layout includes receiving, by the one or more computing devices, information about one or more adjustments by the one or more users for at least one of one or more of the relative positions of the defined room shapes in the presented visual representation of the predicted room layout, or one or more shapes of one or more of the defined room shapes in the presented visual representation of the predicted room layout.

A10. The computer-implemented method of any one of clauses A01-A09 further comprising, before the obtaining of the defined room shapes for the multiple rooms:
   obtaining, by the one or more computing devices, and for each of multiple images of the plurality of images that are acquired in multiple viewing locations within one of the rooms of the multiple rooms, a defined partial room shape for part of the one room that is visible in that image and that is determined based at least in part on visual data of that image;
   determining, by the one or more computing devices, a predicted overall room shape of the one room based on combining the defined partial room shapes, including matching one or more portions of the one room that is each visible in at least two of the multiple images; and
   presenting, by the one or more computing devices via the displayed GUI, a further visual representation of the predicted overall room shape showing relative positions of the defined partial room shapes, and receiving further input from the one or more users for the predicted overall room shape to specify a final room shape of the one room, and wherein the final room shape of the one room is the obtained defined room shape for the one room.

A11. The computer-implemented method of any one of clauses A01-A10 further comprising, before the presenting of the visual representation of the predicted room layout:

determining, by the one or more computing devices, a visual guide that represents a location of a wall of the building that extends through at least two rooms of the two or more rooms;

presenting, by the one or more computing devices and via the displayed GUI, the visual guide overlaid on a displayed visual representation of an initial version of the predicted room layout; and receiving, by the one or more computing devices, further input from the one or more users via the displayed GUI to specify a revised version of the predicted room layout by adjusting one or more of the defined room shapes of the two or more rooms to match at least one wall of each of the one or more defined room shapes to the presented visual guide, and wherein the predicted room layout whose visual representation is presented in the displayed GUI is the revised version of the predicted room layout.

A12. The computer-implemented method of any one of clauses A01-A11 further comprising:

presenting, by the one or more computing devices and via the displayed GUI, one of the plurality of images that is captured in one of the two or more rooms, and overlaying at least some of the defined room shape for another of the two or more rooms on the presented one image at one or more locations corresponding to the relative position of the defined room shape for the another room with regard to the defined room shape for the one room;

receiving, by the one or more computing devices, further input from the one or more users via the displayed GUI to specify a revised version of the relative position of the defined room shape for the another room with regard to the defined room shape for the one room by adjusting the one or more locations of the overlaid at least some of the defined room shape;

determining, by the one or more computing devices, a thickness of a wall between the another room and the one room based on the revised version of the relative position, and wherein the final relative positions of the defined room shapes of the two or more rooms specified by the input from the one or more users includes the revised version of the relative position of the defined room shape for the another room with regard to the defined room shape for the one room, with a distance between the defined room shapes for the one room and the another room that is based on the determined thickness.

A13. The computer-implemented method of clause A12 wherein the two or more rooms include one or more additional rooms separate from the one room and from the another room, and wherein the determining of the predicted room layout that includes the relative positions of the defined room shapes of the two or more rooms includes predicting, between one or more walls of the one or more additional rooms and at least one wall of the defined room shapes for the one room and the another room, a distance using the determined thickness of the wall between the another room and the one room.

A14. The computer-implemented method of any one of clauses A01-A13 further comprising:

presenting, by the one or more computing devices and via the displayed GUI, one or more of the plurality of images;

receiving, by the one or more computing devices, further input from the one or more users via the displayed GUI to specify one or more locations of one or more points of interest in visual data of the one or more images, wherein each of the one or more points of interest is at least one of an electrical outlet, a cable outlet, a window, a doorway, a non-doorway wall opening, a furnishing, a piece of furniture, a lighting fixture, a plumbing fixture, a vent, a pipe, a conduit, a light switch, a user-manipulatable control element, a floor covering, a counter covering, a wall covering, a cabinet, a kitchen island, a built-in structure, a type of ceiling, a type of floor, or an appliance;

determining, by the one or more computing devices, a position of each of the one or more locations of the one or more points of interest in one of the multiple rooms; and adding, by the one or more computing devices, information to the at least partial building floor map to indicate the one or more locations of the one or more points of interest on the at least partial building floor map, and wherein the provided generated at least partial building floor map includes the added information.

A15. The computer-implemented method of any one of clauses A01-A14 further comprising:

presenting, by the one or more computing devices and via the displayed GUI, two or more of the plurality of images;

receiving, by the one or more computing devices, further input from the one or more users via the displayed GUI to specify a common location visible in each of the two or more images, wherein the common location is at least one of one or more points corresponding to a window, or one or more points corresponding to a doorway, or one or more points corresponding to a non-doorway wall opening, or one or more points on a floor, or one or more points on a ceiling; and determining, by the one or more computing devices, inter-image pose information between acquisition locations of the two or more images using the specified common location, and wherein the determining of the predicted room layout is further based at least in part on the determined inter-image pose information.

A16. The computer-implemented method of any one of clauses A01-A15 wherein the receiving of the input from the one or more users for the predicted room layout to specify the final room layout includes receiving, by the one or more computing devices, information from the one or more users about one or more spaces in the predicted room layout between at least two of the two or more rooms that are not part of the determined room shapes of the two or more rooms; and adding, by the one or more computing devices, the information to the at least partial building floor map about the one or more spaces, and wherein the provided generated at least partial building floor map includes the added information.

A17. The computer-implemented method of any one of clauses A01-A16 further comprising, before the presenting of the visual representation of the predicted room layout:

analyzing, by the one or more computing devices, the plurality of images to generate multiple groups of images, wherein each of the groups includes one or more images of the plurality of images that each has visual data for a common location, and wherein one of the multiple groups includes at least two images of the plurality of images that are captured in the two or more rooms, and wherein the determining of the predicted room layout that includes the relative positions of the defined room shapes of the two or more rooms is performed based at least in part on the one group including the at least two images captured in the two or more rooms.

A18. The computer-implemented method of clause A17 wherein the presenting of the visual representation of the predicted room layout showing the relative positions of the defined room shapes of the two or more rooms includes displaying the visual representation to a first user of the one or more users, and wherein the method further comprises, for each of one or more additional groups of the multiple groups separate from the one group:

determining, by the one or more computing devices and for an additional room combination of two or more additional rooms of the multiple rooms that are visible in the visual data of the one or more images of that additional group, an additional predicted room layout that includes relative positions of the defined room shapes of the two or more additional rooms;

presenting, by the one or more computing devices to a second user separate from the first user and via a GUI displayed to the second user, an additional visual representation of the additional predicted room layout, and receiving additional input from the second user for the additional predicted room layout to specify an additional final room layout of the defined room shapes of the two or more additional rooms that has final relative positions of the defined room shapes of the two or more additional rooms, and wherein the generating of the at least partial building floor map further includes using, for each of the one or more additional groups, the additional final room layout of the defined room shapes of the two or more additional rooms of that additional group.

A19. The computer-implemented method of any one of clauses A01-A18 further comprising, before the obtaining of the defined room shapes for the multiple rooms:

analyzing, by the one or more computing devices, the plurality of images to generate multiple groups of images, wherein each of the groups includes multiple images of the plurality of images that each has visual data showing at least part of a common room of the multiple rooms; and generating, by the one or more computing devices and for each of the multiple groups of images, the defined room shape for the common room shown in the visual data of the multiple images for that group, including:

determining a predicted room shape that includes relative positions of partial room shapes generated from the visual data of the multiple images for that group based at least in part on one or more common locations in the common room that are visible in the visual data of the multiple images for that group; and presenting, by the one or more computing devices via the displayed GUI, an additional visual representation of the predicted room shape, and receiving additional input from the one or more users for the predicted room shape to specify a final room shape of the common room that has final relative positions of the partial room shapes generated from the visual data of the multiple images for that group, and wherein the obtaining of the defined room shapes for the multiple rooms includes using the final room shape for the common room of each of the multiple groups of images.

A20. The computer-implemented method of clause A19 further comprising:

repeatedly determining, by the one or more computing devices and during the generating of the defined room shape for the common room for each of the multiple groups of images, an amount of progress in completing the generating of the defined room shape for the common room for each of the multiple groups of images; and repeatedly presenting, by the one or more computing devices and via the displayed GUI, a visual indication of the repeated determined amount of progress.

A21. The computer-implemented method of any one of clauses A01-A20 further comprising, before the obtaining of the defined room shapes for the multiple rooms:

analyzing, by the one or more computing devices, the plurality of images to generate multiple groups of images, wherein each of the groups includes multiple images of the plurality of images that each has visual data showing at least part of a common room of the multiple rooms; and generating, by the one or more computing devices and for each of the multiple groups of images, an initial room shape for the common room shown in the visual data of the multiple images for that group, including:

determining, by the one or more computing devices, one of the multiple images for that group to use in generating an initial room shape for the common room shown in the visual data of the multiple images for that group, including ranking each of the multiple images for that group based on one or more prediction confidences for one or more determined locations of at least one of a wall of that common room, a corner of that common room, a doorway of that common room, a window of that common room, a non-doorway wall opening of that common room, a distance to a structure in that common room, or an amount of occlusion of walls in that common room; and generating, by the one or more computing devices, the initial room shape for the common room shown in the visual data of the multiple images for that group by analyzing the determined one image for that group, and wherein the obtaining of the defined room shapes for the multiple rooms includes using, for the common room of each of the multiple groups of images, information based on the initial room shape for that common room.

A22. The computer-implemented method of clause A21 further comprising:

presenting, by the one or more computing devices via the displayed GUI, and for each of the multiple groups of images, an additional visual representation of the generated initial room shape for the common room shown in the visual data of the multiple images for that group; and receiving, by the one or more computing devices and for each of the multiple groups of images, additional input from the one or more users to adjust the generated initial room shape to specify a final room shape of the common room shown in the visual data of the multiple images for that group, and wherein the using of the information for the common room of each of the multiple groups of images includes using the final room shape for that common room that is adjusted from the generated initial room shape for that common room.

A23. The computer-implemented method of any one of clauses A21-A22 further comprising:

repeatedly determining, by the one or more computing devices and during the generating for each of the multiple groups of images of the initial room shape for the common room shown in the visual data of the multiple images for that group, an amount of progress in completing the generating of the initial room shape for the common room for each of the multiple groups of images; and repeatedly presenting, by the one or more computing devices and via the displayed GUI, a visual indication of the repeated determined amount of progress.

A24. The computer-implemented method of any one of clauses A01-A23 wherein the receiving of the input from the one or more users to specify the final room shape of the room includes receiving, by the one or more computing devices, information about one or more adjustments by the one or more users for at least one of one or more of the relative positions of the defined partial room shape in the presented visual representation of the predicted overall room shape, or one or more of the defined partial room shapes in the presented visual representation of the predicted overall room shape.

A25. The computer-implemented method of any one of clauses A01-A24 wherein each of the defined partial room shapes includes one or more wall openings, and wherein the combining of the defined partial room shapes includes matching locations in the defined partial room shapes of at least some of the wall openings.

A26. The computer-implemented method of any one of clauses A01-A25 wherein the receiving of the input from the one or more users to specify the revised room layout includes receiving information about one or more adjustments by the one or more users for at least one of a relative position of one of the one or more defined room shapes in the presented visual representation of the room layout, or a shape of one of the one or more defined room shapes in the presented visual representation of the room layout.

A27. The computer-implemented method of any one of clauses A01-A26 further comprising determining a location of the visual guide based at least in part on identifying, using the relative positions of the defined room shapes, one or more walls of one or more of the defined room shapes whose locations in the relative positions are within a defined threshold distance of each other, and using the locations of the one or more defined room shapes as part of the determining of the location of the visual guide.

A28. A computer-implemented method comprising multiple steps to perform automated operations that implement described techniques substantially as disclosed herein.

B01. A non-transitory computer-readable medium having stored executable software instructions and/or other stored contents that cause one or more computing devices to perform automated operations that implement the method of any of clauses A01-A28.

B02. A non-transitory computer-readable medium having stored executable software instructions and/or other stored contents that cause one or more computing devices to perform automated operations that implement described techniques substantially as disclosed herein.

C01. One or more computing devices comprising one or more hardware processors and one or more memories with stored instructions that, when executed by at least one of the one or more hardware processors, cause the one or more computing devices to perform automated operations that implement the method of any of clauses A01-A28.

C02. One or more computing devices comprising one or more hardware processors and one or more memories with stored instructions that, when executed by at least one of the one or more hardware processors, cause the one or more computing devices to perform automated operations that implement described techniques substantially as disclosed herein.

D01. A computer program adapted to perform the method of any of clauses A01-A28 when the computer program is run on a computer.

Aspects of the present disclosure are described herein with reference to flowchart illustrations and/or block diagrams of methods, apparatus (systems), and computer program products according to embodiments of the present disclosure. It will be appreciated that each block of the flowchart illustrations and/or block diagrams, and combinations of blocks in the flowchart illustrations and/or block diagrams, can be implemented by computer readable program instructions. It will be further appreciated that in some implementations the functionality provided by the routines discussed above may be provided in alternative ways, such as being split among more routines or consolidated into fewer routines. Similarly, in some implementations illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, or synchronous or asynchronous) and/or in a particular order, in other implementations the operations may be performed in other orders and in other manners. Any data structures discussed above may also be structured in different manners, such as by having a single data structure split into multiple data structures and/or by having multiple data structures consolidated into a single data structure. Similarly, in some implementations illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by corresponding claims and the elements recited by those claims. In addition, while certain aspects of the invention may be presented in certain claim forms at certain times, the inventors contemplate the various aspects of the invention in any available claim form. For example, while only some aspects of the invention may be recited as being embodied in a computer-readable medium at particular times, other aspects may likewise be so embodied.

What is claimed is:

1. A computer-implemented method comprising:
obtaining, by one or more computing devices, a plurality of images taken at a plurality of viewing locations within multiple rooms of a building, and defined room shapes for the multiple rooms, and locations of inter-room openings in the defined room shapes between at least some of the multiple rooms that are determined based at least in part on visual data of the plurality of images;

determining, by the one or more computing devices and for a room combination of two or more rooms of the multiple rooms, a predicted room layout that includes relative positions of the defined room shapes of the two or more rooms based at least in part on locations of at least one of the inter-room openings in the defined room shapes of the two or more rooms;

presenting, by the one or more computing devices via a displayed graphical user interface (GUI) displayed to one or more users, a visual representation of the predicted room layout showing the relative positions of the defined room shapes of the two or more rooms, and receiving input from the one or more users for the predicted room layout to specify a final room layout of the defined room shapes of the two or more rooms that has final relative positions of the defined room shapes of the two or more rooms;

generating, by the one or more computing devices, at least a partial building floor map using the final room layout with the defined room shapes for the two or more rooms; and providing, by the one or more computing devices, the generated at least partial building floor map for further use.

2. The computer-implemented method of claim 1 further comprising determining, by the one or more computing devices and based at least in part on the final room layout of the defined room shapes of the two or more rooms, positions of one or more images of the plurality of images in the final room layout and within at least one room shape of the defined room shapes of the two or more rooms, and wherein the generating of the at least partial building floor map includes indicating the determined positions of the one or more images on the generated at least partial building floor map.

3. The computer-implemented method of claim 2 wherein the one or more images are part of a cluster of multiple images of the plurality of images that are aligned in a common coordinate system and that include one or more additional images having acquisition locations that are outside the two or more rooms, wherein the determining of the positions further includes determining additional positions of the one or more additional images outside of and relative to the defined room shapes of the two or more rooms, and wherein the method further comprises presenting, by the one or more computing devices via the displayed GUI, a visual representation of the at least partial building floor map that shows the defined room shapes of the two or more rooms of the final room layout with the determined positions of the one or more images and that further shows one or more indicators of the one or more additional images outside of the defined room shapes of the two or more rooms of the final room layout.

4. The computer-implemented method of claim 2 further comprising, before the determining of the predicted room layout that includes the relative positions of the defined room shapes of the two or more rooms, determining, by the one or more computing devices, initial positions of the plurality of images within the defined room shapes, and wherein the determining of the positions of the one or more images in the final room layout includes adjusting the initial positions of those one or more images within the at least one room shape based at least in part on one or more changes in the specified final room layout relative to the predicted room layout.

5. The computer-implemented method of claim 1 further comprising:

presenting, by the one or more computing devices and before the presenting of the visual representation of the predicted room layout, information in the displayed GUI for use in generating the at least partial building floor map, including a displayed first visual representation of the defined room shape for a first room of the two or more rooms and one or more displayed visual indicators of one or more images of the plurality of images that are acquired at locations outside of the first room; and receiving, by the one or more computing devices and via one or more interactions of the one or more users with the presented information in the displayed GUI, a selection of an image of the one or more images that is acquired at a location inside another second room of the two or more rooms different from the first room, and wherein the presenting of the visual representation of the predicted room layout is performed in response to the selection of the image acquired inside the second room of the two or more rooms.

6. The computer-implemented method of claim 5 wherein the one or more visual indicators of the one or more images are displayed in a user-selectable manner, and wherein the selection of the image is performed via an interaction of one of the one or more users with a respective one of the one or more visual indicators for the selected image.

7. The computer-implemented method of claim 6 further comprising, before the selection of the image via the respective one visual indicator for the selected image:

receiving, by the one or more computing devices and via one or more further interactions of the one user with the respective one visual indicator for the selected image, an indication of the respective one visual indicator for the selected image; and displaying, by the one or more computing devices and in the displayed GUI in response to the indication of the respective one visual indicator for the selected image, a second visual representation of at least some of the second room that is generated at least in part from visual data of the selected image and that is positioned relative to the first visual representation of the first room, and wherein the interaction of the one user with the respective one visual indicator for the selected image is further performed based at least in part on the displayed second visual representation of the at least some of the second room.

8. The computer-implemented method of claim 1 wherein the receiving of the input from the one or more users to specify the final room layout includes receiving, by the one or more computing devices, information about one or more adjustments by the one or more users for at least one of one or more of the relative positions of the defined room shapes in the presented visual representation of the predicted room layout, or one or more shapes of one or more of the defined room shapes in the presented visual representation of the predicted room layout, and wherein the generating of the at least partial building floor map includes using the information about the one or more adjustments as part of the final room layout.

9. The computer-implemented method of claim 1 further comprising, before the obtaining of the defined room shapes for the multiple rooms:

obtaining, by the one or more computing devices, and for each of multiple images of the plurality of images that are acquired in multiple viewing locations within one of the rooms of the multiple rooms, a defined partial room shape for part of the one room that is visible in that image and that is determined based at least in part on visual data of that image;

determining, by the one or more computing devices, a predicted overall room shape of the one room based on combining the defined partial room shapes, including matching one or more portions of the one room that is each visible in at least two of the multiple images; and presenting, by the one or more computing devices via the displayed GUI, a further visual representation of the predicted overall room shape of the one room that shows relative positions of the defined partial room shapes, and receiving further input from the one or more users for the predicted overall room shape to specify a final room shape of the one room, and wherein the final room shape of the one room is the obtained defined room shape for the one room.

10. The computer-implemented method of claim 9 further comprising:

determining, by the one or more computing devices and before presenting of the further visual representation, initial positions at which the multiple images are taken within the defined partial room shapes; and updating, by the one or more computing devices, the initial positions of one or more of the multiple images based on changes between the final room shape and the predicted overall room shape, and wherein the generating of the at least partial building floor map includes adding the updated initial positions of the or more images on the generated at least partial building floor map.

11. The computer-implemented method of claim 1 further comprising:

presenting, by the one or more computing devices and via the displayed GUI, one of the plurality of images that is captured in a first room of the two or more rooms, and overlaying at least some of the defined room shape for another second room of the two or more rooms on the presented one image at one or more locations corresponding to the relative position of the defined room shape for the second room with regard to the defined room shape for the first room;

receiving, by the one or more computing devices, further input from the one or more users via the displayed GUI to specify a revised version of the relative position of the defined room shape for the second room with regard to the defined room shape for the first room by adjusting the one or more locations of the overlaid at least some of the defined room shape;

determining, by the one or more computing devices, a thickness of a wall between the second room and the first room based on the revised version of the relative position, and wherein the final relative positions of the defined room shapes of the two or more rooms specified by the input from the one or more users includes the revised version of the relative position of the defined room shape for the second room with regard to the defined room shape for the first room, with a distance between the defined room shapes for the first and second rooms that is based on the determined thickness.

12. The computer-implemented method of claim 11 wherein the two or more rooms include one or more additional third rooms separate from the first and second rooms, and wherein the determining of the predicted room layout that includes the relative positions of the defined room shapes of the two or more rooms includes predicting, between one or more walls of the one or more third rooms and at least one wall of the defined room shapes for the first and second rooms, a distance using the determined thickness of the wall between the first and second rooms.

13. The computer-implemented method of claim 1 wherein the defined room shapes of the two or more rooms includes at least first and second and third room shapes for respective first and second and third rooms of the two or more rooms, wherein the receiving of the input from the one or more users to specify the final room layout includes receiving, by the one or more computing devices, information about one or more adjustments by the one or more users for at least one of one or more of the relative positions of the first and second defined room shapes in the presented visual representation of the predicted room layout, or one or more spares of one or more of the first and second defined room shapes in the presented visual representation of the predicted room layout, and wherein the method further comprises:

determining, by the one or more computing devices and after the one or more adjustments, a thickness of a wall between the first and second room shapes of the first and second rooms; and determining, by the one or more computing devices, a distance between the first and second room shapes that is based on the determined thickness, and wherein the final relative positions of the defined room shapes of the two or more rooms uses the determined distance for thickness of one or more additional walls between the third room shape and one or more other room shapes.

14. The computer-implemented method of claim 1 further comprising:

presenting, by the one or more computing devices and via the displayed GUI, one or more of the plurality of images with visual data for one room of the multiple rooms;

receiving, by the one or more computing devices, further input from the one or more users via the displayed GUI to specify one or more locations of one or more points of interest in the visual data of the one or more images, wherein each of the one or more points of interest is at least one of an electrical outlet, or a cable outlet, or a window, or a doorway, or a non-doorway wall opening, or a furnishing, or a piece of furniture, or a lighting fixture, or a plumbing fixture, or a vent, or a pipe, or a conduit, or a light switch, or a user-manipulatable control that affects operation of one or more elements in the building, or a floor covering, or a counter covering, or a wall covering, or a cabinet, or a kitchen island, or a built-in structure, or a type of ceiling, or a vaulted ceiling that is modeled as multiple inter-connected planar surfaces that are separately indicated in the further input, or a type of floor, or an appliance;

determining, by the one or more computing devices, a position of each of the one or more locations of the one or more points of interest in the one room; and adding, by the one or more computing devices, information to the at least partial building floor map to indicate the one or more locations of the one or more points of interest on the defined room shape of the one room of the at least partial building floor map, and wherein the provided generated at least partial building floor map includes the added information.

15. The computer-implemented method of claim 1 further comprising:
presenting, by the one or more computing devices and via the displayed GUI, two or more images of the plurality of images;
receiving, by the one or more computing devices, further input from the one or more users via the displayed GUI to specify a common location visible in each of the two or more images, wherein the common location is at least one of one or more points corresponding to a window, or one or more points corresponding to a doorway, or one or more points corresponding to a non-doorway wall opening, or one or more points on a floor, or one or more points on a ceiling; and
determining, by the one or more computing devices, inter-image pose information between acquisition locations of the two or more images using the specified common location,
and wherein the determining of the predicted room layout is further based at least in part on the determined inter-image pose information.

16. The computer-implemented method of claim 1 wherein the receiving of the input from the one or more users for the predicted room layout to specify the final room layout includes receiving, by the one or more computing devices, information from the one or more users about one or more spaces in the predicted room layout between at least two of the two or more rooms that are not part of the determined room shapes of the two or more rooms; and
adding, by the one or more computing devices, the information to the at least partial building floor map about the one or more spaces,
and wherein the provided generated at least partial building floor map includes the added information.

17. The computer-implemented method of claim 16 wherein the one or more spaces in the predicted room layout correspond to one or more additional rooms of the building that lack a image of the plurality of images captured within the one or more additional rooms, and wherein the received information about the one or more spaces includes at least one of one or more room types of the one or more additional rooms, or one or more room labels for the one or more additional rooms.

18. The computer-implemented method of claim 1 further comprising, before the presenting of the visual representation of the predicted room layout:
analyzing, by the one or more computing devices, the plurality of images to generate multiple groups of images, wherein each of the groups includes one or more images of the plurality of images that each has visual data for a common location, and wherein one group of the multiple groups includes at least two images of the plurality of images that are captured in the two or more rooms,
and wherein the determining of the predicted room layout that includes the relative positions of the defined room shapes of the two or more rooms is performed based at least in part on the one group including the at least two images captured in the two or more rooms.

19. The computer-implemented method of claim 18 wherein the presenting of the visual representation of the predicted room layout showing the relative positions of the defined room shapes of the two or more rooms includes displaying the visual representation to a first user of the one or more users, and wherein the method further comprises, for each of one or more additional groups of the multiple groups separate from the one group:
determining, by the one or more computing devices and for an additional room combination of two or more additional rooms of the multiple rooms that are visible in the visual data of the one or more images of that additional group, an additional predicted room layout that includes relative positions of the defined room shapes of the two or more additional rooms; and
presenting, by the one or more computing devices to a second user separate from the first user and via a GUI displayed to the second user, an additional visual representation of the additional predicted room layout, and receiving additional input from the second user for the additional predicted room layout to specify an additional final room layout of the defined room shapes of the two or more additional rooms that has final relative positions of the defined room shapes of the two or more additional rooms,
and wherein the generating of the at least partial building floor map further includes incorporating, for each of the one or more additional groups, the additional final room layout of the defined room shapes of the two or more additional rooms of that additional group into the generated at least partial building floor map.

20. The computer-implemented method of claim 1 further comprising, before the obtaining of the defined room shapes for the multiple rooms:
analyzing, by the one or more computing devices, the plurality of images to generate multiple groups of images, wherein each of the groups includes multiple images of the plurality of images that each has visual data showing at least part of a common room of the multiple rooms; and
generating, by the one or more computing devices and for each of the multiple groups of images, the defined room shape for the common room for that group, including:
determining, using partial room shapes of the common room for that group that are generated from the visual data of the multiple images for that group, a predicted room shape for that common room based at least in part on relative positions of the partial room shapes based on one or more common locations in the common room that are visible in the visual data of the multiple images for that group; and
presenting, by the one or more computing devices via the displayed GUI, an additional visual representation of the predicted room shape for the common room for that group, and receiving additional input from the one or more users for the predicted room shape to specify a final room shape of that common room having final relative positions of the partial room shapes generated from the visual data of the multiple images for that group,
and wherein the obtaining of the defined room shapes for the multiple rooms includes using the final room shape for the common room of each of the multiple groups of images.

21. The computer-implemented method of claim 20 further comprising:
repeatedly determining, by the one or more computing devices and during the generating of the defined room shape for the common room for one of the multiple groups of images, an amount of progress in completing the generating of the defined room shape for the common room for the one group of images; and repeatedly presenting, by the one or more computing devices and via the displayed GUI, a visual indication of the repeated determined amount of progress.

22. The computer-implemented method of claim 1 further comprising, before the obtaining of the defined room shapes for the multiple rooms:

analyzing, by the one or more computing devices, the plurality of images to generate multiple groups of images, wherein each of the groups includes multiple images of the plurality of images that each has visual data showing at least part of a common room of the multiple rooms; and generating, by the one or more computing devices and for each of the multiple groups of images, an initial room shape for the common room for that group, including:

determining, by the one or more computing devices, one of the multiple images for that group to use in generating an initial room shape for the common room for that group, including ranking each of the multiple images for that group based on one or more prediction confidences for one or more determined locations of at least one of a wall of that common room, or a corner of that common room, or a doorway of that common room, or a window of that common room, or a non-doorway wall opening of that common room, or a distance to a structure in that common room, or an amount of occlusion of walls in that common room; and generating, by the one or more computing devices, the initial room shape for the common room for that group by analyzing the determined one image for that group, and wherein the obtaining of the defined room shapes for the multiple rooms includes using, for the common room of each of the multiple groups of images, information based on the initial room shape for that common room.

23. The computer-implemented method of claim 22 further comprising:

presenting, by the one or more computing devices via the displayed GUI, and for each of the multiple groups of images, an additional visual representation of the generated initial room shape for the common room shown in the visual data of the multiple images for that group; and receiving, by the one or more computing devices and for each of the multiple groups of images, additional input from the one or more users to adjust the generated initial room shape to specify a final room shape of the common room shown in the visual data of the multiple images for that group, and wherein the using of the information for the common room of each of the multiple groups of images includes using the final room shape for that common room.

24. The computer-implemented method of claim 22 further comprising:

repeatedly determining, by the one or more computing devices and during generating of initial room shapes of common rooms for the multiple groups of images, an amount of progress in completing that generating of the initial room shapes of the common rooms; and repeatedly presenting, by the one or more computing devices and via the displayed GUI, a visual indication of the repeated determined amount of progress.

25. The computer-implemented method of claim 1 further comprising, before the presenting of the visual representation of the predicted room layout:

determining, by the one or more computing devices, a location of a wall of the building that extends through at least two rooms of the two or more rooms;

presenting, by the one or more computing devices and via the displayed GUI, a visual guideline overlaid in the determined location on a displayed initial visual representation of an initial version of the predicted room layout; and receiving, by the one or more computing devices, further input from the one or more users via the displayed GUI to specify a revised version of the predicted room layout by adjusting one or more of the defined room shapes of the two or more rooms to match at least one wall of each of the one or more defined room shapes to the presented visual guideline, and wherein the predicted room layout whose visual representation is presented in the displayed GUI is the revised version of the predicted room layout.

26. The computer-implemented method of claim 1 wherein at least some of the plurality of images are each a panorama image with 360 degrees of horizontal coverage, and wherein the method further comprises presenting, by the one or more computing devices and via the displayed GUI, one or more images of the at least some images using an equirectangular projection format.

27. The computer-implemented method of claim 1 further comprising, after the determining and the presenting, performing additional determining of one or more additional predicted room layouts for one or more additional room combinations of at least two rooms, and additional presenting for each of the one or more additional predicted room layouts to determine one or more additional final room layouts for the one or more additional room combinations based at least in part on further received user input, and wherein the generating of the at least partial building floor map includes generating a complete building floor map using the determined one or more additional final room layouts.

28. A non-transitory computer-readable medium having stored contents that cause one or more computing devices to perform automated operations that include at least:

obtaining, by the one or more computing devices, a plurality of images taken at a plurality of viewing locations within a room of a building, and, for each of the plurality of images, a defined partial room shape for part of the room that is visible in that image and that is determined based at least in part on visual data of that image;

determining, by the one or more computing devices, a predicted overall room shape of the room based on combining the defined partial room shapes from the plurality of images, including matching one or more portions of the room that is each visible in at least two of the plurality of images;

presenting, by the one or more computing devices via a displayed graphical user interface (GUI) displayed to one or more users, a visual representation of the predicted overall room shape showing relative positions of the defined partial room shapes from the plurality of images, and receiving input from the one or more users for the predicted overall room shape to specify a final room shape of the room;

generating, by the one or more computing devices, at least a partial building floor map using the final room shape of the room; and providing, by the one or more computing devices, the generated at least partial building floor map for further use.

29. The non-transitory computer-readable medium of claim 28 wherein the receiving of the input from the one or more users to specify the final room shape of the room includes receiving, by the one or more computing devices, information about one or more adjustments by the one or more users for at least one of one or more of the relative positions of the defined partial room shapes in the presented visual representation of the predicted overall room shape, or one or more shapes of one or more of the defined partial room shapes in the presented visual representation of the predicted overall room shape, and wherein the generating of the at least partial building floor map includes using the information about the one or more adjustments as part of the final room shape included in the generated at least partial building floor map.

30. The non-transitory computer-readable medium of claim 28 wherein each of the defined partial room shapes includes one or more wall openings, and wherein the combining of the defined partial room shapes includes matching locations in the defined partial room shapes of at least some of the wall openings.

31. The non-transitory computer-readable medium of claim 28 wherein the stored contents include software instructions that, when executed, cause the one or more computing devices to perform further automated operations including determining, by the one or more computing devices and based at least in part on the final room shape of the room, positions of the plurality of images in the final room shape, and wherein the generating of the at least partial building floor map includes indicating the determined positions of the plurality of images on the generated at least partial building floor map.

32. The non-transitory computer-readable medium of claim 31 wherein the automated operations further include, before the determining of the predicted overall room shape, determining, by the one or more computing devices, initial positions of the plurality of images within the defined partial room shapes, and wherein the determining of the positions of the plurality of images in the final room shape includes adjusting the initial positions of one or more images of the plurality within the final room shape based at least in part on one or more changes in the final room shape relative to the defined partial room shapes.

33. A system comprising:
one or more hardware processors of one or more computing devices; and
one or more memories with stored instructions that, when executed, cause to system to perform automated operations including at least:
obtaining, for each of multiple rooms of a building, a defined room shape for the room that is determined based at least in part on visual data of one or more images taken at one or more viewing locations within the room;
determining relative positions of the defined room shapes for the multiple rooms based at least in part on locations of inter-room openings between at least some of the multiple rooms;
presenting, via a displayed graphical user interface (GUI) displayed to one or more users, visual representations of a room layout showing the relative positions of the defined room shapes, and a visual guideline that represents a location of a building wall extending through two or more rooms of the multiple rooms;
receiving input from the one or more users via the displayed GUI to specify a revised room layout by adjusting one or more of the defined room shapes to match at least one room wall of each of the one or more defined room shapes to the presented visual guideline representing the location of the building wall;
generating at least a partial building floor map using the revised room layout with the defined room shapes; and
providing the generated at least partial building floor map for further use.

34. The system of claim 33 wherein the receiving of the input from the one or more users to specify the revised room layout includes receiving information about one or more adjustments by the one or more users for at least one of a relative position of one of the one or more defined room shapes in the presented visual representation of the room layout, or a shape of one of the one or more defined room shapes in the presented visual representation of the room layout, and wherein the generating of the at least partial building floor map further includes using the information about the one or more adjustments as part of the revised room layout included in the generated at least partial building floor map.

35. The system of claim 33 wherein the one or more defined room shapes that are adjusted are for one or more first rooms of the multiple rooms that are separate from the two or more rooms through which the building wall extends, and wherein the automated operations further include determining a location of the visual guideline based at least in part on identifying, using the relative positions of the defined room shapes, room walls of the defined room shapes for the two or more rooms whose locations in the relative positions are within a defined threshold distance of each other, and using the locations of the identified room walls as part of the determining of the location of the visual guide.

36. The system of claim 35 wherein the obtained defined room shapes for the two or more rooms include information about one or more uncertainties in one or more locations corresponding to at least one room wall of at least one room of the two or more rooms, and wherein the determining of the location of the visual guideline representing the location of the building wall includes using the information about the one or more uncertainties as part of the determining of the location.

37. The system of claim 36 wherein the one or more uncertainties in the one or more locations corresponding to the at least one room wall of the at least one room include uncertainties in one or more corners of the at least one room that are associated with the at least one room wall, and wherein the stored instructions include software instructions that further cause the system to use the information about the one or more uncertainties during the determining of the location of the visual guideline by incorporating weighting for locations of the one or more corners that are based at least in part on respective uncertainties.

38. The system of claim 33 wherein the one or more defined room shapes that are adjusted are for one or more first rooms of the multiple rooms that are separate from the two or more rooms through which the building wall extends, wherein the obtained defined room shapes for the one or more first rooms include information about one or more uncertainties in one or more locations corresponding to at least one room wall of at least one room of the one or more first rooms, and wherein the adjusting of the one or more defined room shapes to match the at least one wall of each of the one or more defined room shapes to the presented visual guideline includes using the one or more uncertainties as part of the adjusting.

39. The system of claim 38 wherein the adjusting of the one or more defined room shapes to match the at least one wall of each of the one or more defined room shapes to the presented visual guideline further includes, for each of the one or more defined room shapes, at least one of performing an automated shape-editing operation to adjust a shape of that defined room shape, or an automated positioning operation to adjust a relative location position of that defined room shape.

40. The system of claim 33 wherein the automated operations further include:

displaying, via the displayed GUI, one of the plurality of images taken at a viewing location within a first room of the two or more rooms, and an overlaid further visual representation of the visual guideline on the displayed one image to show the location of the wall of the building; and receiving further input from the one or more users via the displayed GUI to specify a revised room shape of the first room by adjusting one or more walls of the first room to match the displayed further representation of the visual guideline, and wherein the generating of the at least partial building floor map further includes using the revised room shape as part of the defined room shapes included in the generated at least partial building floor map.

* * * * *